United States Patent
Erbil et al.

(10) Patent No.: US 9,000,651 B2
(45) Date of Patent: *Apr. 7, 2015

(54) METHOD AND APPARATUS FOR GENERATING ELECTRICITY BY THERMALLY CYCLING AN ELECTRICALLY POLARIZABLE MATERIAL USING HEAT FROM VARIOUS SOURCES AND A VEHICLE COMPRISING THE APPARATUS

(75) Inventors: Ahmet Erbil, Altanta, GA (US); David F. Walbert, Atlanta, GA (US)

(73) Assignee: The Neothermal Energy Company, Atlanta, GA (US)

( * ) Notice: Subject to any disclaimer, the term of this patent is extended or adjusted under 35 U.S.C. 154(b) by 301 days.

This patent is subject to a terminal disclaimer.

(21) Appl. No.: 13/247,525

(22) Filed: Sep. 28, 2011

(65) Prior Publication Data
US 2012/0019098 A1 Jan. 26, 2012

Related U.S. Application Data

(63) Continuation-in-part of application No. 13/226,799, filed on Sep. 7, 2011, now Pat. No. 8,344,585, which is a continuation-in-part of application No. 12/465,924, filed on May 14, 2009, now Pat. No. 8,035,274, and a (Continued)

(51) Int. Cl.
*H02N 11/00* (2006.01)
*H02N 1/00* (2006.01)
(Continued)

(52) U.S. Cl.
CPC ........... *H01L 37/02* (2013.01); *B60Y 2400/206* (2013.01)

(58) Field of Classification Search
USPC ................ 310/306, 300; 136/254; 250/338.2; 322/2 A
See application file for complete search history.

(56) References Cited

U.S. PATENT DOCUMENTS

| 3,073,974 | A |   | 1/1963 | Hoh |
| 3,243,687 | A | * | 3/1966 | Hoh ............................ 322/2 R |

(Continued)

FOREIGN PATENT DOCUMENTS

| EP | 1145333 A | 10/2001 |
| GB | 1506587 A | 4/1978 |

(Continued)

OTHER PUBLICATIONS

Liepins et al. ("Piezoelectric Polymer Films. II. Piezoelectric and Pyroelectric Evaluation"; Journal of Polymer Science, vol. 21, pp. 751-760, 1983).*

(Continued)

*Primary Examiner* — Burton Mullins
(74) *Attorney, Agent, or Firm* — Morris, Manning & Martin, LLP; Tim Tingkang Xia, Esq.; Christopher W. Raimund

(57) ABSTRACT

A method for converting heat to electric energy is described which involves thermally cycling an electrically polarizable material sandwiched between electrodes. The material is heated using thermal energy obtained from: a combustion reaction; solar energy; a nuclear reaction; ocean water; geothermal energy; or thermal energy recovered from an industrial process. An apparatus is also described which includes an electrically polarizable material sandwiched between electrodes and a heat exchanger for heating the material. The heat source used to heat the material can be: a combustion apparatus; a solar thermal collector; or a component of a furnace exhaust device. Alternatively, the heat exchanger can be a device for extracting thermal energy from the earth, the sun, ocean water, an industrial process, a combustion reaction or a nuclear reaction. A vehicle is also described which comprises an apparatus for converting heat to electrical energy connected to an electric motor.

74 Claims, 30 Drawing Sheets

Related U.S. Application Data continuation-in-part of application No. 13/228,051, filed on Sep. 8, 2011, now Pat. No. 8,350,444, which is a continuation-in-part of application No. 12/465,924, filed on May 14, 2009, now Pat. No. 8,035,274.

(60) Provisional application No. 61/390,453, filed on Oct. 6, 2010, provisional application No. 61/390,435, filed on Oct. 6, 2010, provisional application No. 61/392,781, filed on Oct. 13, 2010, provisional application No. 61/392,787, filed on Oct. 13, 2010, provisional application No. 61/392,801, filed on Oct. 13, 2010, provisional application No. 61/405,516, filed on Oct. 21, 2010, provisional application No. 61/405,918, filed on Oct. 22, 2010, provisional application No. 61/387,752, filed on Sep. 29, 2010, provisional application No. 61/387,760, filed on Sep. 29, 2010.

(51) Int. Cl.
*H01L 37/00* (2006.01)
*H01L 37/02* (2006.01)

(56) References Cited

U.S. PATENT DOCUMENTS

| | | | |
|---|---|---|---|
| 3,554,515 A | | 1/1971 | Tonooka et al. |
| 3,657,891 A | * | 4/1972 | Lusk .................... 60/219 |
| 3,824,448 A | | 7/1974 | De Rivas |
| 4,047,093 A | * | 9/1977 | Levoy .................... 322/2 R |
| 4,074,660 A | | 2/1978 | Tsao |
| 4,099,019 A | | 7/1978 | Horibe et al. |
| 4,210,820 A | | 7/1980 | Wittig |
| 4,220,906 A | | 9/1980 | Drummond |
| 4,226,606 A | | 10/1980 | Yaeger et al. |
| 4,245,693 A | | 1/1981 | Cheng |
| 4,292,579 A | * | 9/1981 | Constant .................... 322/2 R |
| 4,296,800 A | | 10/1981 | Johnson |
| 4,327,670 A | | 5/1982 | Teller |
| 4,372,937 A | | 2/1983 | Johnson |
| 4,425,540 A | | 1/1984 | Olsen |
| 4,589,890 A | | 5/1986 | Gronvaldt |
| 4,647,836 A | | 3/1987 | Olsen |
| 4,648,991 A | * | 3/1987 | Fang et al. .................... 252/1 |
| 4,651,814 A | | 3/1987 | Ito et al. |
| 4,766,952 A | | 8/1988 | Onodera |
| 4,983,839 A | | 1/1991 | Deb |
| 5,028,835 A | * | 7/1991 | Fitzpatrick .................... 313/14 |
| 5,555,838 A | | 9/1996 | Bergman |
| 5,625,245 A | | 4/1997 | Bass |
| 5,851,498 A | | 12/1998 | Rozenshtein et al. |
| 5,994,638 A | * | 11/1999 | Edelson .................... 136/205 |
| 6,379,809 B1 | | 4/2002 | Simpson et al. |
| 6,431,856 B1 | | 8/2002 | Maenishi et al. |
| 6,495,749 B2 | * | 12/2002 | Paramonov et al. .......... 136/205 |
| 6,528,898 B1 | | 3/2003 | Ikura et al. |
| 6,725,668 B1 | * | 4/2004 | Cornwall .................... 62/3.1 |
| 6,742,337 B1 | | 6/2004 | Hays et al. |
| 7,043,912 B1 | | 5/2006 | Radcliff et al. |
| 7,323,506 B2 | | 1/2008 | Kouchachvili et al. |
| 7,328,578 B1 | | 2/2008 | Saucedo |
| 7,569,194 B2 | | 8/2009 | Russell |
| 7,593,250 B2 | | 9/2009 | Naumov et al. |
| 7,735,321 B2 | | 6/2010 | Howard |
| 7,768,050 B2 | | 8/2010 | Rappe et al. |
| 8,344,585 B2 | * | 1/2013 | Erbil et al. .................... 310/306 |
| 2003/0162394 A1 | | 8/2003 | Takemura |
| 2004/0189141 A1 | * | 9/2004 | Tavkhelidze et al. ........ 310/306 |
| 2006/0122299 A1 | | 6/2006 | Kouchachvili et al. |
| 2008/0074211 A1 | | 3/2008 | Miles et al. |
| 2008/0130346 A1 | | 6/2008 | Naumov et al. |
| 2008/0295879 A1 | | 12/2008 | Atanackovic |
| 2009/0010303 A1 | | 1/2009 | Nagashima et al. |
| 2010/0037624 A1 | * | 2/2010 | Epstein et al. .................... 62/3.1 |
| 2010/0289377 A1 | | 11/2010 | Erbil et al. |
| 2011/0001390 A1 | | 1/2011 | Erbil et al. |
| 2012/0240882 A1 | * | 9/2012 | Gao et al. .................... 123/41.55 |

FOREIGN PATENT DOCUMENTS

| | | |
|---|---|---|
| JP | 55012508 A | 1/1980 |
| JP | 63061125 A | 3/1988 |
| JP | 63233340 A | 9/1988 |
| KR | 1020070056373 A | 6/2007 |
| WO | 9313564 A1 | 7/1993 |
| WO | 9965051 A2 | 12/1999 |
| WO | 00/36656 A1 | 6/2000 |
| WO | 0036656 A1 | 6/2000 |
| WO | 2005011376 A2 | 2/2005 |
| WO | 2006058417 A1 | 6/2006 |
| WO | 2007140061 A2 | 12/2007 |
| WO | 2008088994 A2 | 7/2008 |
| WO | 2010061385 A1 | 6/2010 |

OTHER PUBLICATIONS

Olsen, R., Cascaded Pyroelectric Energy Converter, Ferroelectrics, 1984, vol. 59, pp. 205-219, Gordon and Breach, Science Publishers, Inc. US.

Vanderpool, D., Simulations of a Prototypical Device Using Pyroelectric Materials for Harvesting Waste Heat, Intl. J. of Heat & Mass Transfer, vol. 51, 2008, pp. 5052-5062, Los Angeles.

Lines, M. E. et al., "Principles and Applications of Ferroelectrics and Related Materials", App. F, 1977, Oxford University Press Inc., New York.

Olsen and Evans, "Pyroelectric Energy Conversion: Hysteresis loss and temperature sensitivity of a ferroelectric aterial", J. Appl. Phys. 54, Oct. 1983.

Kouchachvili and Ikura, "Pyroelectric Conversion—Effects of P(VDF-TrFE) preconditioning on Power Conversion", Journal of Electrostatics 65, 2007, pp. 182-188.

U.S. DOE, A Technology Roadmap for Generation IV Nuclear Systems, 2002.

Study prepared for the U.S. Department of Energy by an MIT-lead interdisciplinary panel, The Future of Geothermal Energy: Impact of Enhanced Geothermal Systems (EGS) of the United States in the 21st Century, 2006.

V. Viswanathan, Opportunity Analysis for Recovering Energy From Industrial Waste Heat and Emissions, Pacific NW Nat'l Lab., 2005.

Prepared for the U.S. DOE, Energy Use, Loss and Opportunities Analysis: U.S. Manufacturing and Mining, 2004.

A. Burke, Energy Storage in Advanced Vehicle Systems, Institute of Transportation Studies, Univ. of California, Davis, (presented at Stanford University, 2005).

J. Yang, Thermolectric Technology for Automotive Waste Heat Recovery, General Motors R&D, presented at the 2007 DEER Conference, sponsored by U.S. DOE.

Duffie et al., Solar Engineering of Thermal Processes, John Wiley & Sons, Inc., 3rd Ed., 2006.

Babcock et al., Steam: Its Generation and Use, Chs. 47-56, 40th Ed. 1992.

Frank Incropera et al., Fundamentals of heat and Mass Transfer, John Wiley & Sons, Inc., 6th Ed., 2006.

Michael Moran et al., Introduction of Thermal Systems Engineering: Thermodynamics, Fluid Mechanics, and Heat Transfer, John Wiley & Sons, Inc., 2003.

Deborah Kaminiski et al, Introduction of Thermal and Fluids Engineering, John Wiley & Sons, Inc., 2005.

M. Wakil, Nuclear Energy Conversion, American Nuclear Society, 1992.

Robert Serth, Process Heat Transfer: Principles and Applications, Elsevier, 2007.

Hayes et al., Introduction to Catalytic Combustion, Gordon and Breach Science Publishers, 1997.

G.P. Peterson, An Introduction to Heat Pipes: Modeling, Testing and Applications, 1994.

\* cited by examiner

900

910
Providing a ferroelectric layer formed of a ferroelectric material characterized with a Curie temperature, $T_C$, with a pair of electrodes on the first and second surface of the ferroelectric layer, respectively.

920
Alternatively delivering a flow of cold and hot fluids so as to alternately cool the ferroelectric layer to a first temperature $T_L$ that is lower than the Curie temperature $T_C$, and heat the ferroelectric layer to a second temperature $T_H$; the ferroelectric material of the ferroelectric layer thereby undergoes alternating phase transitions between the ferroelectric phase and the paraelectric phase with temperature cycling. The electrical circuit is open during heating and cooling under constant polarizations, $P_H$ and $P_L$, respectively.

930
Alternatively delivering a flow of cold and hot fluids to as to alternatively remove heat from the ferroelectric layer isothermally at $T_L$ and add heat to the ferroelectric layer isothermally at $T_H$. During these steps, the electrical circuit is closed so that the addition and withdrawal of heat occurs while polarization alternates between maximum and minimum levels, $P_H$ and $P_L$, respectively.

940
Poling the ferroelectric material as heat is removed isothermally at $T_L$ while polarization increases from $P_L$ to $P_H$, thereby generating electrically-opposite screening charges on the pair of electrodes.

950
Outputting electric energy corresponding to the generated electrically-opposite screening charges on the pair of electrodes when heat is added isothermally to the ferroelectric material at $T_H$ and polarization is reduced from $P_H$ to $P_L$.

FIG. 7

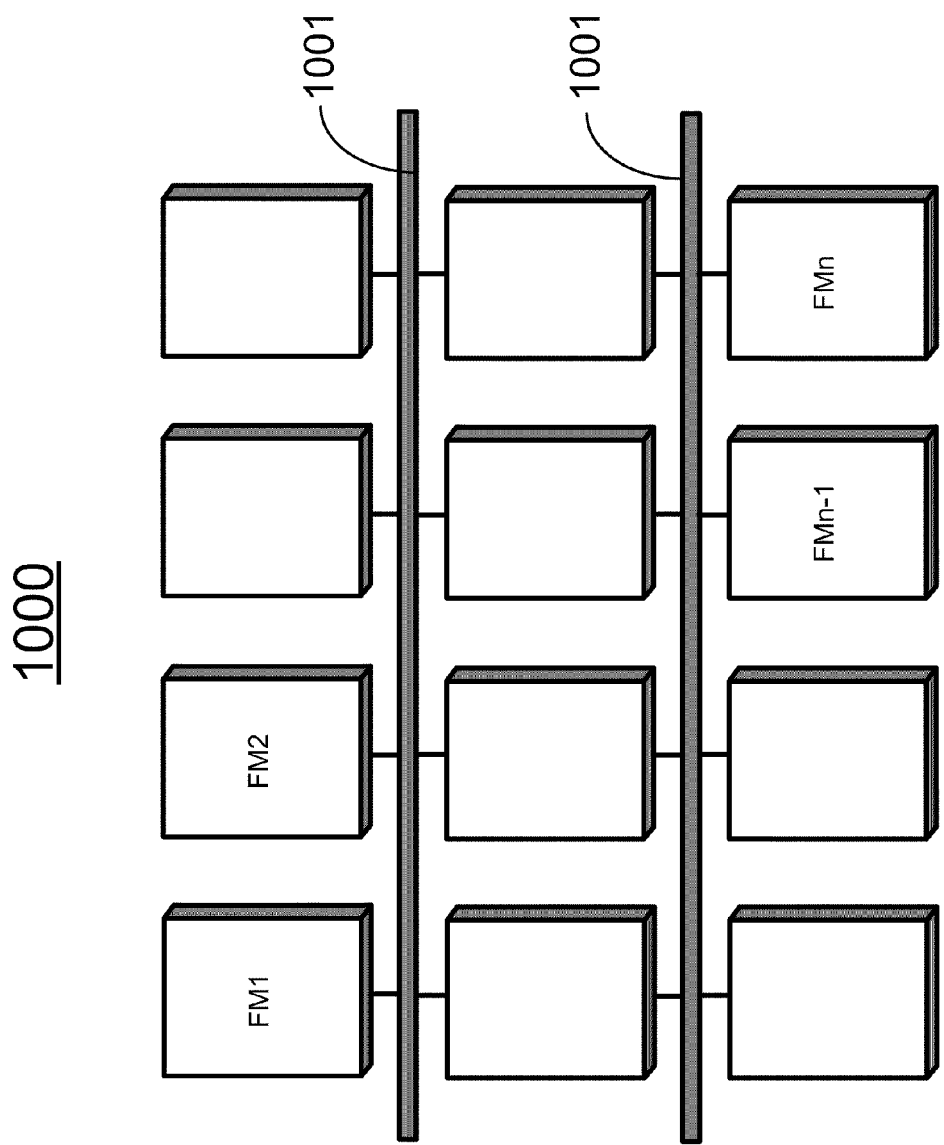

METHOD AND APPARATUS FOR GENERATING ELECTRICITY BY THERMALLY CYCLING AN ELECTRICALLY POLARIZABLE MATERIAL USING HEAT FROM VARIOUS SOURCES AND A VEHICLE COMPRISING THE APPARATUS

CROSS-REFERENCE TO RELATED PATENT APPLICATIONS

This application claims the benefit of Provisional U.S. Patent Application Ser. No. 61/390,435, filed Oct. 6, 2010; 61/390,453, filed Oct. 6, 2010; 61/392,781, filed Oct. 13, 2010; 61/392,787, filed Oct. 13, 2010; 61/392,801, filed Oct. 13, 2010; 61/405,516, filed Oct. 21, 2010; and 61/405,918, filed Oct. 22, 2010. This application is also a continuation-in-part of U.S. patent application Ser. No. 13/226,799, filed Sep. 7, 2011, pending, which is a continuation-in-part of U.S. patent application Ser. No. 12/465,924, filed May 14, 2009, now allowed and which claims the benefit of provisional U.S. Patent Application Ser. No. 61/387,752, filed Sep. 29, 2010. This application is also a continuation-in-part of U.S. patent application Ser. No. 13/228,051, filed Sep. 8, 2011, which is a continuation-in-part of U.S. patent application Ser. No. 12/465,924, filed May 14, 2009, now allowed and which claims the benefit of provisional U.S. Patent Application Ser. No. 61/387,760, filed Sep. 29, 2010. Each of the above applications is incorporated by reference herein in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention generally relates to the generation and capture of heat in certain applications and the generation of electricity from that heat. Heat is converted to electricity with the present invention by utilizing the spontaneous polarization of ferroelectric or other polarizable materials that occurs when they are in a temperature range corresponding to their ferroelectric phase, and diminishes or disappears rapidly as the ferroelectric materials approach, or transition into, their paraelectric or antiferroelectric phase as the temperature changes.

BACKGROUND OF THE INVENTION

There is a well-recognized need for new technologies that generate electricity. In particular, there is a need for new technologies by which electricity can be generated from thermal energy. The present invention discloses apparatuses and methods for generating or capturing heat from various sources and using the electricity so generated.

The present invention is related to thermal-to-electric conversion apparatuses and methods disclosed in U.S. Pat. No. 7,982,360 and U.S. patent application Ser. No. 12/465,924, filed May 14, 2009, now allowed, and in U.S. patent application Ser. Nos. 13/226,799 and 13/228,051. Those applications disclose apparatuses and methods for using the inherent spontaneous polarization of ferroelectrics and other polarizable materials to convert heat to electricity. The inventions presented therein, unlike the prior art, utilize the spontaneous polarization of ferroelectrics, together with the rapid change in spontaneous polarization that occurs during phase transition, to convert heat to electrical energy. The apparatuses and methods set forth in the foregoing patents and applications are a new way of converting thermal energy to electricity. Those apparatuses and methods are used with other technologies herein so as to generate electricity from heat available in specific applications.

SUMMARY OF THE INVENTION

The present invention provides apparatuses and methods for specific applications in which heat is converted to electric energy using ferroelectric and other polarizable materials. The specific applications of the present invention include the generation of electricity from combustion heat; the production and use of electricity from heat generated on board vehicles; the generation of electricity from solar energy; the generation of electricity from industrial process heat; the generation of electricity from heat from nuclear processes; the generation of electricity from geothermal energy; and the generation of electricity from ocean thermal energy.

For each of these applications, the laws of thermodynamics require that the conversion of thermal energy to electricity occur by withdrawing heat from a heat source and rejecting heat, at a lower temperature, to a heat sink. Heat from combustion is a pervasive source of heat that can be used with the invention. In general, any chemical reaction, or series of reactions, that yields a net output of heat is a source of combustion heat that can be used with the invention. Exothermal chemical reactions between a fuel and an oxidant, whether oxygen or otherwise, whereby heat is produced is such a source of heat. Combustion can be catalytic or otherwise. There are many apparatuses and methods for generating heat from combustion that are well known to those skilled in the art and which can be used with the invention. For example, a variety of different boilers can be used to generate heat by combustion, including fire-tube boilers, water-tube boilers, sectional boilers, flash boilers, and others.

With any of these or other sources of heat from combustion, the thermal energy so produced is used by the ferroelectric generator of the invention to convert heat to electricity. The heat obtained from combustion can either be used directly to heat the ferroelectric material or to heat a working fluid that is then used to heat the ferroelectric generator; or one or more heat exchangers can be used to facilitate the transfer of thermal energy of combustion to the ferroelectric generator. Heat rejected at a lower temperature from the ferroelectric generator is then withdrawn and transferred to a heat sink.

The invention also provides in one embodiment an apparatus and method for powering electric vehicles. Electricity is generated on board the vehicle in this embodiment using the heat-to-electric conversion device of the invention, with the thermal energy being created on board as well. The heat generated to power the electric generator may come from a variety of sources, including traditional combustion, catalytic combustion, and many different exothermic reactions. Hydrocarbons are one source of fuel by which heat can be generated for conversion to electricity. Other thermal energy carriers may be used to avoid reliance on petroleum-based fuels.

Electricity generated by the device is transmitted to one or more electric storage and control units, including those appropriate for power conditioning and electric energy storage. Electricity may be stored using ultracapacitors or batteries, for example. The electrical energy so generated and conditioned is used to power electric motors that propel the vehicle and to operate peripheral apparatuses on the vehicle.

The invention can also be used to convert solar energy to electricity by first absorbing solar radiation as heat. There are many apparatuses and methods for capturing solar energy as heat that are well known to those skilled in the art and that can be used with the invention. In one embodiment, solar radiation is absorbed by a collector, the surface of which is designed to have absorption and emissivity characteristics that absorb a high percentage of shorter wavelength solar radiation and emit a low percentage of longer-wavelength radiation characteristic of the temperatures attained on the surface of the solar absorber. Absorbed thermal energy can be used directly in the ferroelectric generator or can be stored for later use as a source of heat for generating electricity.

In one embodiment flat-plate solar collectors comprised of a solar energy-absorbing surface are used to convert solar energy to heat with the invention. In another embodiment, an evacuated tube solar collector is used, the vacuum reducing heat loss. In other embodiments, evacuated tube solar collectors include two-phase heat pipes to facilitate heat transfer.

Enhanced solar absorption can be achieved with non-imaging radiant energy reflectors or concentrators. Imaging concentrators, such as parabolic troughs, can also be used with the invention, such imaging concentrators generally attaining higher concentration ratios and, as a result, higher working fluid temperatures. Concentrators may also be designed so that they track the sun, allowing greater absorption of solar energy than achieved with a stationary absorber.

Waste heat from industrial and related processes is another source of heat that can be used with the invention. Sources of heat from industrial and other processes include, among others, waste heat from gases and liquids in chemical, petroleum and forest products industries; heat from food production and processing; heat from oil refineries; and heat from metal processing, iron and steel fabrication, aluminum plants, cement plants, and many manufacturing facilities.

In one embodiment, process waste heat is recovered and transferred to one or more working fluids through heat exchangers, and those working fluids are then used to provide heat to the ferroelectric generator to create electricity. The invention can be used to either convert to electricity waste heat recovered directly from the process, or it can be used in conjunction with other cogeneration systems whereby higher temperature waste heat is first used for some other purpose, including reheating or preheating, for example.

There are many apparatuses and methods that may be used to recover waste heat from industrial processes that are well known to those skilled in the art and which can be used with the invention. The heat recovery apparatus can be inserted at any point in the exhaust or waste heat stream where there is heat that can be used to provide a source of thermal energy to the ferroelectric generator of the invention.

In another embodiment, the invention can be used with heat generated through nuclear processes. Many apparatuses and methods are known to those skilled in the art whereby nuclear processes generate thermal energy that can be removed and then used with the ferroelectric generator of the invention. Such nuclear processes include nuclear fission, nuclear fusion, and radioactive decay, any of which release thermal energy. When the invention is used with a nuclear process that creates particularly high temperatures, the invention can either be used directly to generate electricity from the entire range of thermal energy created, or it can be used in conjunction with other apparatuses that utilize the higher temperature thermal energy created.

Geothermal energy provides another source of heat that can be used with the invention. In one embodiment, the invention utilizes geothermal energy of the character used with geothermal generating facilities that employ mechanical intermediaries—e.g., organic Rankine engines—to drive electromagnetic generators. The invention can be used directly with such geothermal energy removed from the earth, or it can be used in conjunction with existing geothermal generating systems to enhance plant output by generating additional electricity from the lower-temperature heat at those facilities.

In other embodiments, the invention can be used to generate electricity from lower temperature heat available between ambient surface temperatures and near sub-surface ground temperatures. Apparatuses and methods for heat exchanging between the subsurface at above-surface ambient environments are well known to those skilled in the art and may be used with the invention.

Ocean thermal energy conversion (OTEC) provides another source of heat that can be used with the invention. Generally, ocean water at depths of approximately 1000 m is at a relatively consistent temperature of about 4-5° C., whereas tropical surface waters are generally at temperatures of 22° to 29° C., permitting a Carnot efficiency of up to 8%. Systems for exploiting that thermal difference to generate electricity include two separate functions: (1) a system for bringing the warmer surface and colder sub-surface water to the power plant; and (2) the power generating mechanism itself. There are a variety of technologies that are well known to those skilled in the art that achieve the first of these, providing warm and cold water to the generating plant. Any of those technologies, and others, can be used with the invention.

Each of the foregoing applications provides a source of thermal energy that can be used with the electric generator of the invention together with a heat sink appropriate to that particular application. In all such instances, the generator includes a ferroelectric or other polarizable material in which, when in its ferroelectric phase, electric polarization develops spontaneously without induction by application of an external field. By poling those electric dipoles so as to align the polarizable units and domains, the polarization of the cooperatively acting individual electric dipoles combines to produce an extremely large net spontaneous polarization in the overall material system. The present invention utilizes the spontaneous polarization, together with the rapid change in that polarization that occurs during thermal cycling, to convert heat to electrical energy.

By utilization of one or more heat exchangers, the temperature of the ferroelectric material is controlled so that it undergoes transition into the ferroelectric phase. During that transition, a relatively small electric field poles the ferroelectric. That field may be externally applied or it may be internally generated. That poling field aligns the spontaneous electric dipoles to the extent allowed by the molecular and crystal structure of the particular material. Poling is essential to using the spontaneous dipoles in the ferroelectric as an effective means to convert heat to electricity.

When the ferroelectric or other polarizable material of the present invention is in its ferroelectric phase and poled, a very strong inherent electric field results spontaneously from the dipoles without induction by an external field. That spontaneous polarization gives rise to dense bound charges on the surfaces of the ferroelectric, which in turn induce opposing screening charges on electrodes that are on the surfaces of the ferroelectric material. By utilization of one or more heat exchangers, the temperature of the ferroelectric is then changed so that it becomes either paraelectric or antiferroelectric, depending upon the particular material used and the phase transition temperature around which the material is cycled. By causing the ferroelectric to go through phase change and rendering the bound surface charges negligible, the screening charges on the electrodes become unscreened and can be removed to external circuitry at high voltage for general purposes.

As disclosed in U.S. patent application Ser. No. 12/465,924, by utilization of one or more heat exchangers, the temperature of a ferroelectric material can be cycled around the phase transition temperature so that thermal energy can be effectively converted to electrical energy with the invention operating between a heat source and heat sink. Various thermodynamic cycles can be used to exploit spontaneous polarization in ferroelectrics for the purpose of converting heat to electricity, including the general cycle set forth in U.S. patent application Ser. No. 12/465,924. One thermodynamic cycle that can be used with the invention is a cycle with two isothermal steps and two steps at constant polarization, as disclosed in U.S. patent application Ser. No. 13/226,799. With that cycle, the ferroelectric is cooled during a first step to a low temperature, $T_L$, while total polarization is held constant at the relatively low value, $P_L$, and the electrical circuit is open. During the next step, heat is withdrawn isothermally until polarization is increased to the maximum value for the cycle, $P_H$, at which point a dense bound charge is present on the surface of the electrode. During that step, the electrical circuit is closed so that a current flows from the electrode on one side of the ferroelectric to the electrode on the opposite side. Screening charges that develop on the electrodes equal the opposing bound charges at the surfaces of the ferroelectric. It is during that step that the poling field causes the resulting dipoles to be biased in one orientation—i.e., they become poled. In the apparatus and method set forth in U.S. patent application Ser. No. 13/228,051, the poling field is generated from residual free charges on the electrodes on the surfaces of the ferroelectric material that remain after discharge.

The electrical circuit is then opened and the ferroelectric is heated to a relatively high temperature, $T_H$, at constant total polarization, $P_H$. During the final step of the cycle, the circuit is closed and heat is input isothermally until polarization is reduced to $P_L$ so that the screening charges on the electrode become unscreened and are discharged into external circuitry at high voltage. All of the charges on the electrode are not removed in one embodiment as disclosed in U.S. patent application Ser. No. 13/228,051. Instead, the circuit is opened at a point where a residual charge remains that is sufficient for poling, which corresponds to $P_L$. The cycle is then repeated continuously.

The invention can be used with ferroelectrics that are in either solid or liquid form, the latter including liquid ferroelectrics and ferroelectric fine crystals suspended in liquid. For example, the solid materials that can be used include ceramic ferroelectrics, ferroelectric polymers, and other polarizable polymers. In addition to the ordinary ferroelectrics, extrinsic (or improper) ferroelectrics, such as boracites and sodalites, can be used with the invention. Exploiting the spontaneous polarization of ferroelectrics with the present invention allows a robust conversion of heat to electrical energy in the applications of the invention. Heat can be input to the ferroelectric from the heat source or withdrawn from the ferroelectric to the heat sink by conduction, convection or radiation or by any combination thereof, and by one or two-phase heat transfer systems.

A single stage conversion module includes a single ferroelectric or other polarizable material. As such, it generally has a single phase transition temperature reflecting the transition between the ferroelectric phase and the paraelectric or the antiferroelectric phase. It may be desirable, however, to use a series of ferroelectric materials that have a succession of phase transition temperatures that incrementally cover all, or at least some, of the range of temperatures between the heat source and heat sink. The use of heat regeneration techniques may also affect the number of stages that may be desired.

In one aspect, the present invention relates to an apparatus for converting thermal energy from process heat to electricity. In one embodiment, the apparatus has a ferroelectric layer having a first surface and an opposite, second surface, where the ferroelectric layer is comprised of a ferroelectric material with a phase transition temperature such that, when the material is in a ferroelectric phase spontaneous polarization is established in the material, and the ferroelectric layer, when poled, develops an overall net spontaneous polarization; and such that, as the temperature of the ferroelectric changes so that it traverses the transition temperature, the material enters a paraelectric or antiferroelectric phase wherein the ferroelectric layer has negligible or no overall net polarization.

The apparatus also has a pair of electrodes respectively positioned on the first surface and the second surface of the ferroelectric layer, wherein the electrodes consist of a thermally and electrically conductive material, and means positioned in relation to the pair of electrodes for alternately inputting and removing heat through convection, conduction, or radiation to and from the ferroelectric layer so as to, respectively, heat the ferroelectric layer at a temperature $T_H$ that is higher than the phase transition temperature, and alternately cool the ferroelectric layer at a temperature $T_L$ that is lower than the phase transition temperature, so that the ferroelectric material thereby undergoes alternating phase transitions between (1) the ferroelectric phase and (2) the paraelectric or antiferroelectric phase.

In another aspect, the present invention relates to an apparatus for converting heat to electricity. In one embodiment, the apparatus includes a ferroelectric layer having a first surface and an opposite, second surface. The ferroelectric layer consists of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established, and when the temperature of the ferroelectric material is greater than the Curie temperature $T_c$, spontaneous polarization is not established in the ferroelectric material. The apparatus also includes a pair of electrodes positioned respectively on the first surface and the second surface of the ferroelectric layer. The pair of electrodes is comprised of a thermally and electrically conductive material.

Furthermore, the apparatus includes means positioned in relation to the pair of electrodes for alternately delivering a cold fluid and a hot fluid so as to alternately (1) cool the ferroelectric layer at a first temperature $T_L$ that is lower than the Curie temperature $T_c$, and (2) heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling.

Additionally, the apparatus may have a pair of electric leads connected to the pair of electrodes such that when the ferroelectric material is cycled to diminish the total polarization of the ferroelectric layer, the electric energy corresponding to the electrically-opposite screening charges is output to the pair of electric leads at high voltage. The electric leads may also be connected through a switch to permit application of a DC voltage between the pair of electric leads to create a poling field to be applied when the ferroelectric material is in, or transitioning into, its ferroelectric phase. Moreover, the apparatus may include means for monitoring one or more of the temperature and capacitance of the ferroelectric layer and the temperature and pressure of the heating and cooling fluids.

In another embodiment, the delivering means comprises a first fluid passage and a second fluid passage formed on, at, or adjacent to the pair of electrodes, respectively, such that when a cold fluid passes through at least one of the first and second fluid passages, the ferroelectric layer is cooled, and when a hot fluid passes through at least one of the first and second fluid passages, the ferroelectric layer is heated; one or more heat exchangers positioned such that the first and second fluid passages alternately deliver a cold fluid and a hot fluid to alternately cool the ferroelectric layer at a first temperature $T_L$, and heat the ferroelectric layer at a second temperature $T_H$; and a plurality of control valves in communication with the one or more heat exchangers for controlling the flow of cold and hot fluids. The plurality of control valves is controlled by microcontrollers, and they are coordinated by computer control with the electrical circuitry of the device through a control circuit to achieve the cycle described herein.

In yet another aspect, the present invention relates to a method for converting heat to electricity. In one embodiment, the method includes the steps of providing a ferroelectric layer having a first surface and an opposite, second surface, wherein the ferroelectric layer is comprised of a ferroelectric material with a phase transition temperature such that, when the material is in a ferroelectric phase spontaneous polarization is established in the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization; and including a pair of electrodes positioned respectively on the first surface and the second surface of the ferroelectric layer, the electrodes being comprised of a thermally and electrically conductive material.

The method also includes the steps of alternately delivering a cold fluid and a hot fluid so as to alternately cool the ferroelectric layer to a temperature that is lower than the Curie temperature, $T_c$, and heat the ferroelectric layer to a second temperature that is higher than the Curie temperature $T_c$. During these steps, the electrical circuit is opened and cooling and heating occur under constant polarization.

The method also includes the steps of alternately providing and removing heat to and from the ferroelectric layer, isothermally, by alternately delivering a flow of hot fluid and a flow of cold fluid as to alternately add or remove heat to the ferroelectric layer while total polarization changes to corresponding low and high levels denoted as $P_L$ and $P_H$ respectively. During these steps, the electrical circuit is closed to allow changing polarization, and the heat removed or added corresponds to the enthalpy of transition.

The method also includes poling the ferroelectric material of the ferroelectric layer in the ferroelectric phase at temperature $T_L$. In one embodiment, the poling is performed by a field that results from residual free charges on the electrodes that are on the surfaces of the ferroelectric. The method also includes the step of discharging the electrical energy generated in the ferroelectric material of the ferroelectric layer into external circuitry by closing the circuit while heat is being input into the ferroelectric layer isothermally and polarization diminishes to a minimum level, $P_L$. $P_L$ corresponds to the residual charge that is adequate to establish a field sufficient for poling. In another embodiment, poling is accomplished by applying a small poling field from a DC voltage source. In that embodiment, the minimum polarization can become negligible or zero during the step in which the electrical energy generated in the ferroelectric material of the ferroelectric layer is discharged into external circuitry, with the circuit closed, while the ferroelectric layer is heated isothermally In one embodiment, the thermal delivering step is performed by one or more heat exchangers that are in thermal communication with a heat source and a heat sink for inputting heat from the heat source to the ferroelectric layer and withdrawing heat from the ferroelectric layer to the heat sink. In another embodiment, the thermal delivering step is performed by one or more heat exchangers and a plurality of control valves in communication with the one or more heat exchangers, wherein are positioned first and second fluid passages for alternately delivering a cold fluid and a hot fluid so as to remove heat from and input heat to the ferroelectric layer, respectively, and wherein the plurality of control valves is adapted for controlling the flow of cold and hot fluids. In each instance, the electrical circuit is switched between open and closed positions in coordination with the heating and cooling cycling described herein.

In other embodiments, instead of cycling the ferroelectric material through phase transition, it remains in a ferroelectric phase throughout and is cycled from a greater degree of polarization to a lesser degree of polarization.

In addition to materials with a crystal structure, amorphous polymer materials that are electrically polarizable can be used with the invention. For such amorphous polymers, the polarizable units exhibit electric dipolar behavior at the atomic and molecular level. An overall net polarization occurs with such polarizable amorphous polymer and copolymer systems when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization, and changes in polarization, that occur in crystalline ferroelectric materials. For amorphous materials, the depolarization transition temperature is analogous to $T_c$ or to the ferroelectric phase transition. Where reference is made to the use of ferroelectric materials and ferroelectric layers in the invention, it should be understood that polarizable amorphous polymers and copolymers with appropriate polarization and transition characteristics can also be used with the invention.

In a further aspect, the present invention relates to an apparatus for converting heat to electricity. In one embodiment, the apparatus has a plurality of ferroelectric modules, $\{FM^n\}$, arranged in a stack, where n=1, 2, 3, . . . N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization. In one embodiment, a pair of electrodes consisting of a thermally and electrically conductive material is positioned on the first surface and the second surface of the ferroelectric stack. In another embodiment, such electrodes are also positioned on the first surface and the second surface of each ferroelectric module, FM''; and in yet another embodiment, such electrodes between adjacent ferroelectric modules are separated by an electrical insulator. The transition temperatures {T''} of the plurality of ferroelectric modules {FM''} may vary successively across the range between temperatures of a heat source and a heat sink.

The apparatus further includes means positioned in relation to the stacked ferroelectric modules {FM''} for alternately inputting and removing heat through convection, conduction, or radiation to and from the stacked ferroelectric modules {FM''} so as to alternately cool the stacked ferroelectric modules {FM''} at a first temperature that is lower than each transition temperature T'', and heat the stacked ferroelectric modules {FM''} at a second temperature that is higher than each transition temperature T'', such that each ferroelectric layer of the stacked ferroelectric modules {FM''} thereby undergoes alternating phase transitions between (1) the ferroelectric phase and (2) the paraelectric or antiferroelectric phase.

The apparatus may further include devices to monitor, among other things, one or more of the temperature and capacitance of one or more ferroelectric modules FM'' and the temperature and pressure of the heating and cooling fluids. Thermal cycling is coordinated with the electrical status of the ferroelectric modules {FM''} under computer control so as to synchronize heating and cooling with electrical input and output, pursuant to the general cycle of the invention, including poling and electrical discharge.

In yet a further aspect, the present invention relates to an apparatus for converting heat to electric energy. In one embodiment, the apparatus has a plurality of ferroelectric modules, {FM''}, arranged in a stack, where n=1, 2, 3, ... N, N being an integer greater than one. Each ferroelectric module FM'' includes a ferroelectric layer having a first surface and an opposite, second surface, wherein the ferroelectric layer is formed of a ferroelectric material characterized with a Curie temperature, $T_c''$, such that when the temperature of the ferroelectric material is lower than the Curie temperature, $T_c''$, the ferroelectric material is in a ferroelectric phase in which spontaneous polarization is established in the ferroelectric material, and when the temperature of the ferroelectric material is greater than the Curie temperature, $T_c''$, spontaneous polarization is not normally established in the ferroelectric material; and in one embodiment a first electrode and a second electrode are positioned on the first surface and the second surface of the ferroelectric stack, respectively; and in another embodiment a first electrode and a second electrode are positioned on the first surface and the second surface of each ferroelectric module, FM''. Different ferroelectric layers of the plurality of ferroelectric modules {FM''} are comprised of an identical ferroelectric material or different ferroelectric materials. In one embodiment where a first electrode and a second electrode are positioned on the first surface and the second surface of each ferroelectric module, FM'', each two adjacent ferroelectric modules are separated by an electrical insulator. The Curie temperatures $\{T_c''\}$ of the plurality of ferroelectric modules {FM''} may vary successively across the range between temperatures of a heat source and a heat sink.

The apparatus further includes means positioned in relation to the stacked ferroelectric modules {FM''} for alternately delivering a cold fluid and a hot fluid over the stacked ferroelectric modules {FM''} so as to alternately cool the stacked ferroelectric modules {FM''} at a first temperature that is lower than each Curie temperature $T_c''$, and heat the stacked ferroelectric modules {FM''} at a second temperature that is higher than each Curie temperature $T_c''$, thereby each ferroelectric layer of the stacked ferroelectric modules {FM''} undergoes alternating phase transitions between the ferroelectric phase and the paraelectric phase with temperature cycling.

The apparatus may further include devices to monitor the temperature and capacitance of one or more ferroelectric modules FM'' and the temperature and pressure of the heating and cooling fluids. Thermal cycling is coordinated with the electrical status of the ferroelectric modules {FM''} through a control circuit to synchronize heating and cooling with electrical input and output, pursuant to any of the thermodynamic cycles that can be used with the invention, including the cycle that utilizes two isothermal steps and two steps at constant polarizations, together with poling and electrical discharge.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more aspects or embodiments of the invention and, together with a written description, serve to explain the principles of the invention. Where practical, the same reference numbers are used throughout the drawings to refer to the same or like elements of an embodiment, wherein:

FIG. 7 is a flow chart of a process for converting heat to electric energy according to one embodiment of the present invention.

FIG. 8 shows schematically a ferroelectric device for converting heat to electric energy according to one embodiment of the present invention.

DETAILED DESCRIPTION OF THE INVENTION

Figure 1:
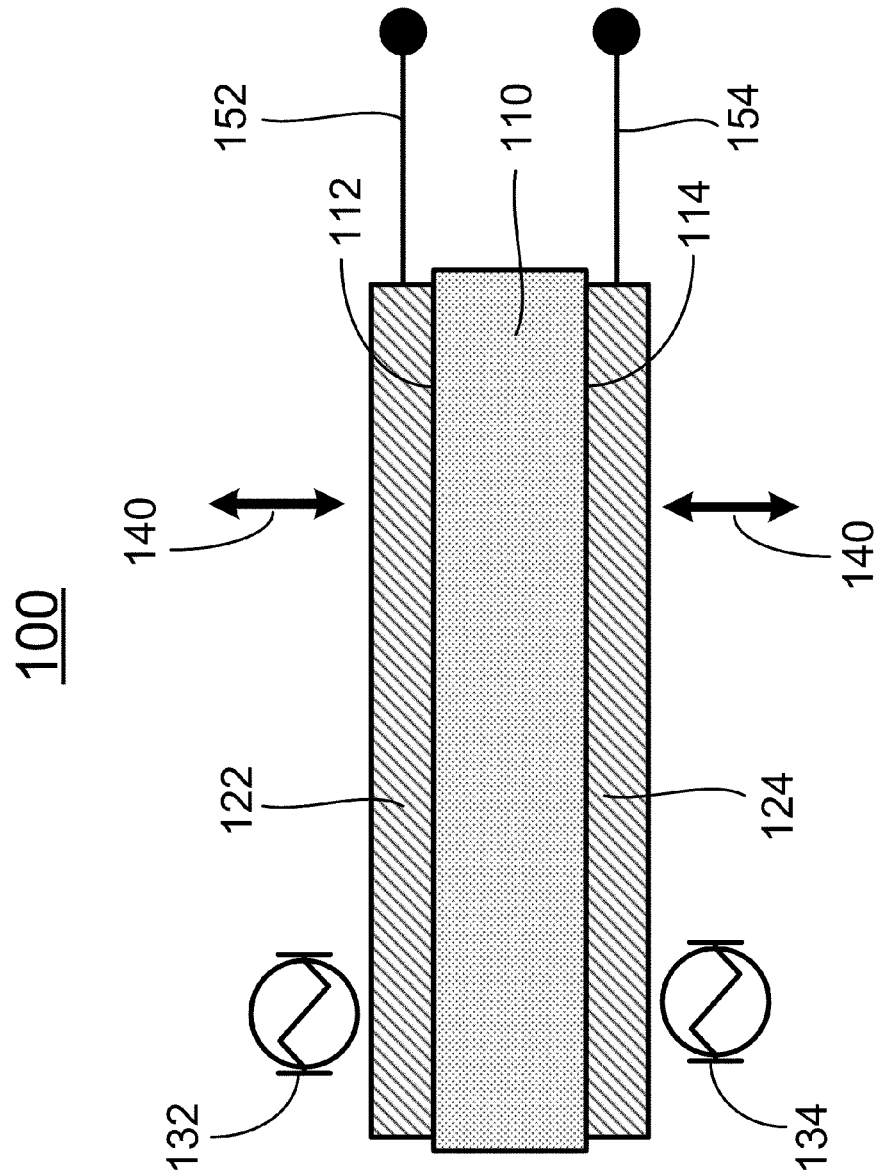
FIG. 1 is a cross-sectional schematic view of a ferroelectric device for converting heat to electric energy that utilizes changes in spontaneous polarization that occurs in temperature cycling to generate electric charges that can be removed to external circuitry at high voltage, according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 14:
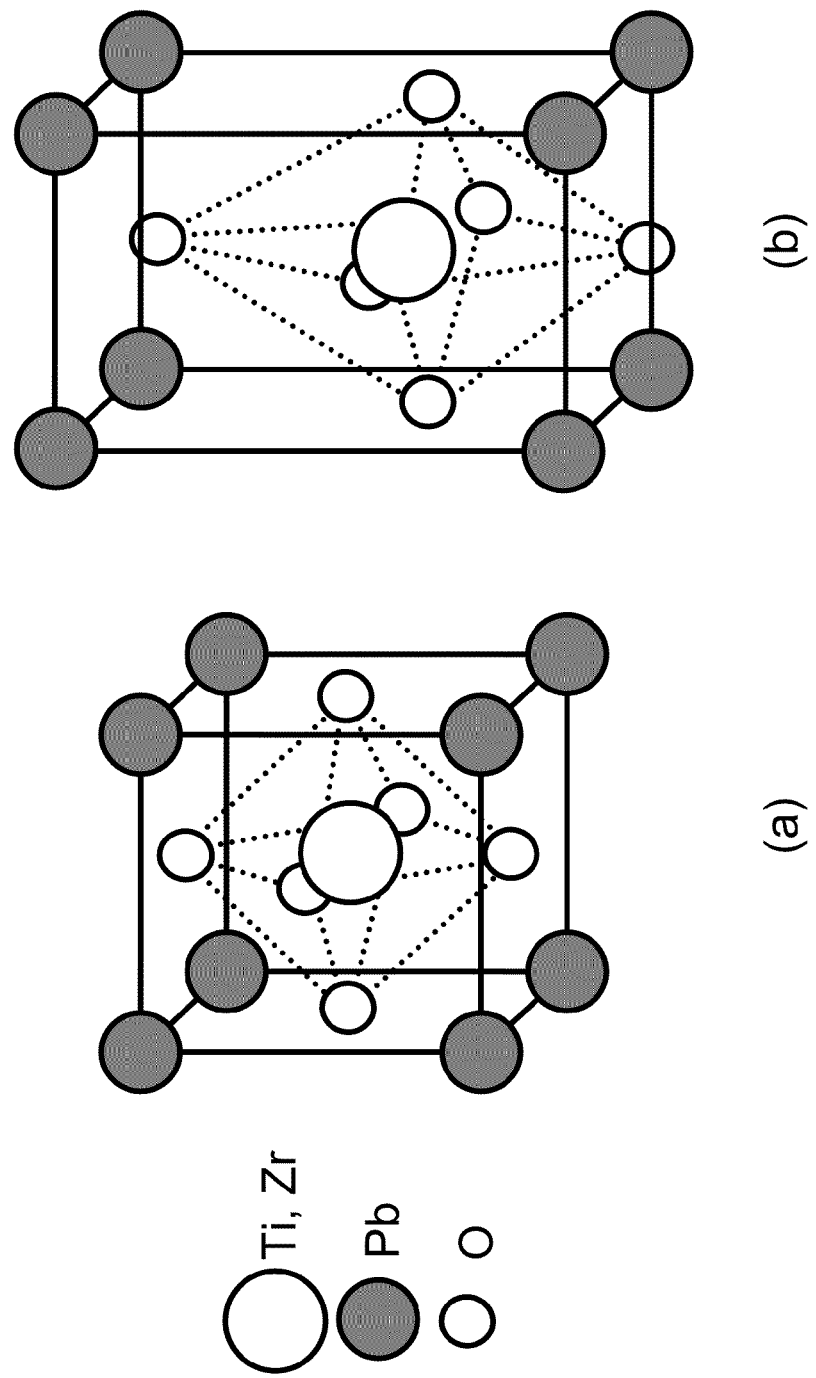
FIG. 14 illustrates schematically the shift from (a) the paraelectric cubic state of a Perovskite crystal to (b) the tetragonal configuration, the latter reflecting the ferroelectric state with displaced ions that arise from deformation of the unit cell, thereby making the unit cell an electric dipole, which in the aggregate with the other dipoles throughout the material give rise to spontaneous polarization, $P_s$.

As used herein, the term "unit cell" refers to a crystal structure that is a unique arrangement of atoms in a crystal. A crystal structure is composed of a motif, a set of atoms arranged in a particular way, and a lattice. Motifs are located upon the points of a lattice, which is an array of points repeating periodically in three dimensions. The points can be thought of as forming identical tiny boxes, called unit cells, that fill the space of the lattice. The lengths of the edges of a unit cell and the angles between them are called the lattice parameters. The crystal structure of a material or the arrangement of atoms in a crystal structure can be described in terms of its unit cell. The unit cell is a tiny box containing one or more motifs, a spatial arrangement of atoms. The unit cells stacked in three-dimensional space describe the bulk arrangement of atoms of the crystal. The crystal structure has a three dimensional shape. The unit cell is given by its lattice parameters, the length of the cell edges and the angles between them, while the positions of the atoms inside the unit cell are described by the set of atomic positions measured from a lattice point. Examples of unit cells are illustrated in FIG. 14.

As used herein, the term "Curie temperature" or $T_c$ refers to a characteristic property of a ferroelectric material. At temperatures below the Curie temperature, the ferroelectric material generally is in a ferroelectric phase in which spontaneous polarization is established in the unit cells of the ferroelectric material. As the temperature is increased towards the Curie temperature, the spontaneous polarization established in the unit cells decreases. Above the Curie temperature, the ferroelectric material is generally in a paraelectric phase in which spontaneous polarization is not established in the unit cells of the ferroelectric material. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein, and the ferroelectric phase may occur at a higher temperature than the antiferroelectric phase. There does not appear to be a clearly established usage as to whether "Curie temperature" also applies to the transition temperatures for these latter kinds of phase transitions. The terms "phase transition temperature" and "transition temperature" are used herein to include all of the foregoing types of phase transitions. "Curie temperature" or $T_c$ may be used only in conjunction with the first type of phase transition, or it may be used more broadly when apparent from the context.

In practice, for all of the above described types of phase transitions, the sharpness of the phase change as the material temperature crosses the transition temperature is determined by the homogeneity of the composition and the crystal structure, such that the transition between phases may take place progressively as the temperature of the ferroelectric material increases or decreases over a temperature range around the designated transition temperature of the material.

Whenever the use of ferroelectric materials are disclosed herein, it is intended that such use include both ordinary and improper ferroelectrics, with the ferroelectric material being cycled with respect to its phase transition as described. With extrinsic ferroelectrics, polarization represents a second order parameter, which is coupled to some primary order parameter.

In addition to ferroelectric materials with a crystal structure, amorphous materials that are polarizable can be used with the invention. Some such materials provide a very robust basis for converting thermal energy to electricity. For such amorphous materials, the depolarization transition temperature is analogous to $T_c$ or the ferroelectric phase transition temperature as described above. Whenever the use of ferroelectric materials is disclosed herein, it is intended that that use include the cycling of such polarizable amorphous materials. In that instance, the polarizable amorphous material is cycled like the ferroelectric material, with the depolarization transition temperature being used in the cycle in lieu of the ferroelectric phase transition temperature.

Various polarizable amorphous materials are of particular utility with the invention because their depolarization transition temperatures are in a useful range for many applications, generally less than ~250° C., although they may also be at greater temperatures, and they produce a robust discharge of electrical energy when cycled. The relationship between energy, polarization, and permittivity is:

$$U=P^2/2\in\in_0.$$

While P is generally smaller with such amorphous polymers than is the case, for example, with ferroelectric ceramics, the permittivity for such materials is much smaller, thereby increasing energy density, U.

Examples of polarizable amorphous materials that can be used with the invention include MXD6 Nylon, which has a transition temperature of approximately 78 C and has produced measured discharge voltages of approximately 800 V for a sample 70 μm thick. A PANMA-4 acrylonitrile copolymer sample 50 μm thick has produced a discharge voltage of approximately 1,300 V with a transition temperature of approximately 100° C.

On occasion, "polarization" is used herein where it might be more precise to refer to "electric displacement." Since there is no significant difference between the terms in this context, polarization is used throughout for simplicity and clarity.

Without intent to limit the scope of the invention, exemplary apparatuses and methods and their related results according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

In accordance with the purposes of this invention, as embodied and broadly described herein, this invention, in one aspect, relates to an apparatus and method for converting thermal energy directly to electrical energy through a ferroelectric medium without the energy passing through intermediate mechanical mechanisms or through other forms. The invention exploits the large inherent spontaneous polarization that develops in ferroelectric materials when they are in their ferroelectric phase. The spontaneous polarization that arises in the unit cells of ferroelectric materials or in other polarizable materials, which is exploited by the invention, occurs without application of an external E field. The spontaneous polarization occurs as a result of the material transitioning into a ferroelectric phase. The powerful spontaneous polarization of the unit cells produces a large overall net polarization in the ferroelectric material as a whole when the unit cells and domains are aligned by poling. The invention further exploits the large changes in overall net spontaneous polarization that occur when a change in the temperature of the ferroelectric or other polarizable material causes a transition to a phase that has negligible net polarization.

The invention permits the removal and use of the electrical energy generated by the spontaneous polarization that occurs when the material is in the ferroelectric phase. The electrical energy so generated can be exported to external circuitry in conjunction with phase transition of the material from the ferroelectric phase to a non-polar phase. The inherent net spontaneous polarization, $P_s$, disappears as the material transitions to a non-ferroelectric phase. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module is cycled around its phase transition temperature. That temperature cycling is accomplished by one or more heat exchangers that interface between the ferroelectric module and a heat source and heat sink. The heat exchangers and heat source are not limited and may include any mode by which thermal energy is transferred, including convective, conductive and radiative transfer, and one and two-phase thermal transfer systems. The invention can be used generally to convert thermal energy where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T=(T_H-T_L)$, is sufficient to allow effective conversion for the particular application.

There are ferroelectrics with phase transition temperatures that range from as low as about 0° C. to greater than 700° C., and the invention can be operated in that range with such ferroelectrics. There is no theoretical limit to the operating temperature of the apparatus or method, and it can also be used at temperatures below 0° C. and above 700° C. insofar as appropriate ferroelectrics are available.

It will be recognized by persons skilled in the art that some temperature gradient will exist between the ferroelectric material and the heat source that is at $T_H$ and the heat sink that is at $T_L$. While that gradient is often disregarded in quasistatic thermodynamic analyses that assume an ideal isothermal heat transfer between the working medium—which here is the ferroelectric—and the heat source and sink, the flow of heat requires some gradient in practice. For simplicity, that gradient is disregarded here and $T_H$ may be used to designate both the temperature of the heat source and the temperature to which the ferroelectric is heated. Similarly, $T_L$ may be used to designate both the temperature of the heat sink and the temperature to which the ferroelectric is cooled. In practice, the extent of the actual gradient may affect the overall thermal efficiency, power density, and other factors.

The invention is not limited or specific to any particular heat exchanger format or configuration, nor to any particular thermal characteristics of the heat source or heat sink. Heat input and withdrawal to and from the ferroelectric to cause temperature and phase cycling can be accomplished by thermal transport through convection, conduction or radiation, and by one or two-phase heat transfer systems.

In general, different materials can be used to practice the present invention. A particular ferroelectric will be effective in converting heat to electrical energy when cycled around its phase transition temperature or temperatures. As noted, the phase transition that often will be utilized with the invention is that from ferroelectric to paraelectric and back to ferroelectric. However, the phase transition from ferroelectric to antiferroelectric and back may also be utilized with the invention. First order transitions are common among ferroelectric materials, and many first order transition materials are appropriate for use with the invention. Ferroelectric materials that exhibit second order transitions may also be used with the invention.

Criteria that affect the suitability of a ferroelectric material for a particular application include: (1) a phase transition temperature that matches the available range of thermal energy from the heat source and heat sink; (2) the sharpness of the phase transition of that material as a function of temperature; (3) the energy released during transition from a polarized state to a non-polarized state, as expressed by $U=P^2/2\in_0$ (with high permittivity ferroelectrics, spontaneous polarization in the ferroelectric state is preferably $\geq 2$ μC cm$^{-2}$, but amorphous polymers with much lower polarization may be used since they may have very low permittivity); (4) a sufficiently high resistivity to avoid the charges on the electrodes from leaking through the ferroelectric medium before the stored electrical energy can be removed externally at high voltage; and (5) a comparatively high ferroelectric transition energy, or enthalpy, in comparison to the energy required to heat the lattice during cycling (this factor will depend in part on the magnitude of the temperature difference between the high and low cycling temperatures).

Lead based ferroelectric materials systems, for example, provide a wide range of materials combinations, such as PZT, PZST, PLT, etc., that may be used. The particular percentage compositions of the constituent elements will affect the specific performance characteristics of the material, including the phase transition temperature. In polymer systems, the phase transition temperature can be varied and controlled by forming copolymers and blends. A list of many ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. That Appendix F is incorporated herein. The invention can be used with ferroelectrics that are in either solid or liquid form, the latter including, for example, liquid ferroelectrics and ferroelectric fine crystals suspended in a liquid appropriate for a particular application. The solid materials that can be used include ceramic ferroelectrics, ferroelectric polymers, and other polarizable polymers by way of example.

Figure 15:
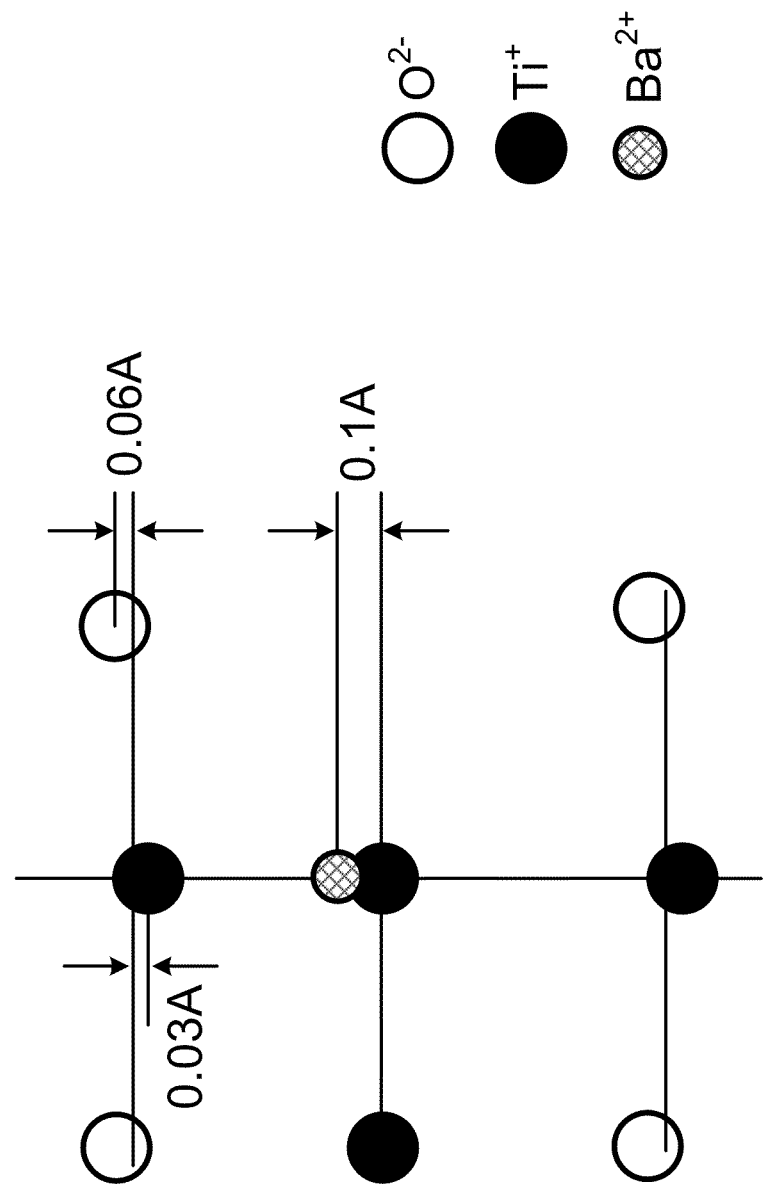
FIG. 15 illustrates the magnitude of the ionic displacements that occur in the unit cell of the Perovskite barium titanate, $BaTiO_3$, when in the ferroelectric phase and that give rise to spontaneous polarization, $P_s$.

By way of example, a number of Perovskite crystals exhibit phase transition phenomena that provide an effective ferroelectric to be used in the invention. Perovskite ferroelectrics, such as PZT or PLT, undergo mostly first order transitions from the ferroelectric to paraelectric phase when the unit cell structure undergoes transition from cubic (paraelectric phase) to tetrahedral (ferroelectric phase). FIG. 14(a) illustrates the unit cell structure for a Perovskite crystal in the paraelectric phase where the material temperature is greater than $T_c$. In the example, the eight corners of the cube are occupied by lead atoms; the six faces of the cube are occupied by oxygen atoms; and the center of the cube is occupied by a titanium or zirconium atom. FIG. 14(b) depicts the shift in the relative positions of the ions when the material is in the ferroelectric phase and $T<T_c$. It is that shift that gives rise to the local electric dipole of the unit cell, and it is those electric dipoles that, in the aggregate, produce the spontaneous polarization of the ferroelectric material, $P_s$. FIG. 15 illustrates the magnitude of the physical displacement, in angstroms, that may occur among the ions in the unit cell in the ferroelectric phase, which displacement gives rise to the unit cell electric dipole.

The present invention discloses embodiments whereby the ferroelectric conversion invention can be used in practical applications using heat from specific sources and for specific applications. Without intent to limit the scope of the invention, exemplary apparatuses and methods and the related applications according to the embodiments of the present invention are given below. In all instances, not only is a heat source necessary to provide thermal energy for the ferroelectric conversion of heat-to-electricity, there must be a sink to remove heat from the ferroelectric generator.

The invention can be practiced using an intermediate heat exchanger to couple the heat sink to the working fluid that directly removes heat from the ferroelectric generator. Such a heat sink and heat exchanger can be used with the invention according to many technologies and designs known to those skilled in the art. Depending upon the particular application, heat can be expelled through the heat sink to the ambient atmosphere, to the ground, to a water source, or to any other solid, liquid or vapor mass that can serve to absorb and dissipate heat. Depending on the scale of the thermal generating apparatus, for example, a heat sink may be a finned radiator heat exchanger, a shell and tube heat exchanger, or a cooling tower, among many others. Apparatuses and methods for constructing and operating heat sinks are well known in the art. Regardless of the particular configuration and thermal characteristics of the heat source and the heat sink, the ferroelectric generator will employ heating and cooling fluids that will be used in the fashion described herein for thermal cycling.

Heat from Combustion.

Figure 25:
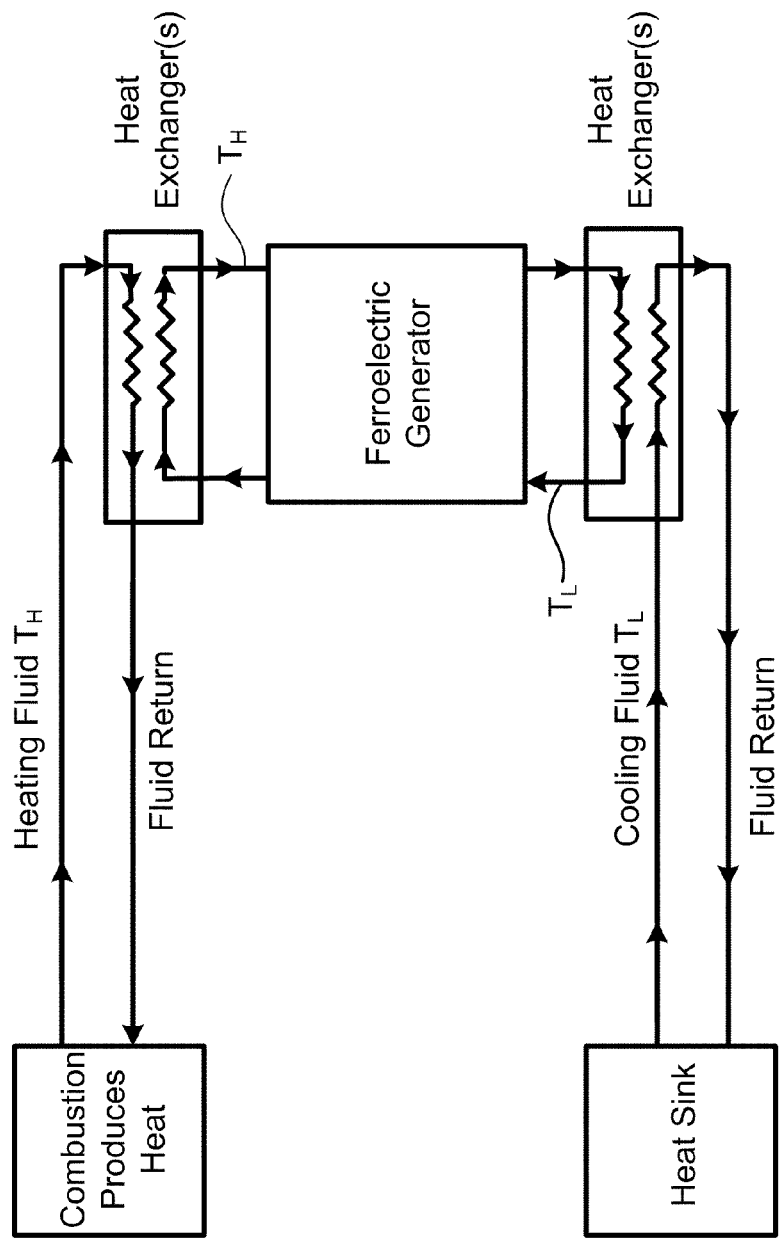
FIG. 25 is a schematic diagram that illustrates the overall apparatus whereby heat is generated in a combustion apparatus and removed therefrom; transferred to one or more working fluids through one or more heat exchangers; those working fluids are used to provide heat to a ferroelectric generator; and a heat sink provides one or more working fluids through one or more heat exchangers to remove heat from the ferroelectric generator.

Combustion is one of the most pervasive sources of thermal energy that may be used with the invention to generate electricity. As illustrated in FIG. 25, heat is removed from the combustion apparatus and transferred to one or more working fluids through one or more heat exchangers, and those working fluids are then used to provide heat to the ferroelectric generator and to cycle the material in accordance with a thermodynamic cycle as described herein so as to convert heat to electricity. The available fuels for combustion, the apparatuses and methods by which combustion may be performed, and the heat exchanger systems by which heat can be removed from the combustion device for external use are many and are well known to those skilled in the art. The invention can be practiced with any such fuel and combustion process that is practical for a given application. Such a combustion process includes any sequence of exothermic chemical reactions between a fuel and an oxidant, whether oxygen or otherwise, whereby heat is produced as the combustion fuel is converted to a different chemical species. Fuels may be in a gas, liquid or solid phase. Combustion can be catalytic or otherwise. Common fuels include organic compounds, particularly hydrocarbons, hydrogen, and biomass. Combustion may be complete or incomplete, and may be of any kind or character, whether rapid, slow, smoldering, turbulent, or otherwise. Combustion for use with the invention includes those processes in which there may be a number of distinct intermediates, so long as there is a net production of thermal energy. For example, solid fuels may undergo a number of pyrolysis reactions that produce more easily oxidized gaseous fuels. The pyrolysis reactions are endothermic and require energy input from the combustion reactions. Such reactions that are partly endothermic may be used as sources of combustion heat with the invention so long as, overall, there is a net production of heat in the overall reaction sequence.

For many years, boilers have been commonly used for a wide range of applications. A boiler is a closed vessel in which water or another fluid is heated. The heated or vaporized fluid exits the boiler for use in a heating application or various processes. In one embodiment of the present invention, such boilers are used to generate a heated working fluid from the heat released by combustion. There are many different boiler designs well known in the art, including the firetube boiler, the water-tube boiler, the sectional boiler, the flash boiler, and others.

Certain embodiments use a common type of boiler that produces steam at saturation temperature. These superheated steam boilers vaporize the water and then further heat the steam in one or more superheaters, producing steam at a higher temperature than otherwise occurs. In another embodiment, super critical steam generators may be used. They operate above the critical point at a very high pressure (generally over 22.06 MPa) at which point actual boiling ceases to occur, and the boiler has no water-steam separation. These and many other types of combustion and steam generating apparatuses are well known to those skilled in the art and may be used with the invention.

By referencing these certain embodiments and examples of combustion and steam generation, it is not meant to be suggested that the apparatuses or methods of combustion encompassed within the instant invention are limited to such devices. They are simply used as examples. The invention can be practiced with combustion from a small scale of less than 1 mW to a large scale in excess of 100 MW. The invention can also be practiced with any fuel source that generates heat, and it is not limited to those combustion systems that heat water or steam. Generally, appropriate fluids that may be heated by the combustion apparatus are those with relatively high specific heat and relatively high latent heat characteristics.

In one embodiment, the apparatus and method of the present invention can be used to generate electricity from heat released by catalytic combustion of traditional and other fuels. Combustion of traditional fuels can be enhanced by the use of various catalysts. Traditional flame combustion or oxidation generally occurs only within specific fuel-to-oxygen ratios. When the mixture deviates from the ideal or stoichiometric ratio, the combustion will often be incomplete and produce pollutants in addition to the normal products of combustion. The use of a heterogeneous catalyst allows greater control of oxidation over a wide range of fuel-to-oxygen ratios, and fewer pollutants may be produced. In operation, the mixture of fuel and air is typically passed over a catalyst at a temperature sufficiently high to allow total or nearly total oxidation. With the correct catalyst, this temperature is lower than that required in the absence of a catalyst and allows for flameless combustion. The reaction that occurs on the catalyst surface liberates both thermal energy and the products of combustion.

One exemplary embodiment of catalytic combustion with particular applications to power generation is described in U.S. Pat. No. 5,851,498 to Rozenshtein et al., which is incorporated herein by reference. This embodiment features a boiler having a burner employing a catalyst to facilitate flameless combustion of gaseous hydrocarbon fuel in air.

Electric Vehicles.

A variety of technologies are in use today for powering vehicles with electric motors. The instant invention discloses a new way to generate electricity on board a vehicle to power it. Heat is used with the ferroelectric generator of the invention to generate electricity. That thermal energy can be generated, on board, from a wide variety of sources, including traditional combustion, catalytic combustion, and many different exothermic reactions. Hydrocarbons are one source of fuel by which heat can be generated on board. Other thermal energy carriers may also be used that are not hydrocarbons or petroleum-based fuels.

Figure 26:
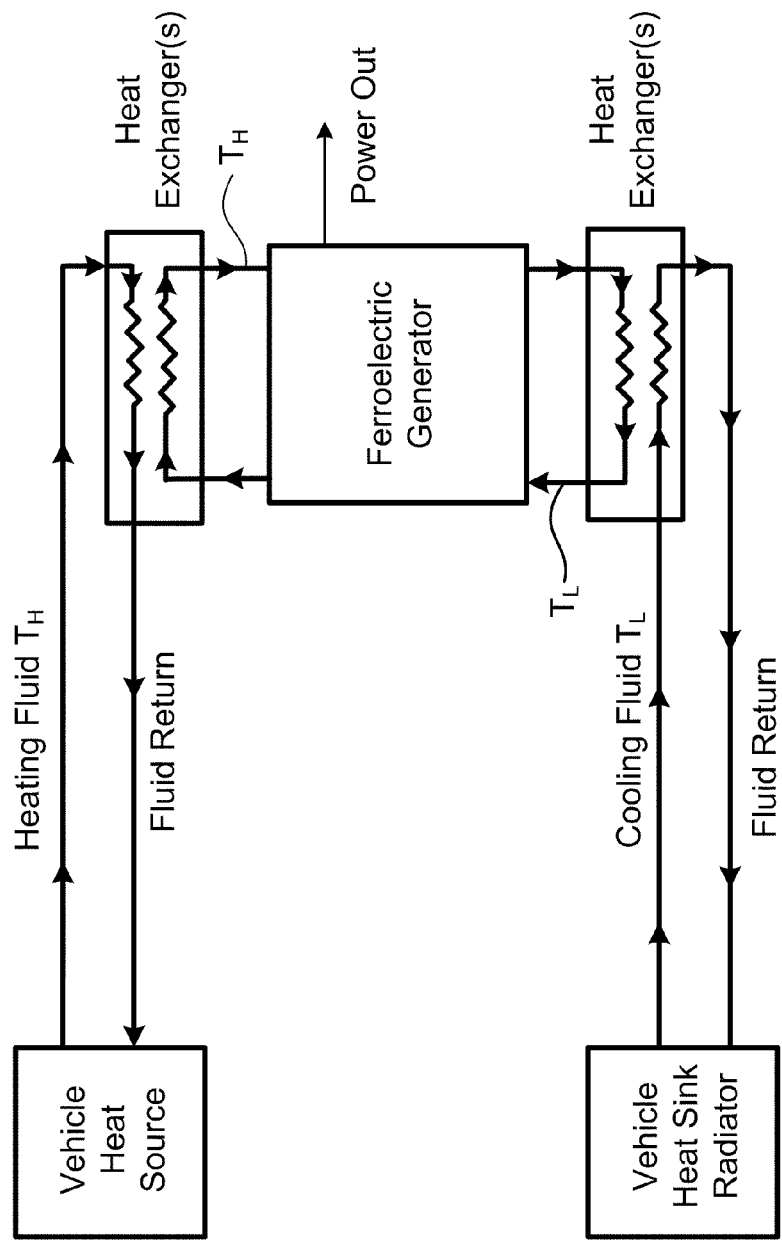
FIG. 26 is a schematic diagram that illustrates the overall apparatus whereby heat generated on a vehicle is used, with one or more heat exchangers, to heat working fluids that are then used to provide heat to a ferroelectric generator; and a heat sink that removes heat from the ferroelectric generator through one or more heat exchangers. Overall, heat is thereby produced on board and used as a source of energy to generate electricity for powering the vehicle.

As illustrated in FIG. 26, heat is produced on board a vehicle and transferred to one or more working fluids through one or more heat exchangers, and those working fluids are then used to provide heat to the ferroelectric generator in cycling the material as described herein to convert heat to electricity. In one embodiment, a vehicle, for example a car, truck, or bus, is propelled by electric motors that receive electricity that is generated with the invention from heat provided by combusting hydrogen, diesel, gasoline, ethanol, or other hydrocarbon fuel. Heat is transferred from the combustor to the ferroelectric generation device via a working fluid. Similarly, a cold reservoir is in thermal communication with the ferroelectric generator. The cold reservoir can be a radiator or other device that rejects to the ambient heat that is withdrawn from the ferroelectric generator.

Electricity generated by the ferroelectric device is transmitted by electric circuitry to one or more electric storage and control units which may include a variety of controls and instrumentation, including those appropriate for power conditioning and electric energy storage. Storage of electricity on the vehicle may be accomplished using ultracapacitors, batteries, or other storage technologies well known to persons skilled in the art. Additionally, the electric storage and control units may include the electrical distribution and control circuitry to regulate or condition the voltage and current, which is then transmitted by electric circuitry or electric cables to one or more motors to propel the vehicle and operate its peripheral apparatuses.

In one embodiment, a combination of one or more ultracapacitors and one or more rechargeable batteries is used to store electricity generated on board. Ultracapacitors store more energy per weight than traditional capacitors, and they generally deliver electrical energy at a higher power rating than rechargeable batteries. Rechargeable batteries, however, generally have greater energy storage capacity than ultracapacitors. Vehicles have varying power demands during travel, requiring, for example, greater power during acceleration. Since automobiles need little or no power when idling or slowing and can generate storable electric energy through regenerative breaking, electricity generating equipment with the invention can be sized at significantly less than peak power requirements. In one embodiment, peak power is achieved, instead, by short-term, high-power discharge of electricity from an ultracapacitor, for example. In another embodiment, a rechargeable battery can provide additional electrical storage capacity for other purposes, such as initial start up and powering peripherals when the ferroelectric generator is off. It should be noted that, since electrical energy will be continuously generated from heat produced on board, the capacity of any batteries used with the invention will generally be less than is required, for example, for plug-in EVs, which have only the electrical energy obtained at the last battery recharge as a source of power.

As illustrated in FIG. 26, heat is produced on board the vehicle and then transferred to one or more working fluids through one or more heat exchangers, and those working fluids are then used to provide heat to the ferroelectric generator in order to cycle the material in accordance with a thermodynamic cycle, as described herein, so as to convert heat to electricity. As illustrated in FIG. 26, a heat sink is also coupled through one or more heat exchangers to the ferroelectric generator to remove heat rejected during cycling. The invention can be practiced with heat from sources of all kinds, though combustion is a particularly convenient source of thermal energy for many vehicles.

The available fuels for combustion, the apparatuses and methods by which combustion may be performed, and the heat exchanger systems by which heat can be removed from the combustion device for external use are well known to those skilled in the art. Some such embodiments are disclosed hereinabove. Combustion includes any sequence of exothermic chemical reactions between a fuel and an oxidant, whether oxygen or otherwise, whereby heat is produced as the combustion fuel is converted to a set of different chemical species. Common fuels include organic compounds. By way of example, catalytic combustion provides a source of heat that can be generated and transferred to the ferroelectric generator for conversion to electricity. Combustion of fuels can be enhanced by the use of various catalysts, the methods and apparatuses for which are well known.

A catalytic combustor and heat exchanger that can be used in such embodiments can be any one of many designs. One embodiment of a catalytic combustor and heat exchanger suitable for use in an automobile or other vehicle is described in U.S. Pat. No. 6,431,856 to Maenishi, which is incorporated herein. In such construction, a fuel gas and air are mixed in a premixing chamber and fed to a preheating burner. A flame is formed in the preheating burner by an ignition device, and a catalytic element is heated by a hot exhaust gas produced by the flame. When the catalytic element reaches a temperature at which it is active, the supply of the fuel gas is temporarily discontinued, under direction of a control circuit, and the flame is extinguished. After extinguishing the flame, the fuel supply is immediately restarted, thereby initiating catalytic combustion in the catalytic element.

During catalytic combustion, the upstream surface of the catalytic element may be heated to a temperature as high as 800 to 850° C. by combustion heat, and a large quantity of heat is radiated from the upstream surface of the catalytic element. Because the transfer of heat from the catalyst to a heat receiving plate is achieved by radiation, heat is more or less evenly removed from the entire surface of the catalytic element, and the surface of the catalytic element is relatively uniform in temperature. A high-capacity radiation-absorbing layer with a black paint, for example, can be applied to the inner surface of the radiated heat receiving plate. With a coefficient of absorption of the black paint at 0.9 to 1.0, radiation from the upstream surface of the catalytic element is efficiently received by the high-capacity radiation absorbing layer, conducted to the radiated heat receiving plate, and exchanged with the heating medium. As a result, a higher combustion capacity can be obtained at a temperature below a limit of the heat resistance, and the size of a catalytic combustion apparatus can be reduced. The specific examples and embodiments provided herein are not intended to be limiting, but represent common apparatuses and processes whereby heat is produced and can then be transferred, through one or more heat exchangers, to provide a source of heat to a ferroelectric generator as disclosed in the invention.

One embodiment using a non-hydrocarbon fuel to generate thermal energy in vehicles uses aluminum. Aluminum can be used in a series of chemical reactions that exploit its potential as a robust carrier of thermal energy, without reliance on petroleum products, and without pollutants or greenhouse gases as an undesired by-product. One such reaction oxidizes aluminum with water, whereby $2Al+3H_2O \rightarrow Al_2O_3+3H_2$, and that reaction releases thermal energy. Furthermore, the hydrogen by-product can be burned to release more heat and no undesirable by-products: $2H_2+O_2 \rightarrow 2H_2O$. The aluminum oxide waste product, $Al_2O_3$, is reduced to complete the energy carrier cycle. Technologies for reduction of aluminum oxide are well known to those skilled in the art. By way of another example of a non-hydrocarbon fuel, lithium can be used as an energy carrier, where the reaction $2Li+2H_2O \rightarrow 2LiOH+H_2$ releases a substantial amount of heat. Again, the hydrogen so produced can be burned to generate more heat pursuant to the reaction $2H_2+O_2 \rightarrow 2H_2O$. Many other combustion reactions that produce substantial thermal energy are well known to those skilled in the art and may be used with the invention.

Solar Electric Generation.

Figure 27:
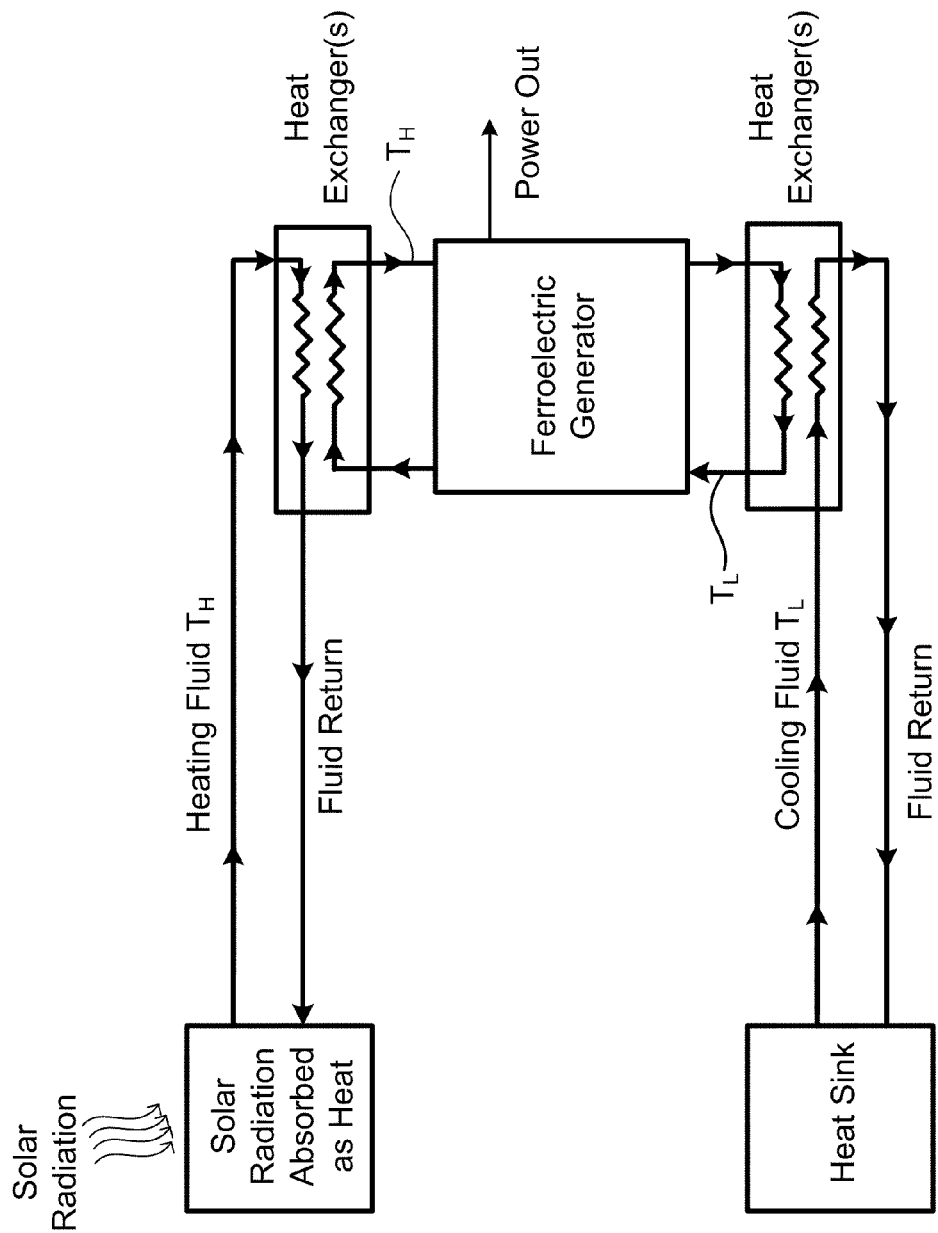
FIG. 27 is a schematic diagram that illustrates the overall apparatus whereby heat is generated from solar energy; transferred to one or more working fluids through one or more heat exchangers; those working fluids are used to provide heat to a ferroelectric generator; and a heat sink provides one or more working fluids through one or more heat exchangers to remove heat from the ferroelectric generator.

Two well-known technologies exist today for converting solar energy to electricity—photovoltaic conversion and solar thermal conversion. Solar thermal conversion gathers solar energy and converts it to a high temperature working fluid which is then used to power a mechanical engine and an electromagnetic generator. Stirling engines are one such example. The present invention uses the sun as a source of energy to generate electricity in a completely different way, as represented schematically in FIG. 27. Using the ferroelectric generator of the invention, solar energy is converted to heat, and that heat is then converted directly to electrical energy without an intermediate mechanical engine or electromagnetic generator, using the ferroelectric generation system disclosed by the invention. The present invention has many advantages over existing solar electric generation, one of which is the ability to generate electricity from lower temperature heat sources than can be used with existing thermal-mechanical systems that use an electromagnetic generator.

Many well-known devices are available to convert solar energy to heat that can be used with the invention. The embodiments presented here are only examples, and numerous alterations and modifications may be made thereof without departing from the spirit and scope of the present invention. Solar radiation consists of electromagnetic energy across a wide range of frequencies, including visible, infrared, and ultraviolet light. When solar radiation strikes an object, a portion is reflected, another portion is absorbed, and another portion may be transmitted through the object. The relative proportions are dependent upon the nature of the object and its surface. Solar thermal collectors are designed to absorb a high percentage of incident solar radiation, thereby increasing the temperature of the thermal collector apparatus. When fluid flows through the apparatus, heat is transferred from the collector panel to the fluid through a one-phase or two-phase heat exchanger.

This heated fluid may be delivered directly to a ferroelectric generator or the heat may be stored within a thermal storage device for later use in the ferroelectric generator. The fluid can be stored directly in an insulated repository without the use of heat exchangers. Alternatively, the fluid can pass through a heat exchanger to transfer the heat to a different medium to be stored in an insulated repository. The heated medium in the storage tank can be used, where appropriate, as a working fluid for heating the ferroelectric layers. In another embodiment, a heat exchanger is used to transfer heat from the storage medium to the working fluid that is used to heat the ferroelectric layers of the generator. The storage device, preferably well insulated, contains a fluid storage medium with an appropriately high specific heat capacity.

In one embodiment, flat-plate solar collectors can be used to heat a fluid generally to about 100° C. above ambient temperature, the amount of increase depending on various factors. A flat-plate solar collector is comprised of a solar energy-absorbing surface with means for transferring the absorbed energy to the desired fluid and a back with insulation to reduce heat loss by conduction. It also may have an insulated frame and cover. Flat-plate collectors are typically mounted in a stationary position with an orientation optimized for location. The solar energy-absorbing surface, or absorber plate of the flat-plate collector, may be comprised of copper, steel, or aluminum, or another material with high thermal conductivity. Plastics (for example, EPDM, polypropylene, and polyethylene) can also be used. Conduits attached to the absorber plate allow for the passage of the desired fluid therein and conduct heat via the fluid.

The most efficient solar collectors have high absorptivity, $\alpha$, for radiation in the solar energy spectrum, as well as low long-wavelength emissivity, $\in$, to minimize heat loss. Since the temperature difference between the surface of the absorber and the surface of the sun (the solar spectrum is approximately represented by 6000° K black body radiation) is great, the spectrum of emitted radiation from the absorber surface differs substantially from the spectrum of solar radiation. Ninety-eight percent of solar radiation is at wavelengths less than 3.0 μm, whereas less than one percent of blackbody radiation from a 200° C. surface is at wavelengths less than 3.0 μm. Under these circumstances, selective surfaces can have high solar absorptance and low long-wave emittance.

In another embodiment, an evacuated tube solar collector can be used, as the vacuum reduces heat loss. In one embodiment, an evacuated tube collector contains a long, thin absorber within a glass tube. Radiant solar energy travels through the glass and vacuum, but heat loss by convection is reduced. The only significant heat loss is by re-radiation. Evacuated tube collectors generally are able to heat a fluid medium to a higher temperature than flat-plate collectors. There are many configurations for evacuated tube solar collectors known to those skilled in the art that may be used with the invention.

In other embodiments, evacuated tube solar collectors may also contain a heat pipe to facilitate heat transfer. A thin layer of a wavelength selective coating can be applied on top of the absorber plate to enhance performance. The considerations for such selective surface coatings are similar to those described above in connection with the design of a flat-plate collector to increase the amount of solar energy captured and to minimize the extent of heat loss.

The transparent glass tube is preferably comprised of a hard glass material, such as borosilicate or tempered soda-lime glass, selected for durability and tolerance for the higher temperatures that are reached in the application. The glass tube permits the absorber to be surrounded with a vacuum, preventing heat from escaping by convection or conduction. It will be appreciated that there are many ways to both evacuate the air within the glass tube and to seal the tube. In other embodiments, two glass tubes are used, one within the other. The air is evacuated from both the interior tube, where the absorber is located, and from between the two glass tubes for extra insulation.

In one embodiment, the heat pipes are sealed on both ends and have a hot interface (sometimes referred to as the evaporator) at one end and a cold interface (sometimes referred to as the condenser) at the other end. The hot interface conducts heat to the working fluid located within the pipe. The air may be partly or substantially evacuated, causing the working fluid to boil at lower temperatures than it would under normal atmospheric pressure, thereby allowing heat transfer to occur at lower temperatures. The working fluid used in the heat pipe will affect the operating temperature of the heat pipe. The working fluid vaporizes and rises to the cold interface located at the top of the heat pipe. At the cold interface, the vapor releases latent heat, condensing back to its liquid phase. The heat pipe and absorber plate are attached to each other so as to optimize heat transfer.

The proper working fluid to use in the heat pipe depends on several factors. Since liquid-vapor phase transition is essential for heat pipe function, the fluid should have both phases within the appropriate temperature range and operating pressure. Further, the latent heat of vaporization for the fluid should generally be high. Examples of working fluids used in heat pipes include acetone, for which the latent heat of vaporization is 518 kJ/kg at 56° C., and water for which the latent heat of vaporization is 2260 kJ/kg at 100° C. Water is a common working fluid used over an operating temperature range of about 5° to 230° C. under various pressures.

It will be appreciated that this description is just an example of an evacuated tube solar collector, of which there are many configurations and constructions. In other embodiments, evacuated tube collectors do not have heat pipes, but utilize a direct flow system, where the fluid to be heated travels through risers on the absorber plate.

Enhanced solar energy absorption can be achieved with nonimaging radiant energy reflectors or concentrators used with either flat-plate collectors or evacuated tube collectors. All energy incident on the entrance aperture within a given angle of acceptance is thereby directed to and concentrated on the evacuated tube. The contour of the concentrator corresponds to the cross section, as described in U.S. Pat. No. 4,142,510, which describes optimal concentration ratios and is incorporated herein.

Thermal energy can be delivered at higher temperatures by decreasing the area from which heat losses can occur. This can be achieved, for example, by interposing an optical device between the source of solar radiation and the energy-absorbing surface to act as a concentrator. Such concentrating solar collectors can be used with the invention to absorb solar energy to a higher temperature medium. The concentration ratio refers to the ratio of the collector aperture area to the absorber area. That ratio can vary from slightly greater than 1 to more than 1,000. Many designs for concentrating collectors are known to those skilled in the art that can be used with the invention. Concentrating collectors can reflect or refract light using mirrors or lenses to concentrate solar energy onto a small absorber area. The collectors can be of various geometrical shapes, including cylindrical, spherical, and parabolic shapes. In addition, the surface of the collectors can be continuous or segmented. Receivers can be convex, flat, or concave and can be covered or uncovered. The collector or receiver can also be moved to aim toward the sun throughout the day for increased efficiency.

In general, concentrators can be divided into two categories: nonimaging and imaging. Nonimaging concentrators do not produce clearly defined images of the sun on the absorber, but rather distribute radiation from the aperture to the absorber generally. An example of a nonimaging concentrator is the addition of reflectors to evacuated tubes, which produces a comparatively low concentration ratio of less than 10, and typically less than 5. An example of an imaging concentrator is a parabolic trough collector, which typically may have a concentration ratio between 15-45 and heat a working fluid up to about 500° C.

Concentrators are most effective when directly facing the sun, and methods of tracking the sun with concentrating systems are well known, including both manual and mechanized orientation systems. Additionally, mechanized systems can be either programmed systems, sun-seeking systems, or a combination of programmed and sun-tracking methods. Sun-seeking systems use detectors to control system alignment. All of these systems and others can be used with the invention.

Process Heat for Power Generation.

There are many sources of process waste heat that can be used with the invention. Sources of heat from industrial and other processes that may be used with the invention include waste heat from gases and liquids in the chemical, petroleum, and forest products industries, including hot gas clean up and dehydration of liquid waste streams. Other industries that generate substantial quantities of heat include, among others, food production and processing, oil refineries, metals, machinery production, iron and steel, aluminum, cement, and many manufacturing facilities. Temperature regimes typical of such processes range from 130° C. to 1600° C. In the higher temperature applications, higher temperature thermal energy is sometimes reused in some manner, whether for heating, power generation using an electromagnetic generator, or otherwise.

Figure 28:
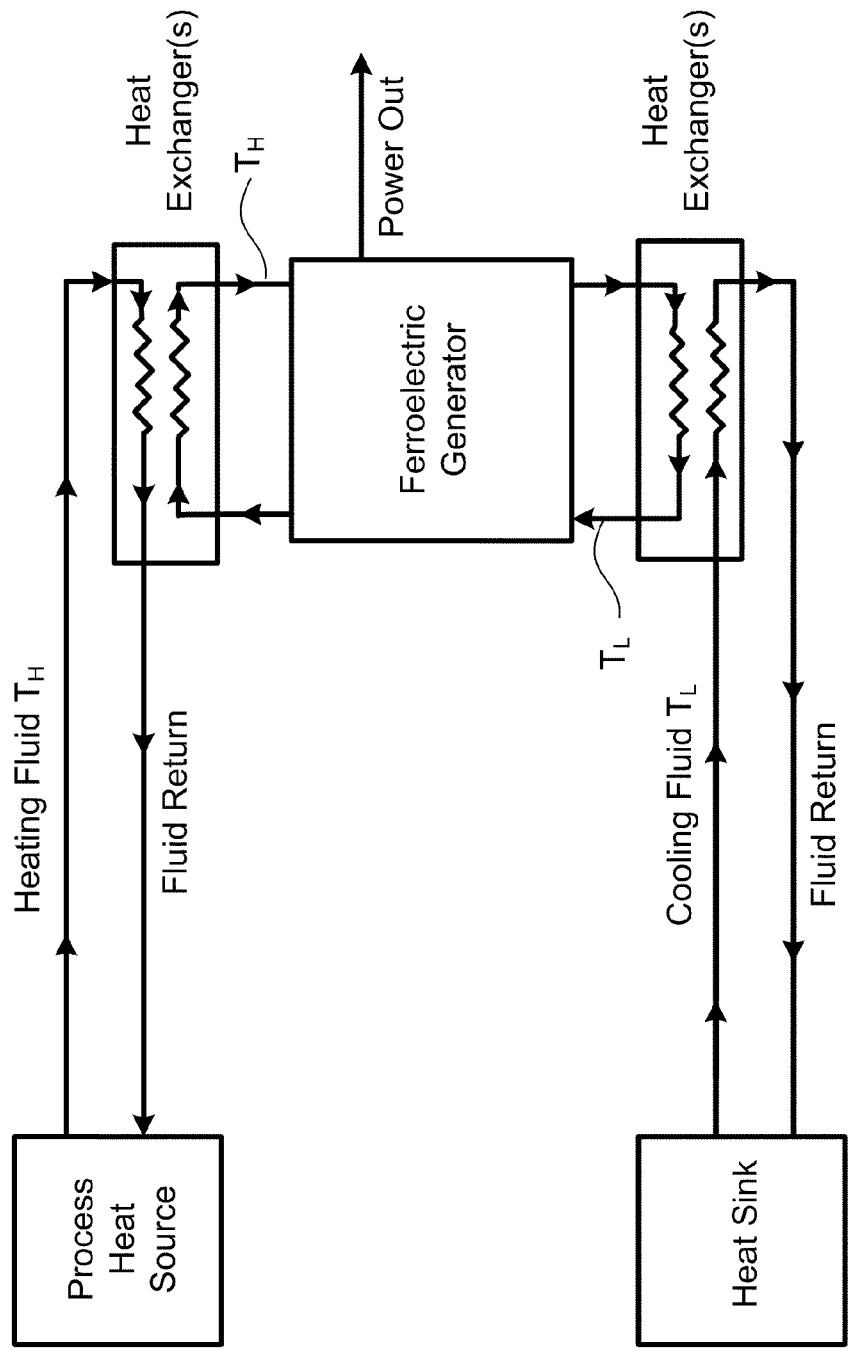
FIG. 28 is a schematic diagram that illustrates the overall apparatus whereby process or waste heat is used, with one or more heat exchangers, to heat working fluids that are then used to provide heat to a ferroelectric generator; and a heat sink that provides one or more working fluids through one or more heat exchangers to remove heat from the ferroelectric generator.

As illustrated in FIG. 28, process or waste heat is recovered and transferred to one or more working fluids through one or more heat exchangers, and those working fluids are then used to provide heat to the ferroelectric generator in order to cycle the material in accordance with a thermodynamic cycle, as described herein, so as to convert heat to electricity. As illustrated in FIG. 28, a heat sink is also coupled through one or more heat exchangers to the ferroelectric generator to remove heat rejected during cycling.

The invention can be used in these applications in either of two basic ways. It can be practiced by converting to electricity waste heat from one or more cogeneration or reuse systems, or it can be used to generate electricity from the entire spectrum of thermal energy that is a by-product of the process at issue without other intervening reuse or cogeneration systems. The potential thermal efficiency of conversion is greater in the latter context since the difference, $\Delta T$, between the high temperature, $T_H$, and the low temperature, $T_L$, is greater. Whether the invention is best used in a particular application with all of the process heat generated or with only a portion of the total process heat in conjunction with other cogeneration or reuse modalities, will depend on the specific features of the application, economic factors, the nature of alternative reuse opportunities, and other factors.

Whether all the process heat generated is used with the invention or only the portion of heat remaining after other cogeneration and reuse systems are employed, the apparatuses and methods by which available thermal energy can be captured is well known, and the apparatuses and methods for transferring recovered heat to working fluids that can be used for inputting thermal energy into the ferroelectric generator are also well known to those skilled in the art. The particular apparatuses and methods by which process heat can be recovered vary depending upon the specific process and application. They include, for example, U.S. Pat. No. 4,766,952 to Onodera; U.S. Pat. No. 4,651,814 to Ito, et al.; U.S. Pat. No. 3,554,515 to Tonooka; U.S. Pat. No. 7,043,912 to Radcliff; U.S. Pat. No. 4,327,670 to Teller; U.S. Pat. No. 4,099,019 to Horibe; U.S. Pat. No. 4,245,693 to Cheng; U.S. Pat. Nos. 4,372,937 and 4,296,800 to Johnson; U.S. Pat. No. 7,569,194 to Russell; U.S. Pat. No. 6,742,337 to Hays; U.S. Pat. No. 4,074,660 to Tsao; U.S. Pat. No. 4,589,890 to Gronvaldt; U.S. Pat. No. 4,226,606 to Yaeger, all of which are incorporated herein. These particular apparatuses and methods are meant only to provide examples by which heat may be removed from various processes, and there are many other suitable apparatuses and methods known to those skilled in the art.

When the invention is coupled to an existing cogenerating facility to produce electricity from the waste heat from the cogeneration device, the source of heat depicted in FIG. 28 is the heat rejected from the cogeneration device. The heat sink as depicted in FIG. 28 may be an existing heat sink at the facility or it may be another heat sink. More robustly, the invention can be used as the complete generator, rather than to bottom up waste heat as an adjunct to other cogeneration equipment. This full implementation is depicted in FIG. 28 wherein the source of heat for the ferroelectric generator, acting through one or more heat exchangers, is the heat provided directly from the facility, machine, process, or other such source. In general, the invention can be practiced with any of the apparatuses and methods that remove waste heat, in combination with a heat sink. This operation is depicted overall in the schematic of FIG. 28.

The heat recovery apparatus can be inserted at any point in the exhaust or waste heat stream where there is heat that can be used to provide thermal energy to the ferroelectric generator. For example, the heat source used for the ferroelectric generator can be a furnace exhaust duct or chimney or any appliances appurtenant thereto, such as electrostatic precipitators, scrubbers, feed water heaters, and economizers. In other embodiments, ferroelectric devices can be mated to cooling loops, radiators, and other cooling systems used to cool equipment and remove waste heat in, for example, refineries, paper plants, chemical plants, gas pipelines and compressor stations, and other industrial plants and facilities.

Equipment that is useful in recovering waste heat includes, among others, heat exchangers, heat-storage systems, and combination heat storage-heat exchanger systems. In one embodiment, heat exchangers consist of two enclosed flow paths and a separating surface that prevents mixing, supports pressure differences between the two fluids, and provides the means through which heat is transferred from the hotter to the cooler fluid. The fluids may be gases, liquids, condensing vapors, evaporating liquids, or fluidized solids.

Radiation recuperators are high-temperature combustion-air preheaters used for transferring heat from furnace exhaust gases to combustion air. In one embodiment such a recuperator may consist of two concentric cylinders, the inner one as a stack for the furnace and the concentric space between the inner and outer cylinders as the path for the air that is heated, which ordinarily moves upward and therefore parallel to the flow of the exhaust gases. With appropriate construction materials, these devices can process 1350° C. furnace gases. In various embodiments, radiation recuperators can be used with the invention to remove and transfer heat from exhaust gases to one or more heat exchangers to heat one or more working fluids to input heat into the ferroelectric generator. Other fluids in addition to air can be used with the recuperator to remove heat.

In another embodiment, convective air preheaters can be used with this invention. Such preheaters typically are corrugated metal or tubular devices that are used to preheat combustion air over a temperature range of ~120-650° C. for ovens, furnaces, boilers, and gas turbines, or to heat ventilating air from sources as low in temperature as ~20° C. In various embodiments such heaters can be used to remove flue gas heat for use with the ferroelectric generator. Other fluids in addition to air can be used with the device to remove and transfer heat for use with the ferroelectric generator.

An economizer traditionally refers to a gas-to-liquid heat exchanger used to preheat the feed water in boilers from waste heat in the exhaust gas stream. Economizers often consist of loops, spirals, or parallel arrays of finned tubing through which the feed water flows and over which exhaust gases pass. Economizers can also be used to heat air or other fluids with waste heat from liquid streams. Economizers can be used in various embodiments with the invention to transfer heat generated by a process to the ferroelectric generator through one or more heat exchangers, as depicted in FIG. 28.

Waste-heat boilers are water-tube boilers that are typically used to produce saturated steam from high-temperature waste heat in gas streams such as diesel engine exhausts, gas turbine exhausts, and pollution control incinerators or afterburners. In various embodiments, such a waste heat boiler can be used with the invention to remove process heat in gas streams so that that heat can be used in the ferroelectric generator, through one or more heat exchangers, as depicted in FIG. 28.

The specific examples and embodiments provided herein are not intended to be limiting in any way, but represent common apparatuses and processes whereby industrial process heat can be recovered and used, through one or more heat exchangers, to provide a source of heat to a ferroelectric generator as disclosed in the invention. Apparatuses and methods of extracting thermal energy from a source, and the design and engineering of heat transfer and heat exchanger mechanisms, are well known to those skilled in the art.

Obtaining Heat from Nuclear Processes.

Nuclear processes that generate thermal energy that can be used with the invention include nuclear fission and fusion reactions and radioactive decay. The energy produced during fission is manifested mainly in the form of kinetic energy of fission fragments and, to a lesser extent, emitted neutrons and other particles and radiation such as gamma rays. As the various particles slow down or are absorbed, their energy is converted into heat.

Figure 29:
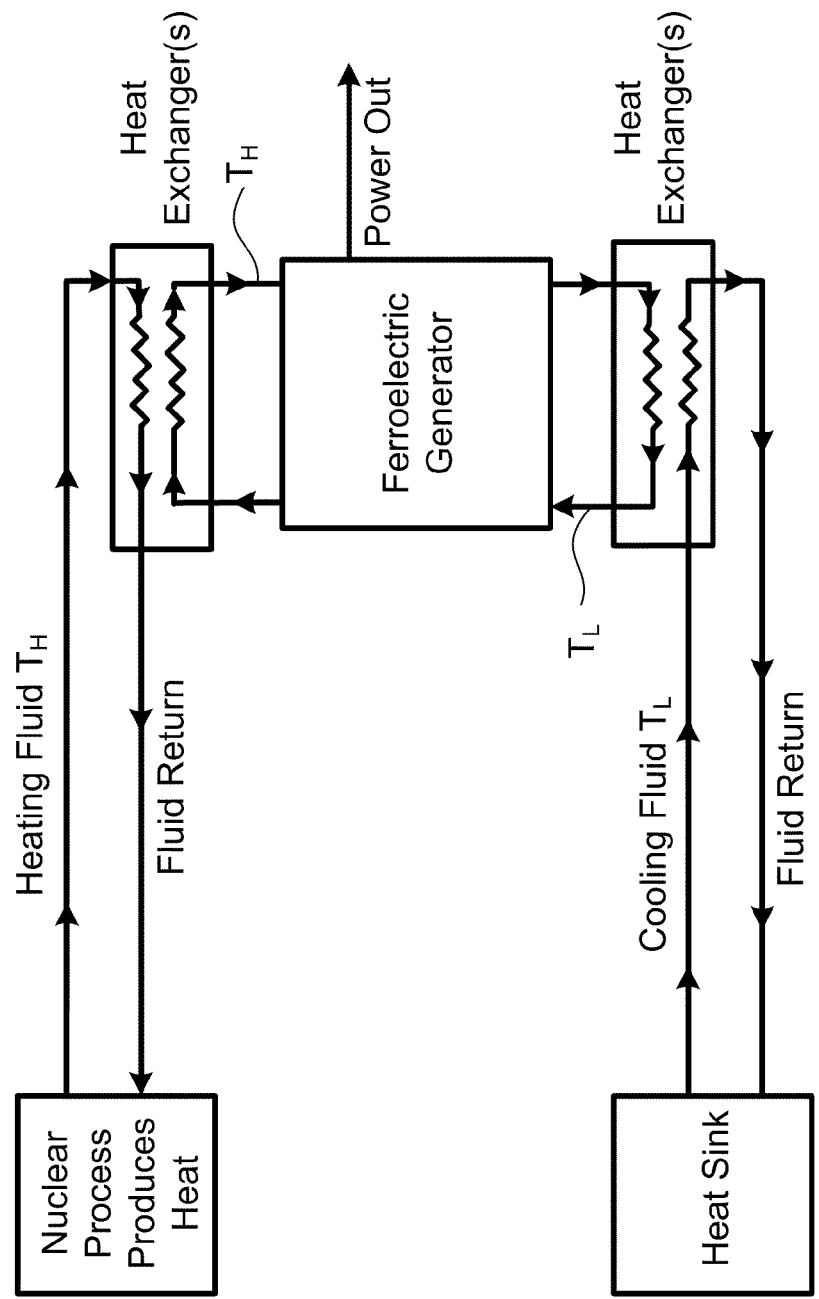
FIG. 29 is a schematic diagram that illustrates the overall apparatus whereby heat is generated by a nuclear process in an apparatus and is removed therefrom; heat is then transferred to one or more working fluids through one or more heat exchangers; those working fluids are then used to provide heat to a ferroelectric generator; and a heat sink provides one or more working fluids through one or more heat exchangers to remove heat from the ferroelectric generator.

As illustrated in FIG. 29, heat is generated by a nuclear process in an apparatus and is transferred to one or more working fluids through one or more heat exchangers, and those working fluids are then used to provide heat to the ferroelectric generator in order to cycle the material in accordance with a thermodynamic cycle, as described herein, so as to convert heat to electricity. The available nuclear fuels, the apparatuses and methods by which thermal energy can be generated by nuclear processes, and the heat exchanger systems by which heat can be removed for external use, are many and are well known to those skilled in the art. The invention can be practiced with any such device and process that is practical for a given application. As illustrated in FIG. 29, a heat sink is also coupled through one or more heat exchangers to the ferroelectric generator to remove heat rejected during thermal cycling.

In many reactors used to generate power, steam is produced from the heat removed by the coolant through a heat exchanger, and that steam is then used to drive a turbine and electromagnetic generator in a Rankine cycle. In various embodiments, these various reactor designs can be used as a source of thermal energy for the ferroelectric generator. In certain embodiments, rather than secondarily heating water to create steam as the working fluid, the coolant loop itself can be used to directly heat the working fluid for the ferroelectric through a heat exchanger.

Nuclear reactors are used for a variety of purposes, including power generation, research, breeding, or a combination of these. While reactor core temperatures are significantly higher in power reactors than in other reactors and are thus particularly suited to generating thermal energy for conversion to electricity with the present invention, thermal energy generated by other reactors at lower temperatures can also be used with this invention.

In one embodiment, a liquid cooled reactor utilizes a liquid coolant that cools the reactor and, when exiting the reactor, is at a temperature high enough to generate steam in a heat exchanger. The coolant loop is generally referred to as the primary loop. The water-steam loop is generally referred to as the secondary loop, or the working fluid loop in a traditional reactor that uses steam, for example, to drive a turbine for power generation. Such reactors can be used with the invention, whereby the steam is used, in conjunction with one or more heat exchangers, as a source of heat for the ferroelectric generator.

In another embodiment, a liquid cooled reactor may use water as the primary coolant, in which case the reactor is generally referred to as a pressurized-water reactor. The heated pressurized water from the reactor is used in this embodiment as a source of thermal energy for the ferroelectric generator, as illustrated schematically in FIG. 29. In yet another embodiment, the primary coolant is an organic liquid, for example, Terphenyl. Because the vapor pressures of such organic liquids are generally lower than that of water, the degree of pressurization is significantly lower, which may have design and construction advantages. In this embodiment, the heated coolant is used as a source of thermal energy to heat the working fluid of the ferroelectric generator, as illustrated schematically in FIG. 29.

In yet another embodiment, the primary coolant may be a liquid metal such as molten sodium. In such a liquid metal cooled reactor, there is generally an intermediate loop that separates the primary and secondary loops with an additional heat exchanger in order to isolate the working fluid loop from the radioactivity induced in the primary sodium. An advantage of liquid metal cooled reactors is that they can operate at higher temperatures so that higher thermal efficiencies can be achieved. By way of example, liquid sodium as a primary coolant exits the core of the Clinch River Breeder reactor at approximately 535° C. In this embodiment, the secondary loop is used as a source of thermal energy to heat the working fluid of the ferroelectric generator, as illustrated schematically in FIG. 29.

Any reactor can be used with the invention so long as thermal energy is produced thereby, and that energy can be removed and transferred through a heat exchanger to the working fluid of the ferroelectric generator. Many practical designs for such nuclear reactors are well known to those skilled in the art. As the design of nuclear reactors progresses, it is expected that there will be many other reactor configurations, apparatuses, and methods of generating thermal energy that can be used with the invention as a source of thermal energy.

Radioactive decay of various isotopes releases energy that can be used with the invention as a source of heat for the ferroelectric generator. Such isotopes include, for example, Plutonium-238, Curium-244, Strontium-90, Polonium-210, Promethium-147, Cesium-137, Cerium-144, Ruthenium-106, Cobalt-60, and Curium-242. Appropriate isotopes produce high energy radiation. In that regard, alpha decay generally releases about ten times as much energy as the beta decay of Strontium-90 or Cesium-137, for example. Radiation must also be of a type, preferably alpha radiation, that is easily absorbed and converted to thermal radiation. Preferable isotopes do not produce significant amounts of gamma radiation, neutron radiation, or penetrating radiation generally through other decay modes or decay chain products. Beta radiation can cause significant gamma or x-ray radiation through secondary radiation production, thus requiring heavy shielding. The design and construction of radioisotope thermal energy units is well known in the art.

The specific examples and embodiments provided herein are not intended to be limiting in any way, but represent common apparatuses and processes whereby heat is generated from nuclear processes, where such heat can be removed and used, through one or more heat exchangers, to provide a source of heat to a ferroelectric generator as disclosed in the invention.

Geothermal Energy for Generating Electricity.

Traditionally, "geothermal energy" most often refers to higher temperature thermal energy sources that are stored in the earth's crust. Substantial wells and other apparatus are typically used to exploit such thermal energy, and hence it is generally not practical for power generation except on a comparatively large scale, for example, with installations producing many kilowatts and preferably in excess of 1 MW. The present invention can be practiced with geothermal energy as a source of heat from such thermal energy reservoirs.

In addition, the invention can be practiced with lower quality heat that is accessible near the surface and does not generally require such complex, large scale, and costly equipment to access. There are many apparatuses and methods that are currently available and used, for example, for geothermal heating and cooling, typically in connection with heat pump technology, where the temperature differential between the ambient environment and a relatively shallow depth below ground is used for heating and cooling. The thermal energy and temperature differential present in such systems is generally insufficient for electrical generation with other technologies. However, the present invention can be practiced to generate electricity using the temperature differential between shallow subsurface ground and the ambient environment above ground. The invention can be used to generate electricity from such thermal sources either as an independent apparatus or in conjunction with geothermal heat pumps or ground source heat pumps that are also used for heating and/or cooling.

Figure 30:
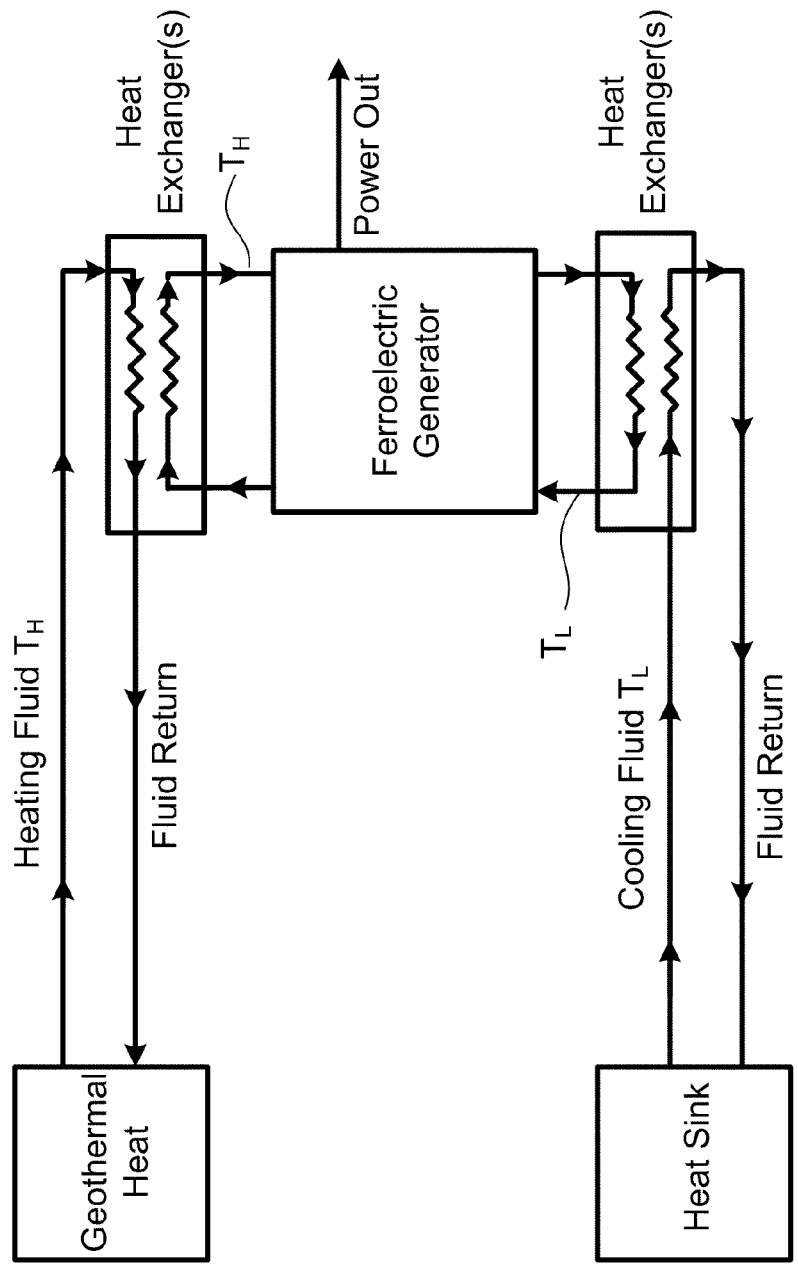
FIG. 30 is a schematic diagram that illustrates the overall apparatus whereby heat from a geothermal source is used, with one or more heat exchangers, to heat working fluids that are then used to provide heat to a ferroelectric generator; and a heat sink that removes heat from the ferroelectric generator through one or more heat exchangers.

As illustrated in FIG. 30, geothermal heat is recovered and transferred to one or more working fluids through one or more heat exchangers, and those working fluids are then used to provide heat to the ferroelectric generator in order to cycle the material as described herein so as to convert heat to electricity. As illustrated in FIG. 30, a heat sink is also coupled through one or more heat exchangers to the ferroelectric generator to remove heat rejected during cycling. The invention can be practiced with heat from geothermal sources of all kinds.

Terms such as "geo exchange" or "ground source heat" are sometimes used to distinguish lower temperature heat available between the ambient surface temperatures and near subsurface ground temperatures. Herein, the term "geothermal energy" may be used to refer either to thermal energy available from the earth in the broadest sense or to the narrower category of higher temperature, higher-quality heat that, typically, is available at greater depths. The meaning of the term will be apparent from context.

The availability of geothermal energy varies with location. In some places, there is no reasonably accessible geothermal heat. In others, there are robust sources of geothermal heat that may be accessed practically and cost effectively. World geothermal electrical generating capacity now exceeds 10,000 MW. All of the sites where such generation now occurs, and similar ones, provide sources of thermal energy with which the invention can be practiced. Furthermore, because of the greater efficiency of the invention compared to other power generating technologies, the available locations around the world that can be practically exploited as a source of geothermal heat to generate electricity are expanded beyond those locations that could be practical with existing technology. The total geothermal heat content in the earth's crust is largely concentrated in the 150° C. range. Significantly less geothermal heat is available at temperatures of 250° C. or greater, even at depths up to 10 km. Because the present invention can be used more effectively to generate electricity from lower temperature heat sources (≤150° C.) than can be done with existing technologies, the potential benefits of the invention are especially great.

The invention can be coupled to an existing geothermal generating facility to produce additional electricity from the waste heat at the power plant. In that implementation, the source of heat as depicted in FIG. 30 is the heat rejected from the power plant. The heat sink as depicted in FIG. 30 is the existing heat sink at the facility. More robustly, however, the invention can be used as the complete generator, rather than to bottom up waste heat as an adjunct to traditional geothermal power generating equipment. This full implementation is depicted in FIG. 30 wherein the source of heat for the ferroelectric generator, acting through one or more heat exchangers, would be the heat provided by the geothermal source.

In general, the invention can be practiced with any of the apparatuses and methods that extract geothermal heat, in combination with a heat sink. Apparatuses and methods for drilling and otherwise accessing and recovering heat from geothermal sources, including both existing enhanced geothermal systems and emerging drilling technologies, are well known to those skilled in the art, and all of them can be practiced in various embodiments with the invention.

Traditional geothermal resources are commonly divided into four categories: hydrothermal, geopressured, hot dry rock, and magma. Systems that spontaneously produce hot fluids are called hydrothermal or convection-dominated. Throughout most of the world, one or more of the necessary components of a hydrothermal reservoir is missing. In particular, the reservoir rock may be hot (≥200° C.), but produces insufficient fluid for commercial heat extraction either because of low formation permeability or the absence of naturally contained fluids. Such formations form a part of the geothermal resource referred to as hot dry rock (HDR), or enhanced geothermal systems. In principle, HDR systems are available everywhere in the world by drilling to depths sufficient to produce rock temperature useful for heat extraction. For electric power generation in low-grade, low-gradient regions (~20-40° C./km), depths of 4-8 km are required to reach temperatures >150° C. In high-grade, high gradient systems (~60° C./km), 2-5 km are sufficient to reach such temperatures. HDR resources have the potential to provide a high quantity of primary energy with a substantial resource base. For low permeability formations, the heat extraction approach is straightforward: drill a well to sufficient depth to reach a useful temperature, create large heat transfer surface areas by hydraulically fracturing the rock, and intercept the fracture with a second well. By circulating water from one well to the other through the fractured region, heat can be extracted from the rock. If rock of sufficient natural permeability exists in a confined geometry, techniques similar to waterflooding or steam-drive employed for oil recovery can be used, among others.

The current state of the art in geothermal drilling is largely that of oil and gas drilling, incorporating engineering approaches to problems that are associated with geothermal environments, such as temperature effects on instrumentation, thermal expansion of casing strings, drilling hardness, and lost circulation. This technology is well known to those skilled in the art. All of these technologies and drilling systems can be used with the invention where the geothermal source is geologically appropriate. Efforts are ongoing to advance drilling technologies beyond the current art, and such emerging drilling technologies will also be appropriate for use with the invention.

As noted, the invention can be practiced with lower-temperature geothermal energy sources that are also referred to as "geoexchange" or "ground source heat pumps." Depending on latitude, the top three meters of the earth's surface maintains a relatively constant temperature between approximately 10 and 16° C. Heat pumps are commonly used to exploit that thermal reservoir, for both heating and cooling, based on the temperature differentials between the sub-surface and above-ground ambient environment. The present invention can be practiced either in combination with such a heating/cooling system or independently, with the ferroelectric generator operating between a thermal reservoir at ambient temperature and the thermal reservoir in the ground. The direction of the heat flow in that configuration may vary during the time of the year, depending upon location, based on which thermal reservoir is at the higher temperature.

The apparatus and methods for heat exchanging between the subsurface and above-surface ambient environment is well known to those skilled in the art. The invention can be practiced with many of those technologies. The fundamental operation is reflected in the relationship depicted schematically in FIG. 30. As noted, whether the heat source is subsurface or above ground depends on the relative temperatures.

The Ocean as a Source of Thermal Energy.

It has long been recognized that electricity can be generated from the thermal gradients that exist in the ocean between deep colder water and shallow warmer water. Experimental and demonstration OTEC facilities have been built, but efficiency and cost limitations have prevented commercialization of OTEC to date. The present invention provides a more cost effective and efficient way of generating electric power from ocean thermal energy.

Figure 31:
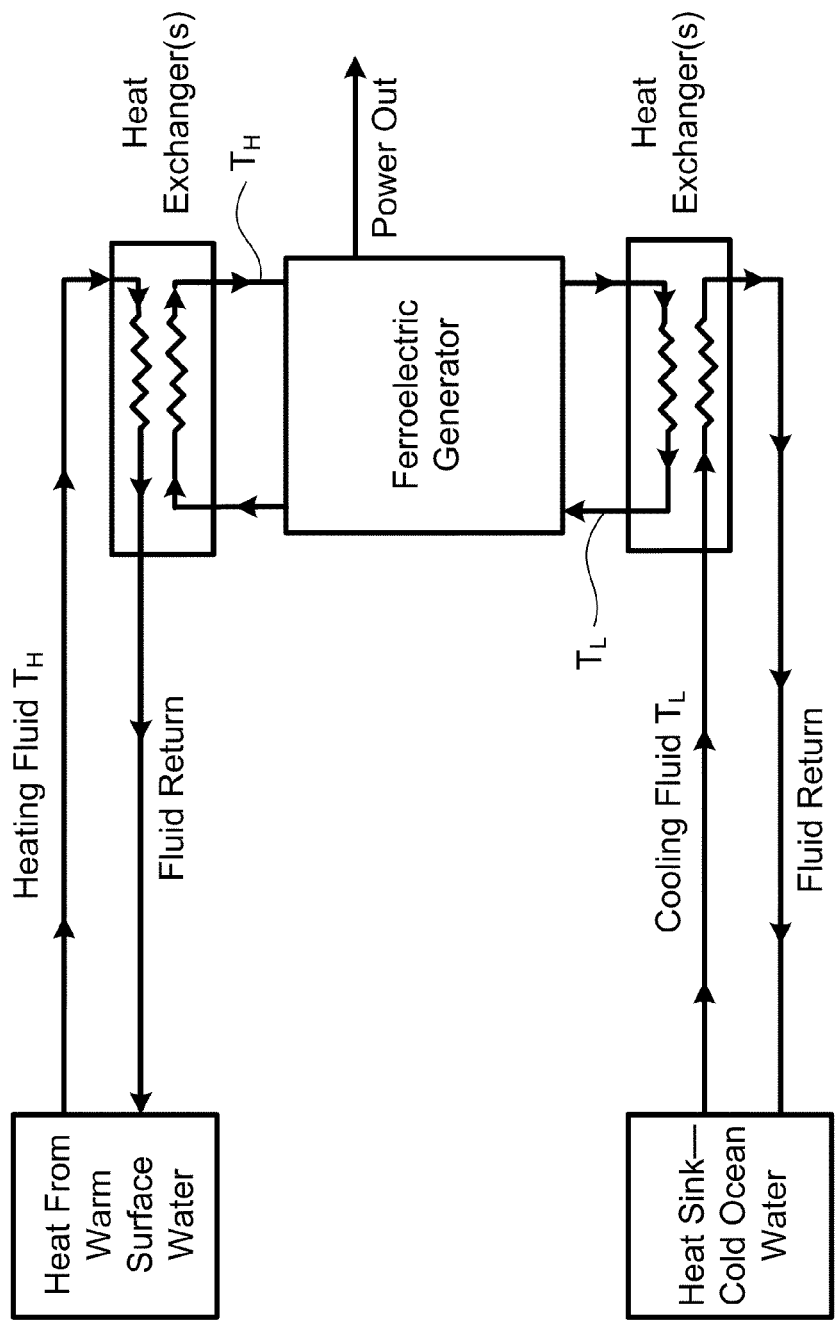
FIG. 31 is a schematic diagram that illustrates the overall apparatus whereby heat is received from warm ocean surface water; heat is then transferred therefrom to one or more working fluids through one or more heat exchangers; those working fluids are used to provide heat to a ferroelectric generator; and cold ocean water serves as the heat sink that cools one or more working fluids, through one or more heat exchangers, to remove heat from the ferroelectric generator.

As illustrated in FIG. 31, warm water is drawn from the ocean and heat therefrom is transferred to one or more working fluids through one or more heat exchangers. Those working fluids are then used to provide heat to the ferroelectric generator in order to cycle the material in accordance with a thermodynamic cycle, as described herein. As illustrated in FIG. 31, cold ocean water acts as a heat sink. That cold water removes heat from one or more working fluids, through one or more heat exchangers, and those working fluids are used to remove heat from the ferroelectric generator in accordance with a thermodynamic cycle, as described herein. The apparatuses and methods by which warm and cold ocean waters can be brought to a ferroelectric generating facility, and the heat exchanger system, are well known to those skilled in the art. The invention can be practiced with any such apparatus and method.

The greater the difference between the temperature of deep ocean water, $T_L$, and the temperature of warmer surface water, $T_H$—i.e., $\Delta T$—the greater the opportunity to convert the available thermal energy to electric power. Worldwide, ocean waters at a depth of about 1000 m are relatively consistent at a temperature $T_L \approx 4°$ C. to $5°$ C. Tropical surface waters are generally at a temperature $T_H \approx 22°$ C. to $29°$ C. The maximum possible efficiency for converting available thermal energy, where $\eta_c = \Delta T/T_H$, is ~8% for OTEC, ignoring the parasitic loss incurred in moving the required warm and cold water to the generating apparatus.

An OTEC system with a $\Delta T$ equal to at least $20°$ C. requires a $T_H$ of ~$25°$ C. Generally speaking, ocean waters between latitudes $20°$ N and $20°$ S are adequate for that purpose, though there are exceptions because of strong cold currents in some locations. Along the west coast of South America, for example, tropical coastal water temperatures remain below $20°$ C., and a similar situation prevails to a lesser extent for the west coast of Southern Africa. $T_H$ also varies throughout the year, sometimes exhibiting a significant seasonal drop due to upwelling of deeper water induced by the action of the wind. In addition to the value of $T_H$ for the warm water source, the accessibility of deep cold sea water is an important criterion for OTEC site selection.

OTEC plants can be constructed in various configurations that may be practiced with the invention. For example, OTEC facilities can be constructed on shore, on a floating plantship, or in apparatuses that are primarily or entirely submerged. The type of OTEC facility employed in a given instance is determined in part by the site. In the case of a floating plant, for example, cold sea water can be made accessible by the location of the facility, but the length of submarine power cables to transmit generated power to shore becomes a significant criterion. That consideration generally applies as well to submerged OTEC facilities.

Two principal approaches are well known for OTEC plants using traditional electric generating technologies—the closed cycle and the open cycle. In the former, sea water is used to vaporize and condense a working fluid, such as ammonia, which then drives a turbine-generator in a closed loop. In the open-cycle system, surface water is flash-evaporated into a vacuum chamber, and the resulting low pressure steam drives a turbine-generator. Cold sea water is used to condense the steam after it passes through the turbine. The present invention is similar to existing designs only in that the invention requires a source of cold deep ocean water at $T_L$ and a source of warm water at $T_H$. There is no similarity in the electric conversion apparatus.

The apparatus and methods by which cold deep ocean water at $T_L$ and warm surface water at $T_H$ can be brought to the OTEC facility for conversion to electrical power are well known to those skilled in the art and are described in the literature. Examples include U.S. Pat. No. 7,328,578 to Saucedo; U.S. Pat. No. 5,555,838 to Bergman; and U.S. Pat. No. 4,210,820 to Wittig, among others, and the referenced sources are incorporated herein.

In one embodiment, cold water is retrieved from a pump through a cold water pipe (CWP) to the conversion apparatus, in conjunction with one or more heat exchangers. Warm water is retrieved by pump and is also delivered to the ferroelectric apparatus in conjunction with one or more heat exchangers. In one embodiment, warm and cold water that exit the respective heat exchangers are mixed and discharged back to the ocean. It will be appreciated by those skilled in the art that there are many possible designs and configurations for the various pipes and pumps.

FIG. 31 illustrates the use of the warm water flow as the heating fluid at temperature $T_H$, and the cold water from the deep ocean as the cooling fluid at $T_L$, which are used to provide thermal energy to the ferroelectric generator and to remove heat rejected by the ferroelectric generator, in conjunction with heat exchangers and working fluids that are used to cycle the ferroelectric materials.

A significant and expensive part of an OTEC facility are the CWPs, which may be hundreds or thousands of meters in length. The proximal end of the CWP may be secured to an on-shore structure, a floating surface structure, or a submerged structure, and the distal end may extend to the necessary depth where water is ~$5°$ C. The diameter of the CWP generally must be relatively large in order to supply ample cold water to the facility and to minimize energy and pressure losses as cold water is pumped upwards. The CWP assembly may pass through ocean currents and be subject to current-induced drag forces, among others. While the CWP may be composed of many materials, the durability, strength, flexibility, buoyancy, and inert properties of high density polyethylene, make that one appropriate material. Mounting of the cold water pipe to floating structures requires particular consideration. The CWP for an OTEC plant will generally be subject to large stresses at the joint between the CWP and the platform on which the heat exchangers and generator are located. In one implementation, the CWP may be joined, by a vertical sliding, rolling device between the pipe and the floating structure, as described in U.S. Pat. No. 7,735,321 to Howard, which is incorporated herein.

By providing these examples and embodiments, there is no intent to limit the invention to these particular configurations. The invention can be practiced so long as deep cold ocean water and warmer ocean water are made available, through any hydraulic system, to the site at which the ferroelectric generator is located with appropriate heat exchangers. It is the intent of this invention to include and encompass all such hydraulic configurations and systems that would accomplish that end and provide warm and cold water to the ferroelectric generator for generating electrical power with the invention.

Ferroelectric Conversion of Heat to Electricity.

Referring to FIG. 1, a single-stage ferroelectric conversion device/apparatus 100 that utilizes the change in spontaneous polarization that occurs from temperature cycling to generate electric charges that are discharged to an external circuitry at high voltage is schematically shown according to one embodiment of the present invention. The apparatus 100 includes a ferroelectric layer 110 having a first surface 112 and an opposite, second surface 114. The ferroelectric layer 110 consists of a solid or liquid ferroelectric material that is characterized by a phase transition temperature at which the material undergoes a phase change from the ferroelectric phase to either the paraelectric or antiferroelectric phase and back again as the temperature change is reversed. The ferroelectric layer 110 may consist of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material or is negligible. The ferroelectric layer 110 may also consist of a ferroelectric material that undergoes phase transition from ferroelectric to paraelectric as the temperature of the ferroelectric material decreases below the transition temperature. The ferroelectric layer 110 may also consist of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material. Typically, the thickness of the ferroelectric layer 110 in one stage of the apparatus 100 is between about 0.01 mm and about 1 cm. Other values of the thickness can also be utilized to practice the invention. The ferroelectric layer 110 may be planar in shape or of any other shape, its configuration being limited only by manufacturing technology and operational considerations for the device.

The width and length of the ferroelectric layer 110 is determined by the nature of the ferroelectric material, the particular application, the characteristics and amount of heat available to be converted to electricity, the heat transfer mechanism, and other factors. There is no theoretical limit on the width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 1 with the heat source and heat sink. In such an application, the conductive leads from the electrodes may be joined to electrical buses, and the cumulative array would then act as a larger device having an area approximately equal to the total area of the individual devices, thereby permitting generation of electric power limited only by the quantity and character of the available thermal energy. One example of such an array is illustrated by FIG. 8.

A pair of electrodes 122 and 124 is respectively positioned on the first surface 112 and the second surface 114 of the ferroelectric layer 110. The electrodes 122 and 124 consist of a thermally and electrically conductive material. Such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated, but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110.

Additionally, the apparatus 100 includes means positioned in relation to the pair of electrodes 122 and 124 for alternately delivering 140 heat to and from the first surface 112 and the second surface 114 of the ferroelectric layer 110 so as to alternately cool the ferroelectric layer 110 at a first temperature $T_L$ that is lower than the transition temperature, and heat the ferroelectric layer 110 at a second temperature $T_H$ that is higher than the transition temperature, so that the ferroelectric material of the ferroelectric layer 110 thereby undergoes, with temperature cycling, alternating phase transitions between (1) the ferroelectric phase and (2) the paraelectric or antiferroelectric phase. In this exemplary embodiment, the delivering means comprises two heat exchangers 132 and 134 in fluid communication with a heat source and a heat sink (not shown) for inputting heat from the heat source to the ferroelectric layer 110 so as to heat the ferroelectric layer 110 at the second temperature $T_H$, and withdrawing heat from the ferroelectric layer 110 to the heat sink so as to cool the ferroelectric layer 110 at the first temperature $T_L$. This absorption and rejection of thermal energy is integral to satisfying the Second Law of Thermodynamics, which permits conversion of thermal energy to another form of energy, or to work, only through a process of heat absorption and heat rejection.

The apparatus 100 also has a pair of electric leads 152 and 154 electrically connected to the pair of electrodes 122 and 124, respectively. In various embodiments, the leads may be configured to one or more external loads, to an external DC source, or configured to create an open circuit, or a switch can permit switching between one or more such configurations by a control circuit acting in accordance with one of the electrical-thermodynamic cycles that can be used with the invention. Poling the domains of the ferroelectric material enables a very large overall net spontaneous polarization to develop in the ferroelectric layer as it transitions from a metastable state to a stable ferroelectric state. That overall net spontaneous polarization in turn induces very dense electrically-opposite screening charges respectively on the pair of electrodes 122 and 124. In some embodiments, the poling field may be provided by an external DC voltage applied during each cycle, as for example in U.S. patent application Ser. No. 12/465,924. In other embodiments, the poling field is established by a residual charge on the electrodes that remains after the electrical discharge step of the cycle, as for example, in U.S. patent application Ser. No. 13/228,051. While an external DC voltage is not required during cycling when poling is achieved by a field produced by residual charges on the electrodes, a DC voltage source should still be available to establish a poling field for the initial cycle and in the event the residual charge diminishes during operation below what is required for poling.

In one embodiment, as for example in U.S. patent application Ser. No. 13/226,799, the circuit is opened while the ferroelectric material of the ferroelectric layer 110 is heated to temperature $T_H$ through the addition of heat to the lattice, while total polarization remains constant at $P_H$ because the circuit is open so as to prevent discharge of the charges on the electrodes. The circuit is then closed while heat is added to the ferroelectric layer isothermally, causing the electrically-opposite screening charges to discharge to the pair of electric leads 152 and 154 at a very high voltage. The pair of electric leads 152 and 154 permits the conduction of the discharge current from the electrodes to whatever external load may be used or to busses to collect and distribute the electricity generated by multiple devices. When poling is achieved by a field resulting from the residual unscreened charges on the electrodes, an external applied voltage is not needed between the pair of electric leads 152 and 154, other than during the first cycle and for incidental use in subsequent operation, as described herein.

Figure 20:
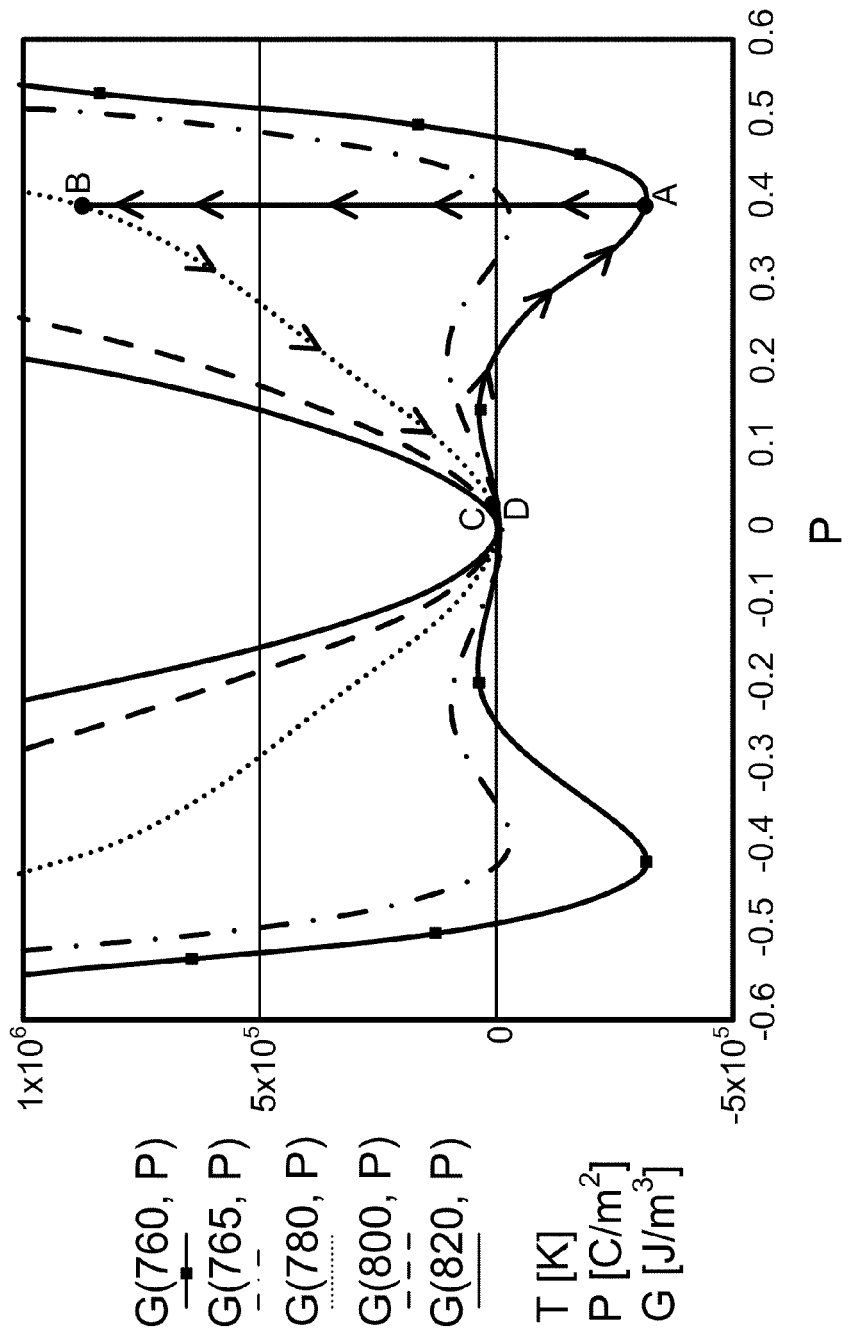
FIG. 20 is a plot of free energy for various temperature values as a function of polarization. Superimposed on the plot are the steps of one thermodynamic cycle that can be used with the present invention. Polarization is a full thermodynamic variable, and it represents the full polar system described by G(T, P).
Figure 21:
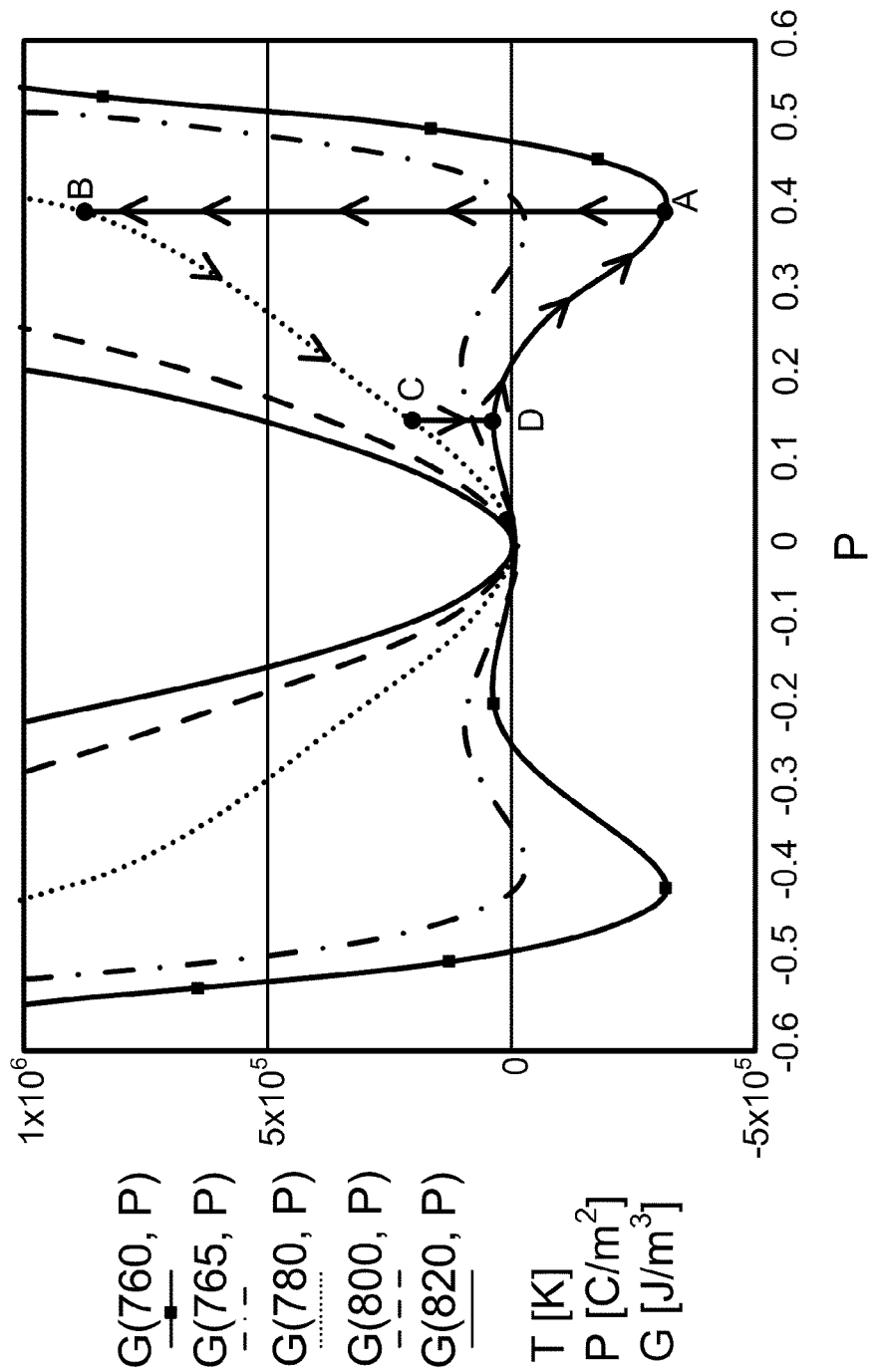
FIG. 21 is a plot of free energy for various temperature values as a function of polarization. Superimposed on the plot are the steps of a thermodynamic cycle that can be used with the invention. This cycle provides for poling by an internally generated poling field. During the electrical discharge step of the cycle, BC, sufficient charge is retained to pole during the next cycle. The value of $P_L$ is determined by the value of P that occurs at the local free energy maximum for the cycle.

When poling is achieved using residual charges on the electrodes 122 and 124, a current will flow during that step between the electrodes in response to the change in net spontaneous polarization that occurs in the ferroelectric layer. That current can be exploited as an additional source of electrical energy output to the external load. This energy output during relaxation of the system from a metastable to a stable state is depicted by the downhill relaxation between points D and A in the free energy plot of the $T_L$ isotherm shown in FIG. 21. This occurs at $T_L$ as $Q_L$ is being removed from the ferroelectric layer. In one embodiment, the direction of the current during the DA portion of the cycle can be made to coincide with the direction of the current during the primary discharge (step BC as depicted in FIGS. 20 and 21 and described elsewhere) by causing the current during the DA step to pass through a full-wave rectifier (not shown) that is included in the circuit when the switch S1 is in position B in FIG. 6. Such a rectifier may, for example, be a bridge circuit. The rectifier causes current flows to and from the electrodes 822 and 824 to have the same direction at the load RL whether the current occurs during the BC or DA steps of the cycle.

Figure 2:
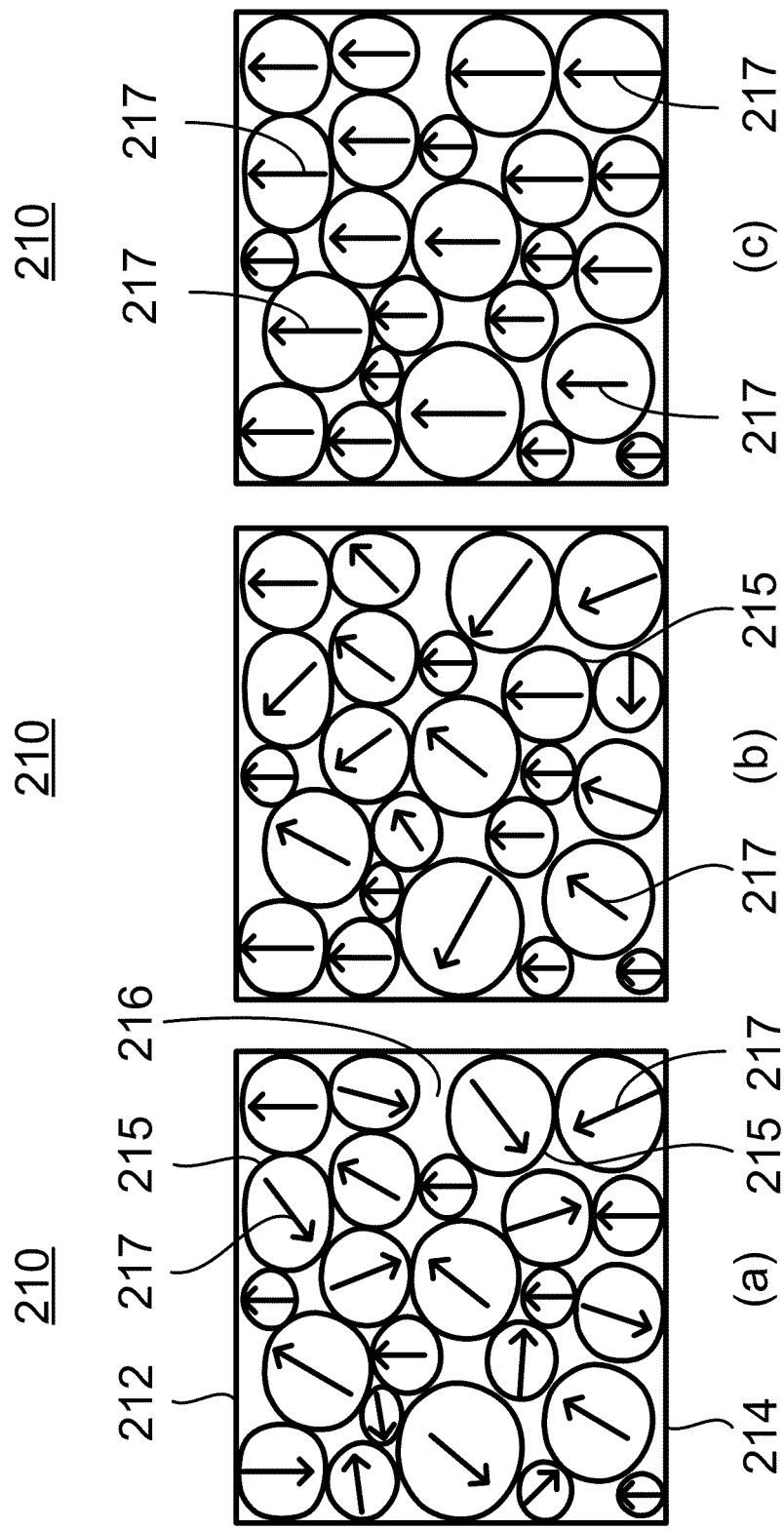
FIG. 2 illustrates schematically the alignment of the domains in a ferroelectric where (a) illustrates unpoled, random orientation, with each domain consisting of a large number of electric dipoles that would be similarly oriented within that individual domain; (b) illustrates a substantially poled material where the dipoles are oriented in the same overall direction; and (c) illustrates an ideal, completely poled ferroelectric that is generally attained only under special-conditions pertaining to the atomic and molecular structure of the material.

FIG. 2 shows schematically the alignment of the domains 215 in a ferroelectric 210 in the ferroelectric phase, i.e., the temperature of the ferroelectric 210 is lower than the Curie temperature $T_c$ of the ferroelectric 210. The ferroelectric 210 has a first surface 212 and an opposite, second surface 214 defining a ferroelectric layer body 216 there between. The ferroelectric layer body 216 is characterized with a plurality of domains 215 having a large number of polarizable units. As shown in FIG. 2(a), each domain 215 is characterized by a spontaneous polarization indicated by a dipole arrow 217, but randomly orientated so that there is no overall net spontaneous polarization in the ferroelectric 210. FIG. 2(b) shows the dipoles 217 aligned towards the same overall direction, so that a very powerful net spontaneous polarization exists in the ferroelectric 210. Such alignment can be achieved by applying a poling field to the ferroelectric layer body 216. FIG. 2(c) illustrates an ideally aligned ferroelectric that generally is attained only under special conditions pertaining to the crystal or molecular structure of the material.

The electrical energy that can be extracted by exploiting changes in spontaneous polarization during thermal cycling of a given ferroelectric can be calculated from the Landau phenomenological model of material systems in and around phase change. Such modeling is a more comprehensive thermodynamic representation of the system than traditional quasi-static thermodynamic analysis. The latter is effectively restricted to equilibrium conditions, whereas Landau modeling is a broader dynamic representation that includes non-equilibrium conditions, such as relaxation from a metastable state towards a more stable state pursuant to the Landau-Khalatnikov equation. For ordinary ferroelectrics, the Landau-Ginzburg-Devonshire free energy functional expresses the free energy of a ferroelectric material system in terms of the independent parameters temperature, T, and the order parameter, P, which represents the total polarization produced by the dipoles in the system, both spontaneous and induced if there is an electric field. An electric field may be due to the application of an extrinsic potential across the electrodes or it may be due to the unscreened charges on the electrodes. The Landau-Ginzburg-Devonshire free energy functional is expressed as:

$$G(T,P)=\alpha_1(T) \cdot P^2+\alpha_{11} \cdot P^4+\alpha_{111} \cdot P^6$$

where G is the free energy functional. G is in units of $J/m^3$, and P is in units of $C/m^2$. Polarization is a full thermodynamic variable, and it represents the full polar system described by G(T, P). The $\alpha$ parameters are specific to a given material system, and for those given parameters, the Landau-Ginzburg-Devonshire free energy functional provides the full information for the thermal cycles of a ferroelectric material system through and around phase transition, and for polarizable polymer systems through and around their depolarization transitions.

Figure 16:
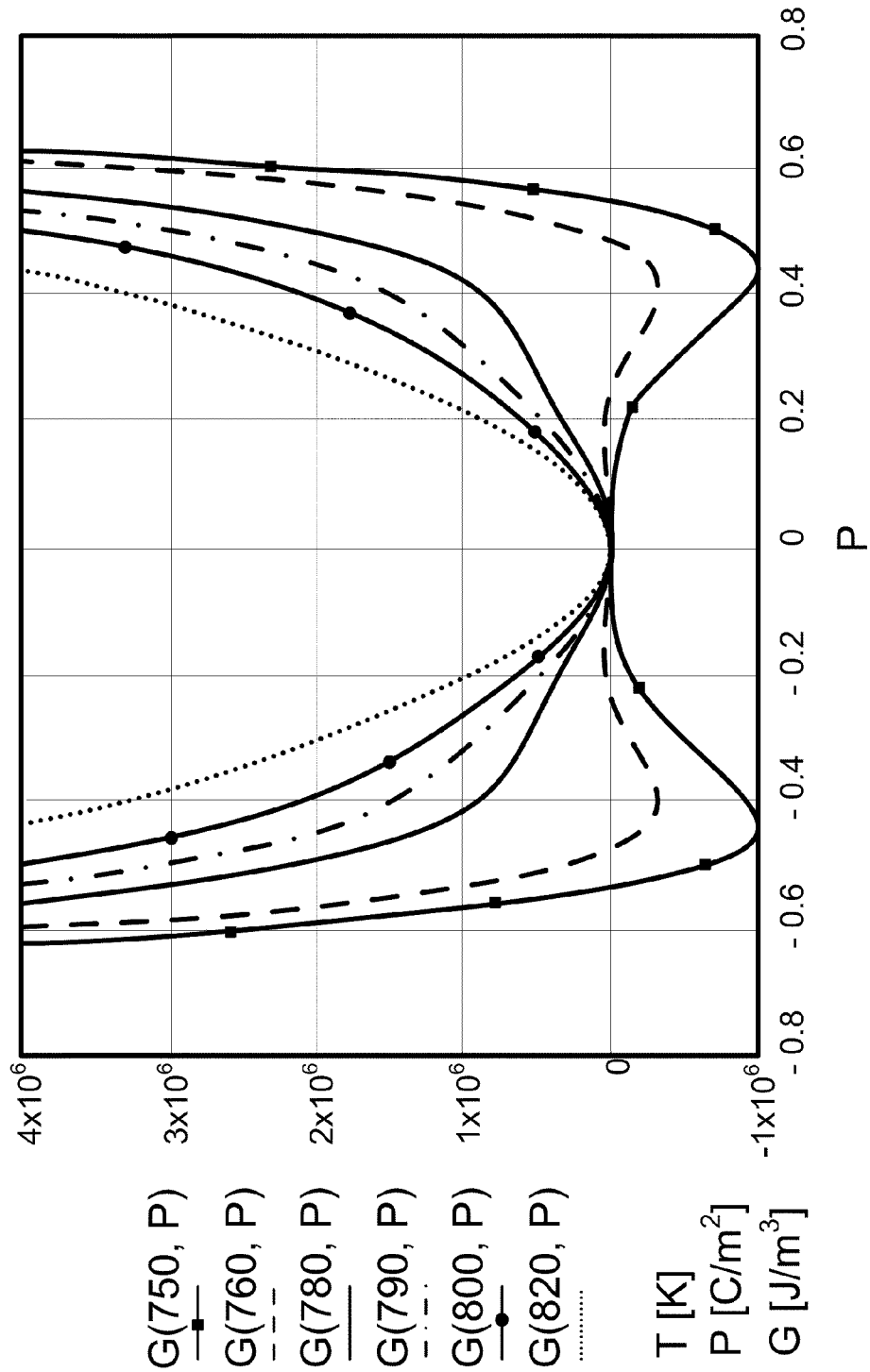
FIG. 16 is a plot of the free energy functional in terms of temperature, T, and polarization, P, using parameters for a sample of lead titanate, $PbTiO_3$. G is the Gibbs free energy. Temperature is measured in Kelvin; polarization in $C/m^2$; and the free energy, G, in $J/m^3$. Polarization is a full thermodynamic variable, and it represents the full polar system described by G(T, P).

FIG. 16 is an example of plots of the free energy functional in terms of temperature, T, and polarization, P, with the material parameters representative of a sample of lead titanate, $PbTiO_3$, with $T_c \cong 766K$. The individual plots are for various temperatures of the material. The free energy value, G, is measured in $J/m^3$. G is assigned the value of 0 when the material is in a nonpolar state (i.e., where P=0). The free energy, G, is then plotted as calculated from the Landau-Ginzburg-Devonshire functional for various temperature values from 750K to 820K. For temperatures above the transition temperature, the free energy is never below the reference value assigned for the material in the paraelectric state. The global minima in the various plots represent equilibrium states.

Where a material is in its ferroelectric phase, the system will have two free energy minima, one at each of the low points of the two wells. Each of those equilibrium points is equally likely in the absence of a field, and the decrease in free energy is the same in both wells because the material system is symmetrical. By poling the dipoles as the material system enters the ferroelectric phase, the system is biased so that the system will drop down into the particular well that corresponds to the poled orientation. Poling does not materially affect the free energy of the system.

Figure 17:
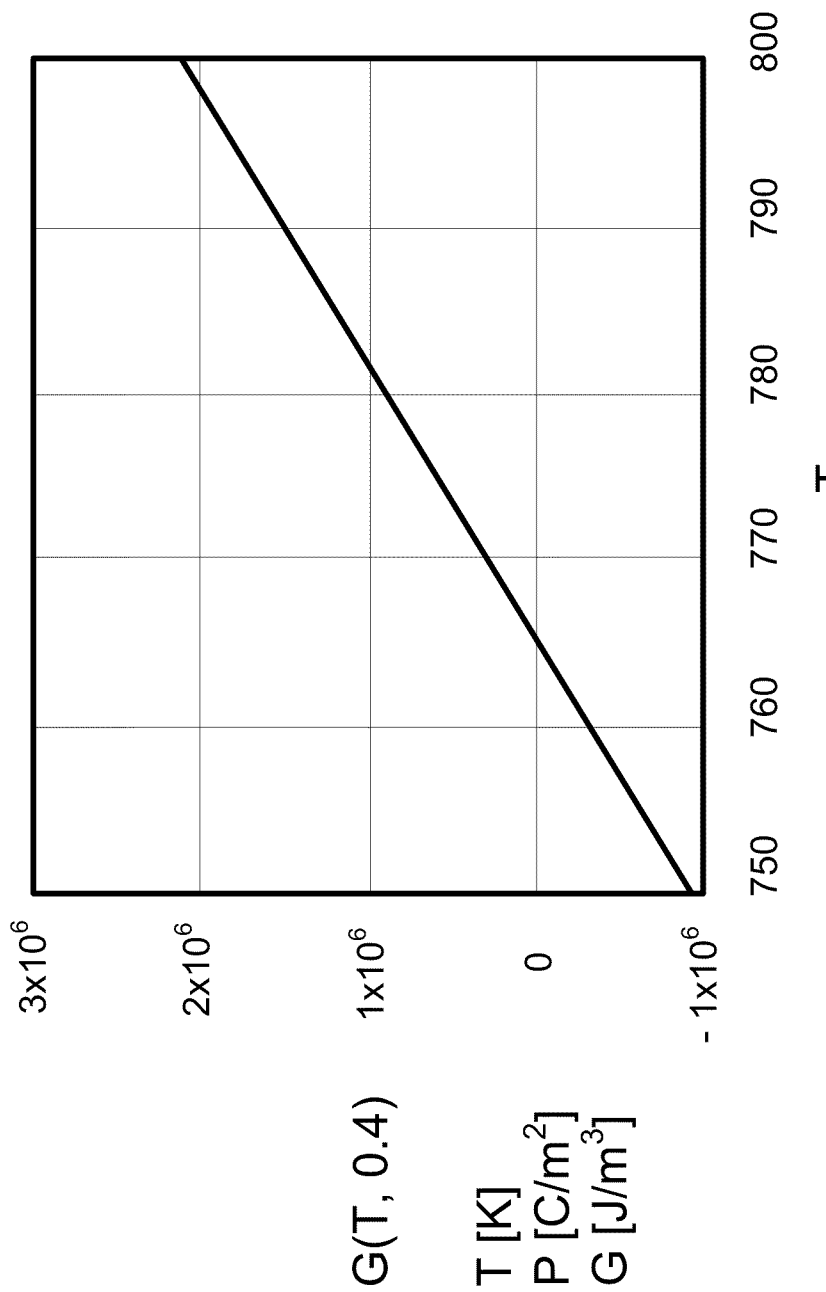
FIG. 17 is a plot of free energy as a function of temperature for a sample of lead titanate, $PbTiO_3$. Polarization is constant at $P=0.4$ $C/m^2$.

FIG. 17 is a plot of free energy as a function of temperature where polarization is held constant at 0.4 $C/m^2$. Again, the parameters used in plotting the free energy functional are those characteristic of a sample of lead titanate with $T_c \cong 766K$. This linear relationship between free energy and temperature can be a consideration in determining the appropriate thermodynamic cycling of the ferroelectric material used in the invention. FIG. 17 indicates that it may be desirable in some instances to cycle the ferroelectric over a wide temperature range since the change in free energy increases as the temperature range of the cycle increases. Ideally, this can be performed as a perfect Carnot engine providing the highest possible efficiency. The thermal efficiency realized by cycling over the wider temperature range may decrease, however, because of increased lattice heat contribution for the wider temperature cycling if a perfect regeneration cannot be performed. It should also be recognized that the accuracy of the Landau-Ginzburg-Devonshire model generally decreases as temperature departs farther from the phase change temperature, so the linear relationship may not be as accurate over large temperature ranges.

Figure 18:
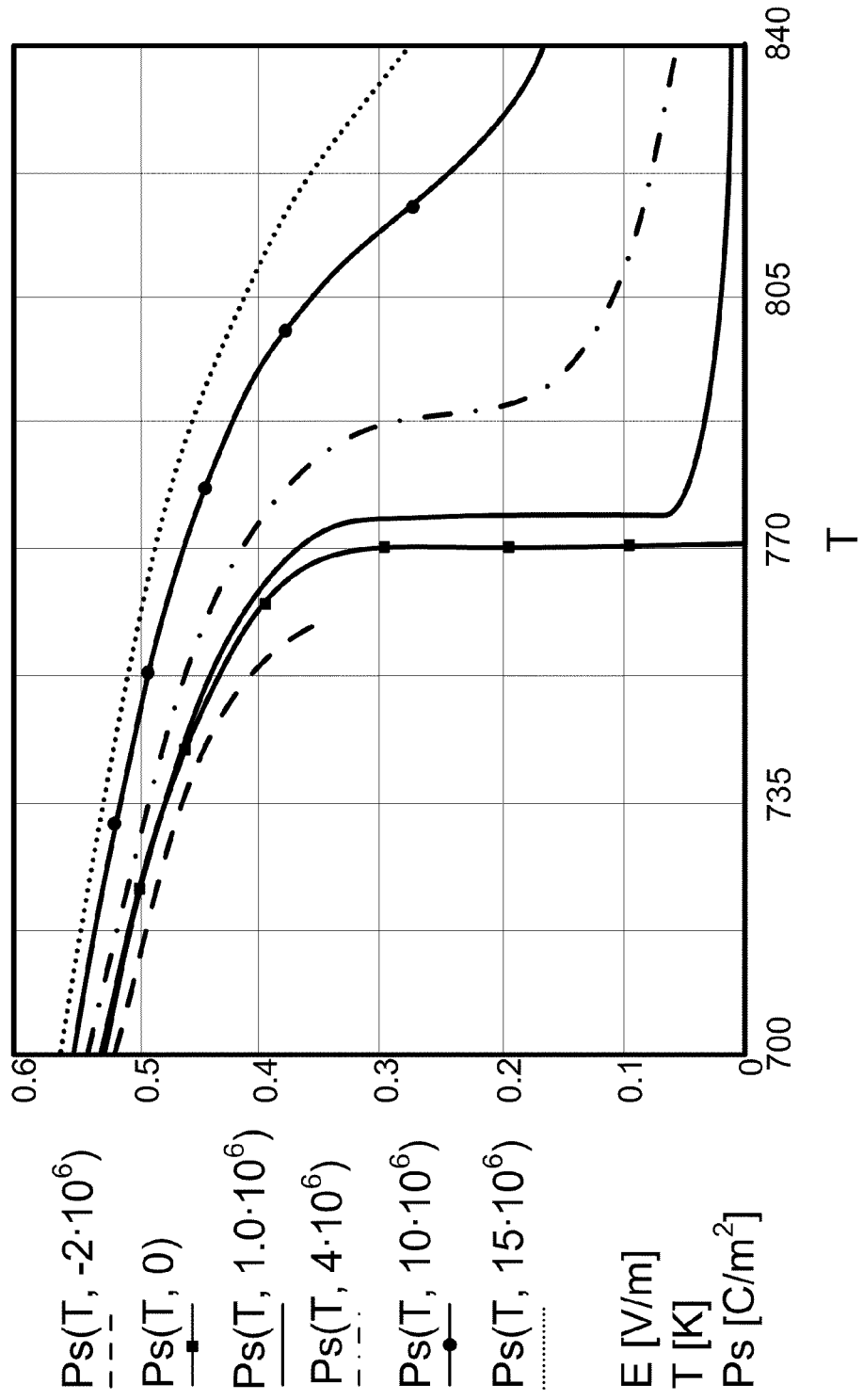
FIG. 18 is a plot of polarization at various electric field values, E. Temperature is measured in Kelvin, and the E field value is in volts per meter.

FIG. 18 presents plots of spontaneous polarization versus temperature for various electric field values for the same lead titanate parameters. The relationship between E; free energy, G; P; and T, is derived from the free energy functional and can be expressed as:

$$E=\partial G/\partial P=2\alpha_1(T)P+4\alpha_{11}P^3+6\alpha_{111}P^5.$$

With the present invention, the E values represent the field generated by the unscreened charges on the electrodes. The electric field value E can also include a small poling field applied from a DC voltage source in the event an external poling field is applied.

Figure 19:
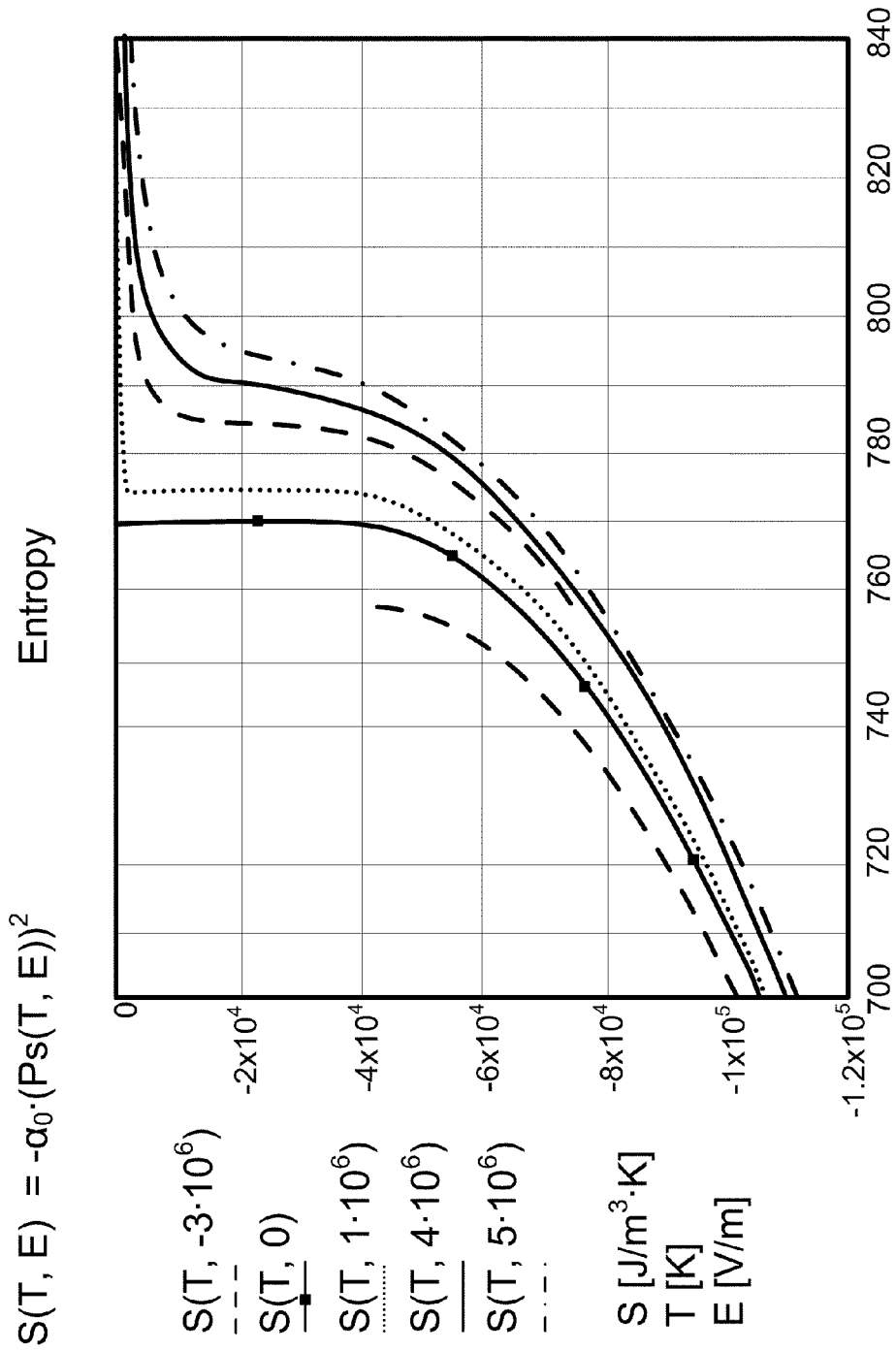
FIG. 19 is a plot of entropy for a sample of lead titanate, $PbTiO_3$, as a function of temperature for various E field values. Temperature is measured in K, and entropy is measured in units of $J/m^3 \cdot K$.

FIG. 19 is a plot of entropy, S, as a function of temperature for various E values where the parameter E is measured in volts per meter. Entropy is proportional to $P^2$, and $$S=-\alpha_0 \cdot [P_S(T,E)]^2$$

where entropy is measured in J/(m³·K). The parameter $\alpha_0$ is related to the material parameters by the expression $$\alpha_1 = \alpha_0(T - T_0),$$

where $T_0$ is the Curie-Weiss temperature, which is the phase transition temperature for materials that have second order phase transitions, but has a different value for first order transition materials.

Figure 22:
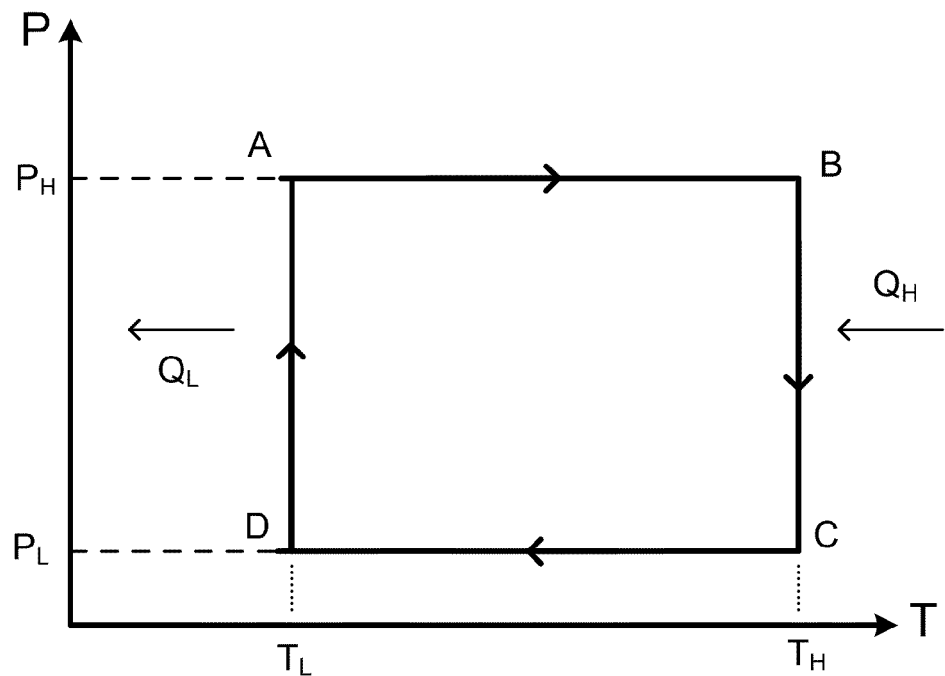
FIG. 22 is an illustration of a thermodynamic cycle of a ferroelectric wherein two steps are isothermal and two are iso-polarization. $Q_L$ and $Q_H$ indicate the removal and addition of heat, respectively, during the isothermal steps.

The invention can be practiced pursuant to various thermodynamic-electrical cycles, and the examples of cycles herein is illustrative only and in no way limits the scope and meaning of the invention. An example of one such thermodynamic cycle that can be used with the present invention is depicted in FIG. 22 in an ideal form. It has two isothermal steps, BC and DA, and two steps where polarization is held constant, AB and CD. The specific operation of this cycle is described in more detail herein.

In some thermodynamic cycles, the discharge of the electrodes to an external load during the course of the cycle may be complete or nearly complete. With other cycles, the discharge of the electrodes is not complete. Instead, a small unscreened residual charge is left remaining on the electrodes before discharge is complete, and that residual charge serves to pole the material during the next cycle. Other than as necessary to provide a poling field, it is generally desirable to allow for removal of the charges from the electrodes so as to maximize the amount of electrical energy withdrawn during that step of the cycle. The amount of the residual charge left remaining, corresponding to $P_L$, that is sufficient to establish a field to pole the spontaneous electric dipoles during transition into the ferroelectric phase will depend on the material system, the configuration of the ferroelectric layer, and other factors. The impedances of the system and the load must be matched so that the depolarization field does not exceed the coercive field at any time after the external poling field is turned off. The value of $P_L$ is determined by the value of P that occurs at the local free energy maximum for the cycle. In one embodiment using an exemplary cycle described herein, that local free energy maximum is depicted as point D on the free energy isotherm in FIG. 21. By way of example, for a ferroelectric sample of $PbTiO_3$, $P_L \cong 0.15$ C/m² generally creates an adequate poling field, as indicated in FIG. 21. The invention can also be practiced by letting $P_L$ go to zero, with subsequent poling performed by applying an external field during the DA step of the cycle.

Starting at an arbitrary point C of the specific cycle illustrated by FIG. 22, the material is at a relatively high temperature, $T_H$, and in a paraelectric or antiferroelectric phase. In one embodiment, the electrodes on the surfaces of the ferroelectric have discharged at point C so that only enough residual charge remains on the electrodes to provide a field sufficient to pole the ferroelectric when it is cycled back into its ferroelectric phase. Then, during the CD step of the cycle, the ferroelectric is cooled to a relatively low temperature, $T_L$, while the electrical circuit is open so that total polarization remains constant at the minimum value, $P_L$. The heat withdrawn during the CD step corresponds to the sensible lattice heat to cool the material. During step CD, the ferroelectric material goes from point C to a metastable state at point D.

The circuit is closed at point D of the cycle. During the DA step, heat $Q_L$ is withdrawn isothermally while the ferroelectric is at $T_L$ until the spontaneous polarization attains the maximum value, $P_H$. That value of $P_H$ may be as great as is permitted by the particular ferroelectric material system without causing electrical breakdown or significant electrical leakage through the ferroelectric layer. All other things being equal, attaining high $P_H$ values will generally correspond to larger output of electrical energy in each cycle. $P_H$ will vary depending upon the ferroelectric material system, the configuration of the ferroelectric layer and other factors. In the illustrative case of a lead titanate sample, $P_H$ may have a value of 0.4 C/m² as shown in FIGS. 20 and 21.

During the DA step, the electrical circuit is closed and a current flows from the electrode on one side of the ferroelectric to the electrode on the opposite side of the ferroelectric until screening charges develop that equal the opposing bound charges on the surfaces of the ferroelectric. Also during the DA step of the cycle, the small residual field resulting from the unscreened charges on the electrodes at point D causes the resulting dipoles to be oriented towards one direction—i.e., they are poled. In another embodiment, the poling field can be the result of an externally applied potential. The heat $Q_L$ withdrawn during the DA step corresponds to the latent heat of the phase transition. During the DA step, the material system relaxes from a metastable state at point D to a stable state at point A, as shown in FIGS. 21 and 22.

During the DA step, electric energy is generated in those embodiments where poling is done other than by an externally applied voltage. The energy so generated during step DA can be discharged into external circuitry to perform electrical work. In one embodiment, a full-wave rectifier can be utilized to rectify the current flows to and from the electrodes 822 and 824 to have the same direction at the load whether the current occurs during the BC or DA steps of the cycle. Such a full-wave rectifier may consist, for example, of a bridge circuit. As noted elsewhere, poling may also be achieved by applying an external field from a DC voltage source across the electrodes on the surfaces on the ferroelectric layer. On those occasions, electrical work is performed on the system rather than generated by the system during step DA.

In the next step of the cycle, AB, the circuit is open and the ferroelectric is heated to $T_H$ above the material transition temperature at constant polarization. At point B of the cycle, the ferroelectric is in a metastable state, and the circuit is then closed. During the BC step of the cycle, heat is input isothermally as polarization is reduced to $P_L$ and the ferroelectric relaxes from the metastable state at point B towards point C. The heat $Q_H$ added during the BC step is equal to the enthalpy change that corresponds to the change in polarization. During that step, screened charges on the electrodes become unscreened and are discharged into external circuitry to perform electrical work, total polarization at point C being reduced to $P_L$ at which point the circuit is opened to prevent further discharge.

The transitions of the material system from a stable state to a metastable state or vice versa during the several steps of the cycle are described by Landau-Khalatnikov time dependent phase transition theory, which can be used to match the response time of the load to the transition time from the metastable state.

$T_H$ and $T_L$ are above and below the transition temperature, respectively, so as to allow for phase change. Depending upon characteristics of the material, such as the homogeneity of the crystal structure, for example, $T_H$ and $T_L$ may differ from the transition temperature by a few degrees centigrade or less. $T_H$ and $T_L$ may also differ from the transition temperature by a substantial amount, for example, by 20 degrees centigrade or more. In another implementation $T_H$ and $T_L$ can both be below the transition temperature, if the material is cycled between a greater polarization value and a lesser polarization value.

It will be recognized by persons skilled in the art that the cycle illustrated in FIG. 22 depicts a cycle performing in an ideal fashion. In practice, there generally may be deviations from ideal or perfect isothermal or constant polarization steps of the cycle and deviations from perfect cycling between $P_H$ and $P_L$. It should be recognized that the invention will generally be practiced such that the actual cycling and actual poling may depart to some degree from the ideal.

In some embodiments of the invention the ferroelectric phase occurs at a temperature higher than the transition temperature, and the paraelectric phase, or antiferroelectric phase, occurs below the transition temperature. In such embodiments, the cycle depicted in FIG. 22 operates the same except in the opposite direction. The four steps are DC, CB, BA, and AD. Steps DC and BA occur at constant polarization, $P_L$ and $P_H$, respectively. Only lattice heat is input and withdrawn, respectively, during steps DC and BA. Heat $Q_H$ is input isothermally during step CB, and heat $Q_L$ is withdrawn isothermally during step AD. During step CB, the electrical circuit is closed; poling with a DC voltage or an internally generated field occurs; and a current flows from the electrode on one side of the ferroelectric to the electrode on the opposite side until screening charges develop that equal the opposing bound charges on the surfaces of the ferroelectric. The electrical circuit is closed and electricity is discharged to a load during step AD.

The robustness of a particular thermodynamic cycle can be evaluated using values calculated from the free energy functional. FIGS. 20 and 21, like FIG. 16, are examples of plots of the free energy functional in terms of temperature, T, and polarization, P, with the material parameters representative of a sample of lead titanate, $PbTiO_3$, where $T_c \cong 766K$. The individual plots are for various temperatures of the material. FIG. 20 includes designations of the points of the cycle (A, B, C and D) depicted in FIG. 22 with two isothermal steps and two steps where polarization is constant. In FIG. 20, $P_L$ is reduced to a negligible level or zero during the course of the cycle. FIG. 21 is a similar plot of free energy for the cycle depicted in FIG. 22 with the points of the cycle designated thereon, but $P_L$ is not allowed to go to zero. Instead, during the electrical discharge step of the cycle, BC, sufficient charge is retained to pole during the next cycle. The value of $P_L$ is determined by the value of P that occurs at the local free energy maximum for the cycle, as shown on FIG. 21. The values for T and P in FIGS. 17, 20, and 21 are illustrative only and are not intended to suggest that they are ideal or unique.

Figure 23:
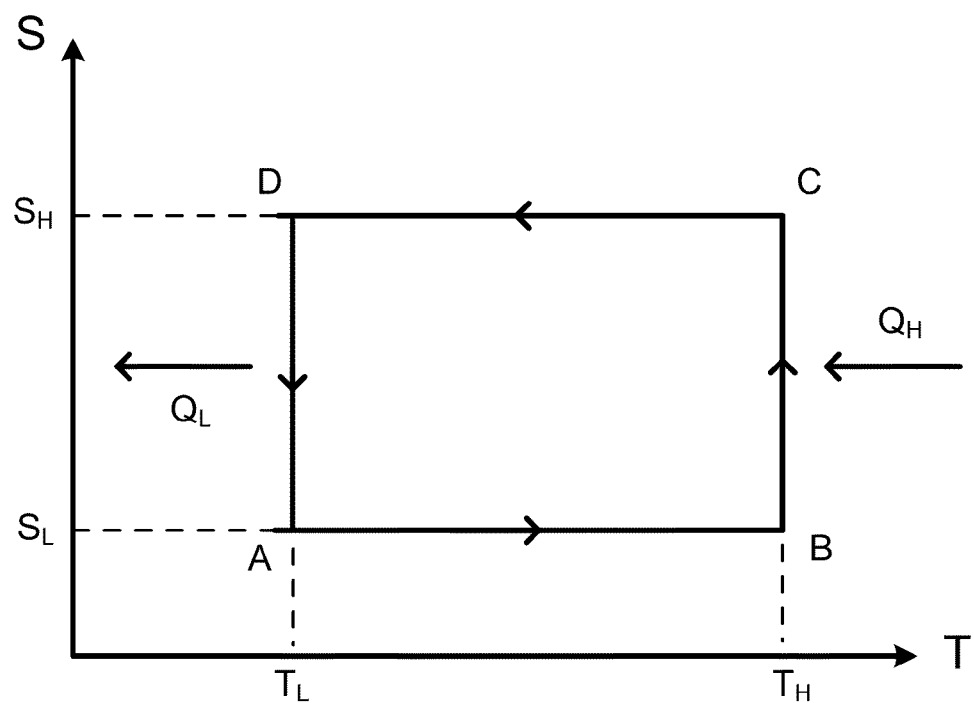
FIG. 23 illustrates entropy as a function of temperature for the cycle depicted in FIG. 22. Only the polarization contribution to free energy is considered. Other degrees of freedom, such as lattice heat and polymer backbones, are disregarded.

FIG. 23 illustrates entropy as a function of temperature for the cycle depicted in FIG. 22. Only the polarization contribution to free energy is considered. Other possible degrees of freedom that could contribute to entropy changes, such as lattice heat and polymer backbones, are disregarded in the illustration. Where those other factors are negligible, the cycle is isentropic even in the absence of regeneration during steps AB and CD.

Figure 24:
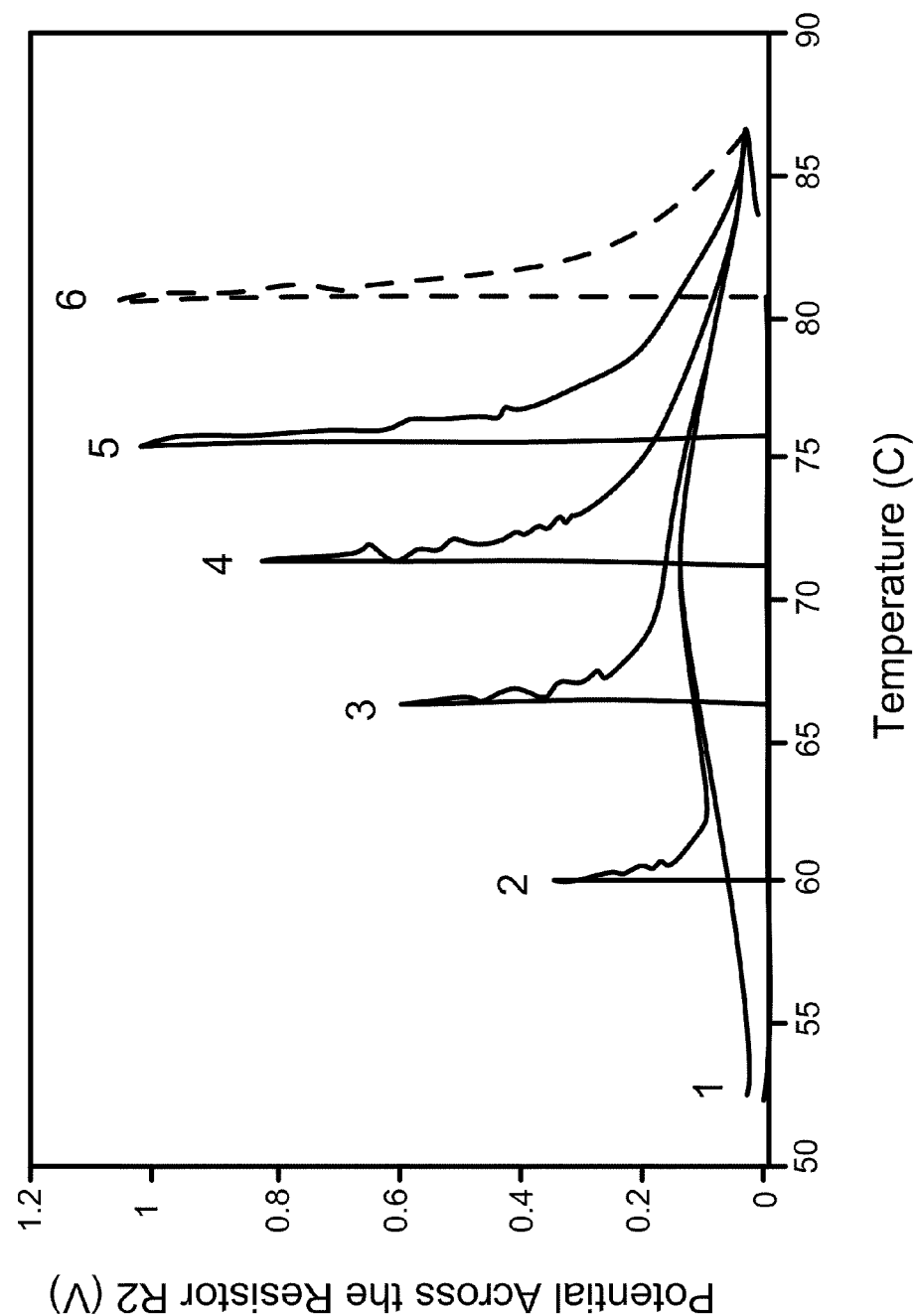
FIG. 24 shows the measured electric current generation during the heating phases, resulting from changes in the permanent polarization that correspond to different relay turn-on temperatures for a P(VDF-TrFE) copolymer film of 50 μm thickness.

FIG. 24 shows the measured electric current generated during the heating phases resulting from the change in permanent polarization that correspond to different relay turn-on temperatures for a P(VDF-TrFE) copolymer film of 50 μm thickness. The load resistor RL had a resistance of 10 MΩ, and the measure resistors R1 and R2 were chosen at 0 and 22 kgΩ, respectively. The horizontal axis has been largely expanded due to the somewhat broad transition of the copolymer, which makes the original peak (line 1) look flat. Lines 2-6 in FIG. 24 show the electricity generated with increasing delay temperature (time). These lines correspond to the AB step in the thermodynamic cycle shown in FIG. 22. The electric potential (field) generated across the sample dramatically increases with larger delay temperatures, reaching about 10 times the potential attained with the original peak of line 1. The increasing potential with larger delay temperature corresponds to the enlargement of the rectangular cycle along the temperature axis at constant polarization (AB step). Thermodynamically, this leads to a larger efficiency. The integrated intensities remain largely constant, as expected.

Figure 3:
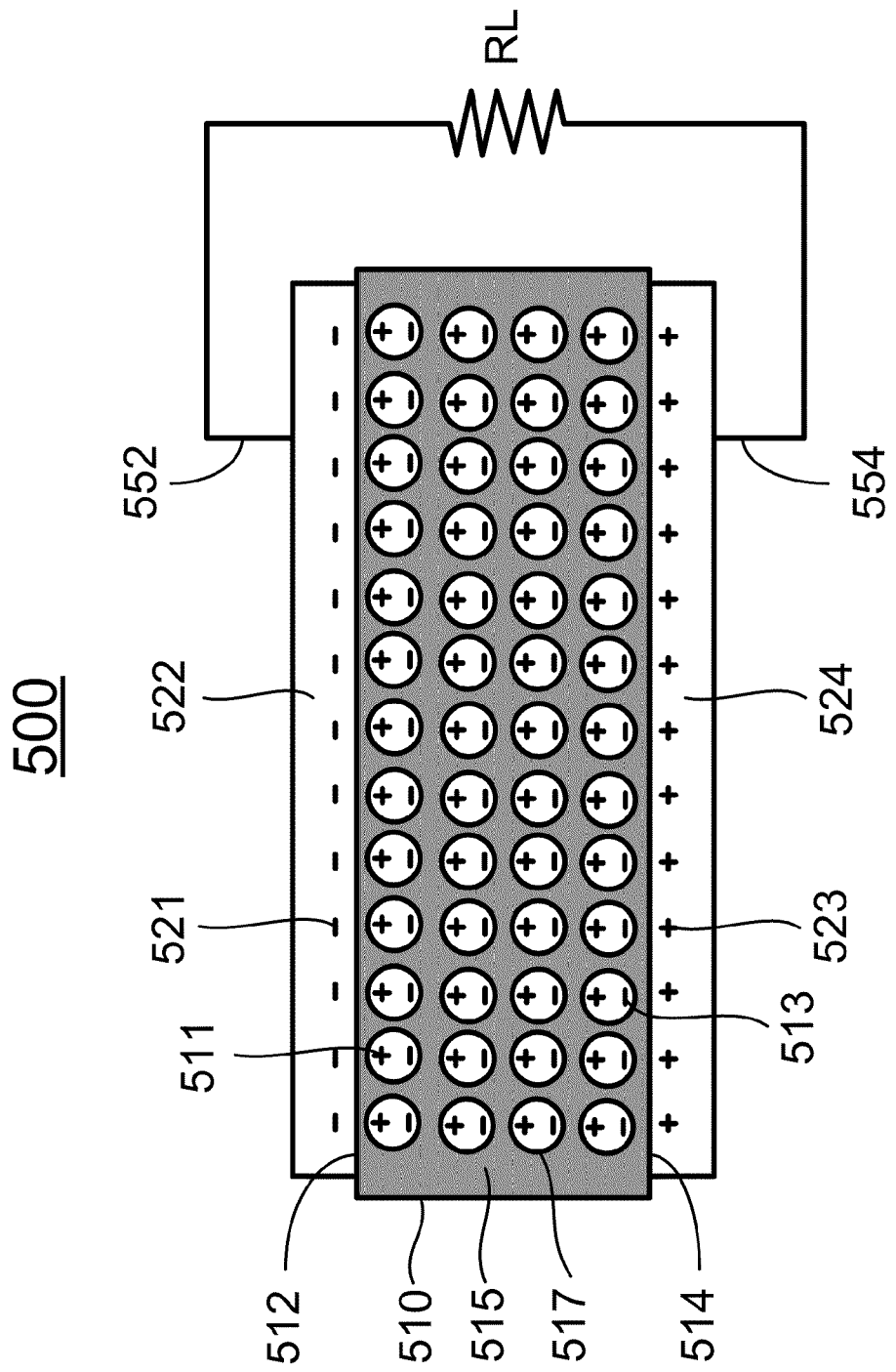
FIG. 3 illustrates schematically bound charges on the surfaces of a ferroelectric structure/layer and the opposing screening charges that are induced on the adjacent surfaces of the electrodes when there is substantial net spontaneous polarization, $P_s$, which may be denoted as $P_r$ in the absence of an external field.

FIG. 3 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and $P_s$, while the screening charges 521 and 523 on the electrodes 522 and 524 result, in turn, from the bound charges 511 and 513, and are in opposition to those bound charges 511 and 513.

As the ferroelectric goes through phase transition and becomes paraelectric or antiferroelectric, the spontaneous polarization in the ferroelectric layer 510 disappears. As a result, the screening charges 521 and 523 on the electrodes 522 and 524 become unscreened at an extremely high potential difference between the electrodes 522 and 524. The exact potential difference will depend upon the particular ferroelectric and the configuration of the module, but potentials in excess of 30,000 volts may be attained with appropriate materials before dielectric breakdown.

Figure 4:
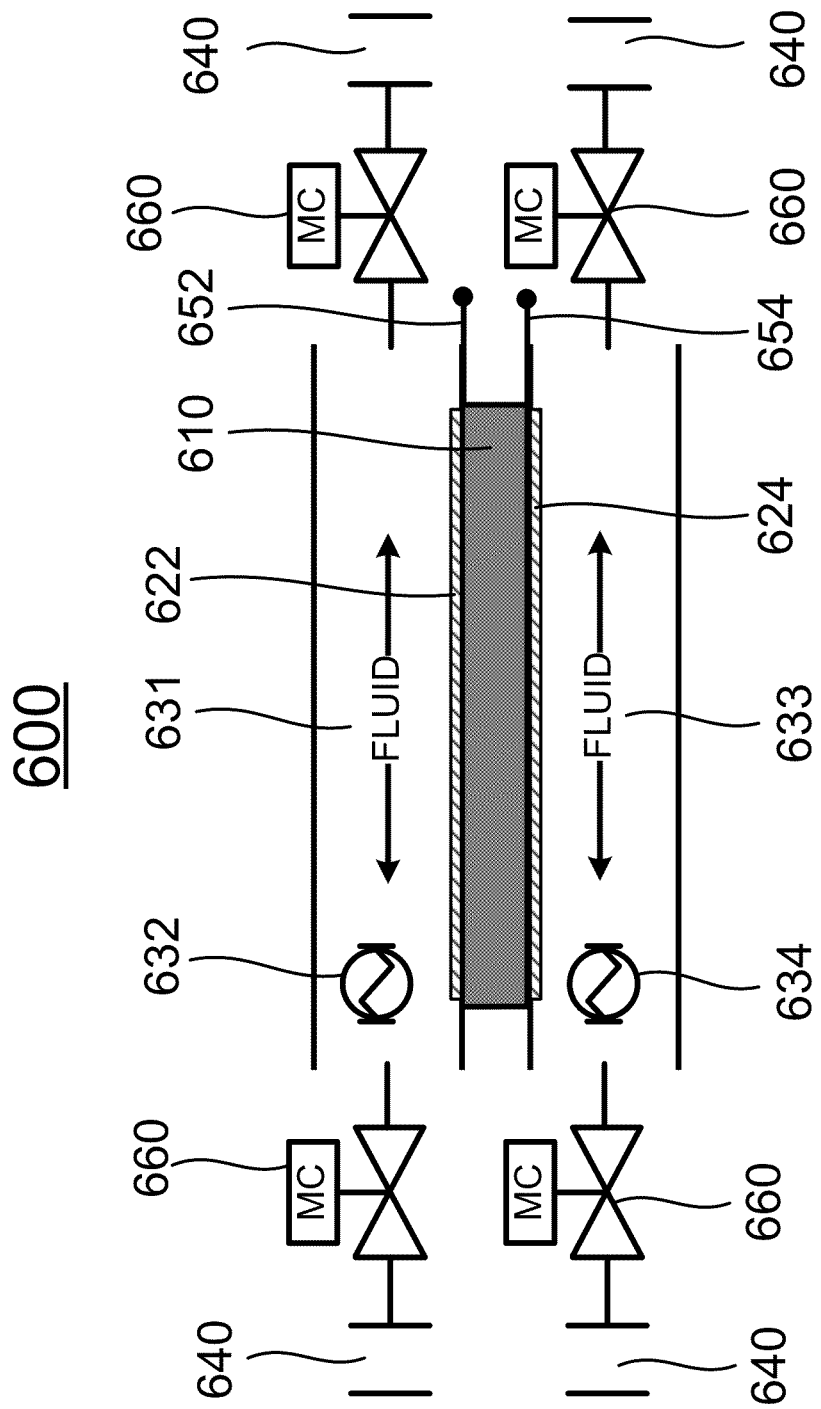
FIG. 4 shows schematically a cross-sectional view of a ferroelectric device for converting heat to electric energy according to one embodiment of the present invention.
Figure 5:
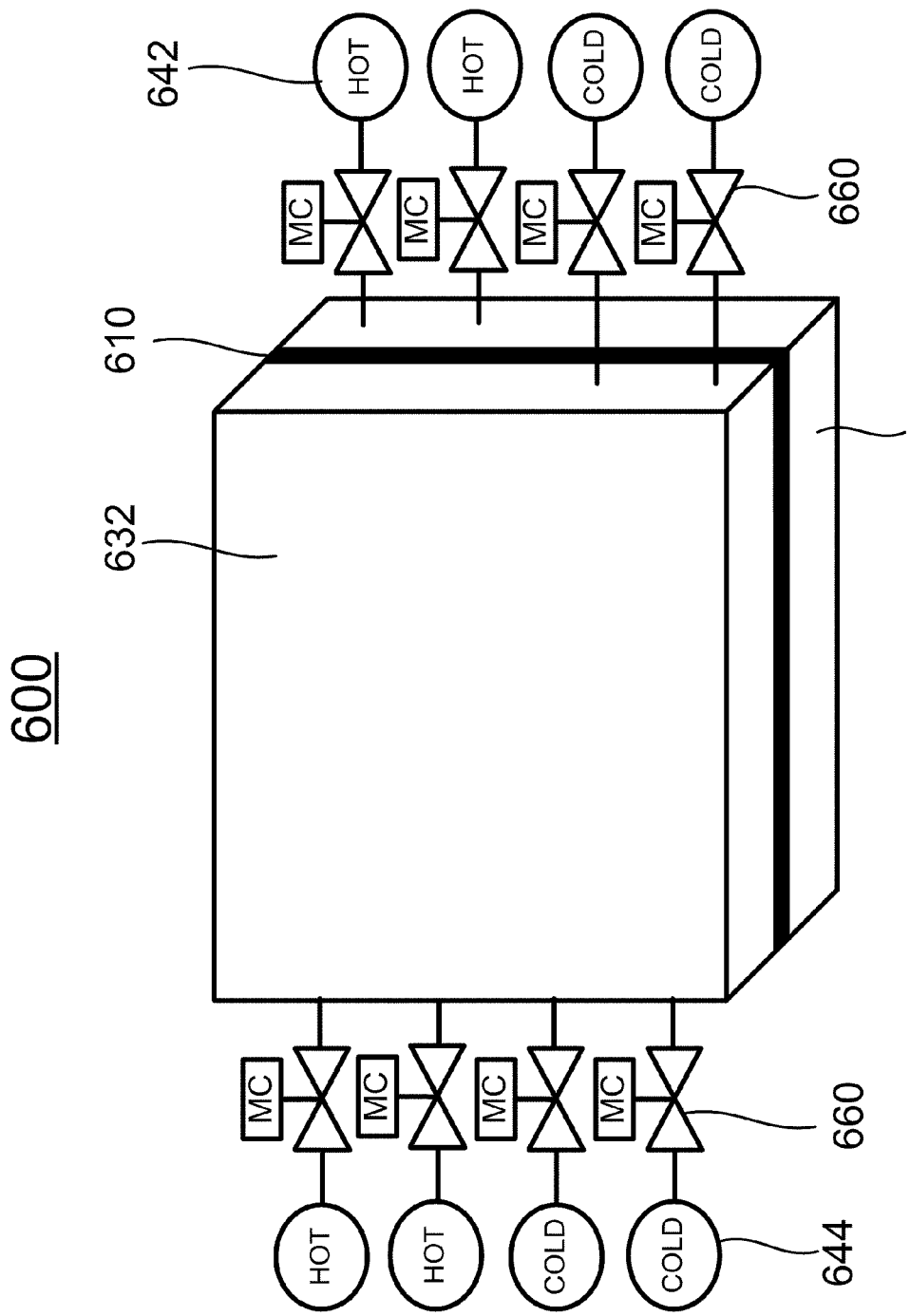
FIG. 5 shows schematically a perspective view of the ferroelectric device as shown in FIG. 4.

FIGS. 4 and 5 show another embodiment of a heat-to-electric conversion device 600 according to the present invention. In the exemplary embodiment, the device 600 has a ferroelectric layer 610, a pair of electrodes 622 and 624 respectively formed on the surfaces of the ferroelectric layer 610, and a delivering means in relation to the pair of electrodes 622 and 624 for alternately delivering a cold fluid and a hot fluid over the surface of the ferroelectric layer so as to alternately cool the ferroelectric layer 610 at a first temperature $T_L < T_c$, and heat the ferroelectric layer 610 at a second temperature $T_H > T_c$; thereby the ferroelectric material of the ferroelectric layer 610 undergoes alternating phase transitions between the ferroelectric phase and the paraelectric or antiferroelectric phase with temperature cycling.

As shown in FIG. 4, the delivering means has a first fluid passage 631 and a second fluid passage 633, a number of heat exchangers 632 and 634 including the first and second fluid passages 631 and 633, and a plurality of control valves 660 in communication with the heat exchangers 632 and 633.

The first fluid passage 631 and the second fluid passage 633 are configured such that when a cold fluid passes through at least one of the first and second fluid passages 631 and 633, the ferroelectric layer 610 is cooled towards the first temperature $T_L$, and when a hot fluid passes through at least one of the first and second fluid passages, the ferroelectric layer is heated towards the second temperature $T_H$. The flow of cold and hot fluids is supplied from a heat sink 644 and a heat source 642, respectively, through, for example, a conduit 640.

The heat exchangers 632 and 634 are adapted for alternately delivering the flow of cold fluid and the hot fluid so as to alternately cool the ferroelectric layer 610 at a first temperature $T_L$, and heat the ferroelectric layer 610 at a second temperature $T_H$. The plurality of control valves 660 is adapted for controlling the flow of cold and hot fluids in order to cycle the ferroelectric modules around their respective transition temperatures. The plurality of control valves 660, controlled by microcontrollers, are connected to thermocouples in the heating and cooling fluids and attached to the ferroelectric, and the temperature and other data such as the capacitance of the ferroelectric may be used to control the opening and closing of the control valves 660. The pressure in the hot and cold fluids may also be monitored at one or more locations, respectively. The cooling and heating of the ferroelectric is coordinated with the opening and closing of the electrical circuit, all under the direction of a control circuit that is subject to computer control, to achieve the cycle described herein. Electrical and thermal cycling are coordinated by directly monitoring, among other things, the temperature of the ferroelectric with devices such as thermocouples or thyristors; the temperature of the heating and cooling fluids; the capacitance of the ferroelectric system, capacitance being correlated to the temperature of the ferroelectric layer as a whole; the polarization of the ferroelectric layer; and/or the pressure of the hot and cold fluids, particularly in two-phase heat exchanger configurations. The extent of unbound charges on the electrodes 622 and 624 may also be monitored and may be used in controlling the cycle and, among other things, determining when the field resulting from that charge remains sufficient to pole the dipoles during the transition of the ferroelectric layer 110 into its ferroelectric phase.

Figure 6:
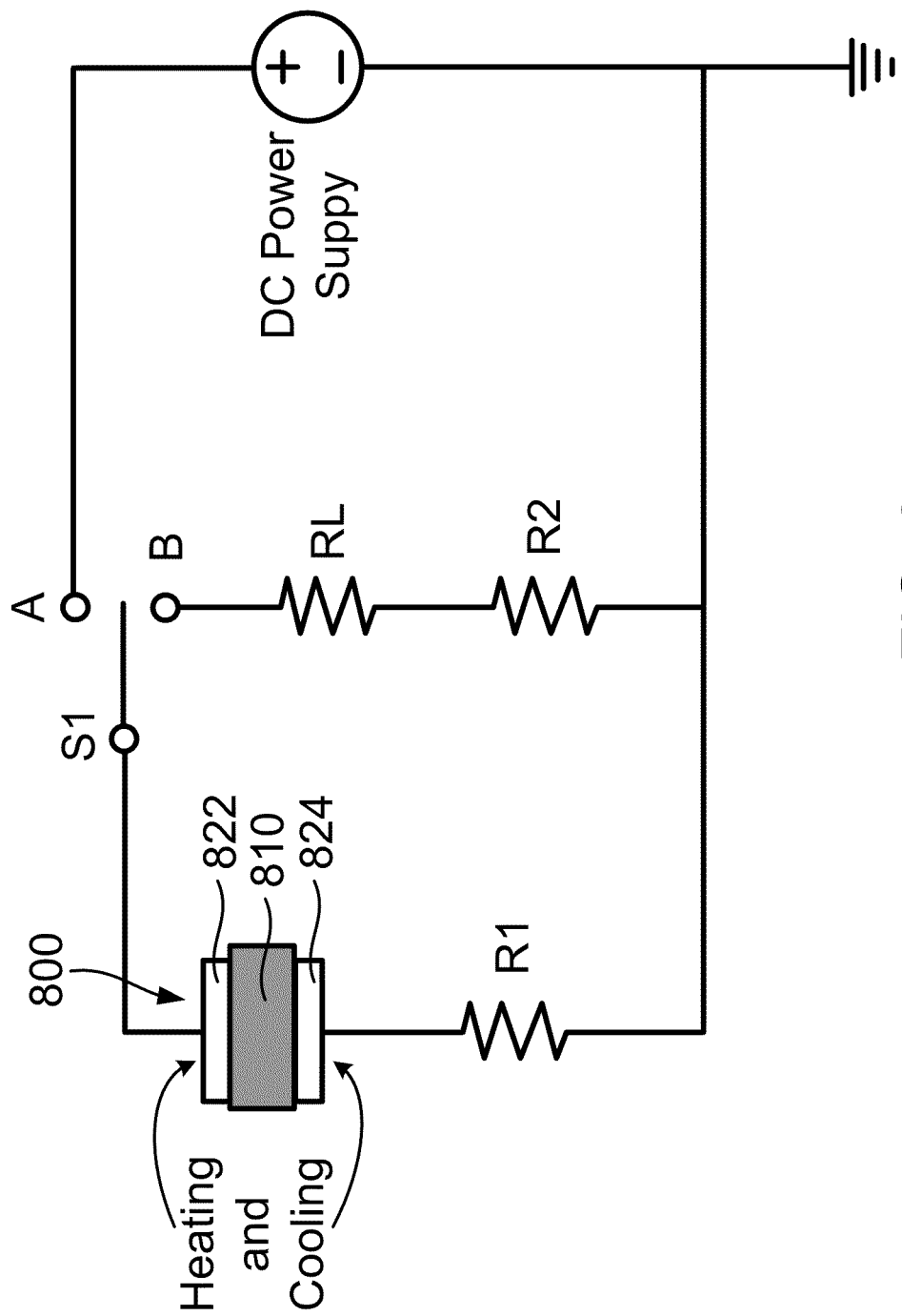
FIG. 6 shows schematically a ferroelectric power generator for operation with a resistive load according to one embodiment of the present invention.

FIG. 6 illustrates schematically a heat-to-electric energy conversion device 800 connected to a DC power supply that may be used for poling if necessary, and to an external load resistance, RL, for receiving the electrical energy generated, according to one embodiment of the present invention. According to one embodiment, one or more monitoring devices (not shown) are attached to or embedded in the ferroelectric device to monitor the temperature of the ferroelectric material. Such monitoring may be done, for example, by one or more thermocouples or thyristors or by monitoring the capacitance of the device. Additionally, resistors R1 and R2 which may remain in the circuit to monitor the current, as they have negligible resistance compared to the load resistance RL. Polarization may be monitored by integrating the current flow through resistors R1 and/or R2. Throughout the cycle, the ferroelectric module 800 undergoes actions controlled by one or more computers acting through a control circuit, which are not shown, that control heating and cooling and control the switch S1 as described herein.

In practice, the cycling of the ferroelectric modules 600 and 800 are repetitive and ongoing so long as the device is to be used to generate electricity from heat. Thus, a description of a cycle could begin at any point in the cycle. For the purpose of illustrating the operation of the device in one embodiment, the ferroelectric module 600 or 800 is initially assumed to be at point C of the cycle depicted in FIG. 22. At that point, switch S1 is opened and the ferroelectric layer 810 is at $T_H$ and polarization is at $P_L$. As described elsewhere the value of $P_L$ may correspond to a residual unbound charge that creates a field sufficient for poling the electric dipoles that arise spontaneously when the ferroelectric layer 810 transitions to the ferroelectric phase. While the switch S1 remains open at the mid-position, the ferroelectric layer 810 is cooled to $T_L$ by the withdrawal of heat, bringing the cycle to point D in FIG. 22. Keeping the switch S1 open prevents the flow of charge to or from the electrodes 822 and 824, such that polarization remains at $P_L$ during the CD step of the cycle.

At point D of the cycle in the usual operation of the invention after the first cycle in those embodiments in which a residual charge is used for poling, switch S1 is switched to position B as shown on FIG. 6, which closes the circuit between the electrodes 822 and 824 and the load resistance, RL. While the switch S1 is in position B, heat is withdrawn from the ferroelectric layer 810 isothermally at $T_L$, corresponding to step DA of the cycle depicted in FIG. 22. In step DA, the polarization retains its direction but increases to the value $P_H$. The resulting overall spontaneous polarization, $P_s$, produces very large bound charges on the surfaces of the ferroelectric layer 810. Those bound charges cause screening charges to develop on electrodes 822 and 824 that are equal and opposite to the bound charges at the surfaces of the ferroelectric layer 810. Heat $Q_L$ withdrawn during the DA step of the cycle corresponds to the enthalpy of phase transition. At point A, spontaneous polarization in the ferroelectric layer 810 is at the maximum, $P_H$, and the net electric field in the electrodes is negligible since the electrodes now carry sufficient charges to balance the bound charges due to $P_H$. Large amounts of electrical energy are generated spontaneously during step DA corresponding, for example, to the free energy difference between points D and A in FIG. 21.

FIG. 3 illustrates (1) the bound charges in the ferroelectric that are the result of the aligned electric dipoles and $P_s$ and (2) the screening charges that arise on the electrodes in opposition to those bound charges, as would occur at point A of the cycle (though at point A the load resistance RL would not be in the circuit as it is depicted in FIG. 3).

In one embodiment, a DC voltage source is included in the circuit when the switch S1 is in position A, and that voltage source can be used for poling in the first cycle or for any reason if during operation the field from the residual charges on the electrodes 822 and 824 at point D of the cycle becomes insufficient to pole the ferroelectric layer 810. In that event, switch S1 is switched to position A at point D of the cycle and a DC voltage is applied across the ferroelectric layer to pole the dipoles that spontaneously arise during transition. The voltage required for poling is material dependent, but is small compared to the voltage at which the charge is discharged from the ferroelectric device 800. Other than the minimum required for poling in such instances, a voltage need not be applied across the ferroelectric layer 810 and is discontinued. When polarization reaches $P_H$, the switch S1 is opened to the mid-position illustrated in FIG. 6, and the device is at point A in the cycle of FIG. 22.

The field that is sufficient for poling depends upon the particular material, its geometry, whether the device is operated in a single- or multi-stage configuration, and other factors. The minimum poling field generally will be of comparable strength whether it is created by the residual charges on electrodes 822 and 824 at points C and D of the cycle, or whether it is imposed from an external DC voltage source. By way of an example, for some single stage, lead-based ceramic ferroelectrics of approximately 1.0 mm thickness, an adequate poling field may be achieved by a voltage of approximately 200 volts. By contrast, the generated voltage for such a material can exceed 6,000 volts during electrical discharge. Without poling, the polarizable material would spontaneously exhibit electric dipoles when the material is in the ferroelectric phase but, in the overall aggregate, the dipoles would not be aligned. Such alignment is essential to achieve the high overall $P_s$ values that are exploited by the invention.

During the AB step of the cycle depicted in FIG. 22, the switch S1 is open, and the ferroelectric layer 810 is heated to $T_H$ so that it transitions out of the ferroelectric phase. Because the switch is open, the unbound charges on the electrodes are prevented from discharging during the lattice heating that occurs during the AB step, and total polarization remains at $P_H$.

At point B of the cycle, switch S1 is switched to position B in FIG. 6, and heat is added to the ferroelectric layer 810 isothermally at $T_H$ so that large amounts of electrical energy are released to the load RL from the ferroelectric module 800. As the electrical charges are removed from the electrodes 822 and 824, the charges are received at a very high voltage by the load resistor, RL, or by any other suitable device that can be used to store, transmit, or utilize electricity for work. When the free charges remaining on the electrodes 822 and 824 have diminished to the minimum that is sufficient to establish a field to pole the spontaneous dipoles during the transition back to the ferroelectric state, in those embodiments in which poling is achieved through an internally generated field, the withdrawal of electrical energy from the electrodes is stopped by opening the switch S1, which corresponds to point C of the cycle. Total polarization at that point is $P_L$, and the ferroelectric layer 810 is at $T_H$.

In one embodiment, a full-wave rectifier (not shown) is included in the circuit when the switch S1 is in position B. The rectifier causes current flows to and from the electrodes 822 and 824 to have the same direction at the load RL whether the current occurs during the BC or DA steps of the cycle. Such a full-wave rectifier may consist, for example, of a bridge circuit. Rectifying the signal in this fashion may simplify the subsequent use or storage of the electrical energy generated during cycling.

In another embodiment, the ferroelectric material is not cycled pursuant to the thermodynamic cycle set forth in FIG. 22 and as otherwise described herein. Rather, the ferroelectric module may be cycled using any thermodynamic cycle that allows the ferroelectric material to be cycled from a ferroelectric state in which the spontaneous dipoles are poled, to a paraelectric or antiferroelectric state wherein polarization is maintained so that it does not decrease below a minimum level, $P_L$, where $P_L$ corresponds to a level of polarization that produces a field sufficient to pole during the transition to the ferroelectric phase. In yet another embodiment, $P_L$ is allowed to become negligible or zero and poling is achieved by application of an applied DC voltage with the switch S1 in FIG. 6 in position A during step DA of the cycle depicted in FIG. 22.

In yet another embodiment, instead of cycling the ferroelectric material through phase transition, it is maintained at all times in a ferroelectric phase, and is cycled from a greater degree of polarization to a lesser degree of polarization.

The thermal cycling and the electrical inputs and outputs are computer controlled throughout the cycle. Heating and cooling during the various steps of the cycle are accomplished by microcontrollers causing hot and cold fluids to be directed alternately to the ferroelectric module 800. Different controls, as may be appropriate to a particular application and to a particular heating and cooling system, can be attained using microcontrollers in combination with computers and a control circuit. The control valves that regulate the flow of heating and cooling fluids to the ferroelectrics in one embodiment are illustrated in FIGS. 4 and 5. The computer controls receive temperature values from thermocouples or other devices that monitor the temperature in the heating and cooling fluids and in the ferroelectric materials. Pressures in the hot and cold fluids may also be monitored. The computer controls also monitor polarization and load currents as measured, for example, by resistors R1 and R2, as shown in FIG. 6. Polarization may be monitored by integrating the current flow through resistors R1 and/or R2. Computers and a control circuit control the heat exchangers to cause appropriate thermal cycling of the ferroelectric module in accordance with the thermodynamic cycle being used. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

Referring to FIG. 7, a method 900 for operating the invented device for converting heat to electrical energy is shown according to one embodiment of the present invention. In one embodiment, the method 900 includes the following steps: at step 910, a ferroelectric layer is provided. The ferroelectric layer is comprised of a ferroelectric material characterized with a Curie temperature, $T_c$. A pair of electrodes is positioned respectively on the first surface and the second surface of the ferroelectric layer, with electrical leads going from the electrodes to external circuitry. The electrodes are comprised of a thermally and electrically conductive material.

At step 920, a cold fluid and a hot fluid are alternately delivered so as to alternately cool the ferroelectric layer to a first temperature $T_L$ that is lower than the Curie temperature $T_c$, and heat the ferroelectric layer to a second temperature $T_H$ that is higher than the Curie temperature $T_c$. During step 920, the electrical circuit is opened so that cooling and heating occur under effectively constant polarization, $P_L$ and $P_H$, respectively, while lattice cooling and heating occur. The cold fluid and the hot fluid can alternately be delivered by heat exchangers, control valves, or the likes, controlled in coordination with data monitors and under direction from a control circuit.

At step 930, a cold fluid and a hot fluid are alternately delivered so as to alternately remove heat from the ferroelectric layer isothermally at a first temperature $T_L$ that is lower than the Curie temperature $T_c$, and add heat to the ferroelectric layer isothermally at a second temperature $T_H$ that is higher than the Curie temperature $T_c$. During step 930, the electrical circuit is closed so that the removal of heat occurs as polarization changes from $P_L$ to $P_H$, and the addition of heat occurs as polarization changes from $P_H$ to $P_L$. A cold fluid and a hot fluid can alternately be delivered by heat exchangers, control valves, or the likes, controlled in coordination with data monitors and under direction from a control circuit.

At step 940, with the ferroelectric material initially in a metastable state, the spontaneous polarization of the domains in the ferroelectric material is poled at temperature $T_L$ so as to generate electrically-opposite screening charges on the pair of electrodes. In one embodiment, poling is performed by applying a small DC voltage to the ferroelectric layer to create a poling field that aligns the dipoles.

At step 950, heat is added to the ferroelectric material isothermally at $T_H$, and the circuit is closed. Electric energy corresponding to the generated electrically-opposite screening charges on the pair of electrodes is output to an external circuitry at a very high voltage. In one embodiment, the circuit is opened to allow a sufficient residual charge remaining on the electrodes to provide a field for poling during the next cycle.

It should be noted that, while the essential function of the device occurs in a single layer with a given ferroelectric material, the invention may be more useful in practical applications and may produce greater quantities of electrical energy from a particular heat source where a number of ferroelectric materials are combined in a series of stages. The maximum efficiency of any system that converts thermal energy to another form of energy, or to work, is the Carnot efficiency, $\eta_c = \Delta T/T_H$. In applications where $\Delta T$ is larger, it may be desirable to utilize a multistage conversion module that includes a series of ferroelectric materials with a succession of phase transition temperatures that correspond to the available temperatures between $T_H$ and $T_L$. The magnitude of $\Delta T$ that warrants multi-stage treatment varies depending upon the specific application and materials system used. There may be applications where it is appropriate to operate a single device over a relatively large $\Delta T$, for example 100° C. or more, and that may be the case in particular in conjunction with heat regeneration techniques.

There are a number of configurations or embodiments whereby the basic principle of the present invention can be used in a multistage format with multiple ferroelectrics that have multiple phase transition temperatures, several of which embodiments will be described here. By providing these descriptions, it is not the intention to limit the invention to these configurations, which are merely illustrative. Also, where these descriptions and embodiments refer to Curie temperatures, $T_c$, it should be understood that the descriptions are equally applicable for ferroelectrics where the ferroelectric phase exists at temperatures above the transition temperature and the material is paraelectric below that transition temperature; for ferroelectrics where the transition is between ferroelectric and antiferroelectric phases; and for polarizable polymers.

FIG. 8 shows an apparatus 1000 having a plurality of ferroelectric modules, FM1, FM2, . . . FMn−1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module.

Figure 9:
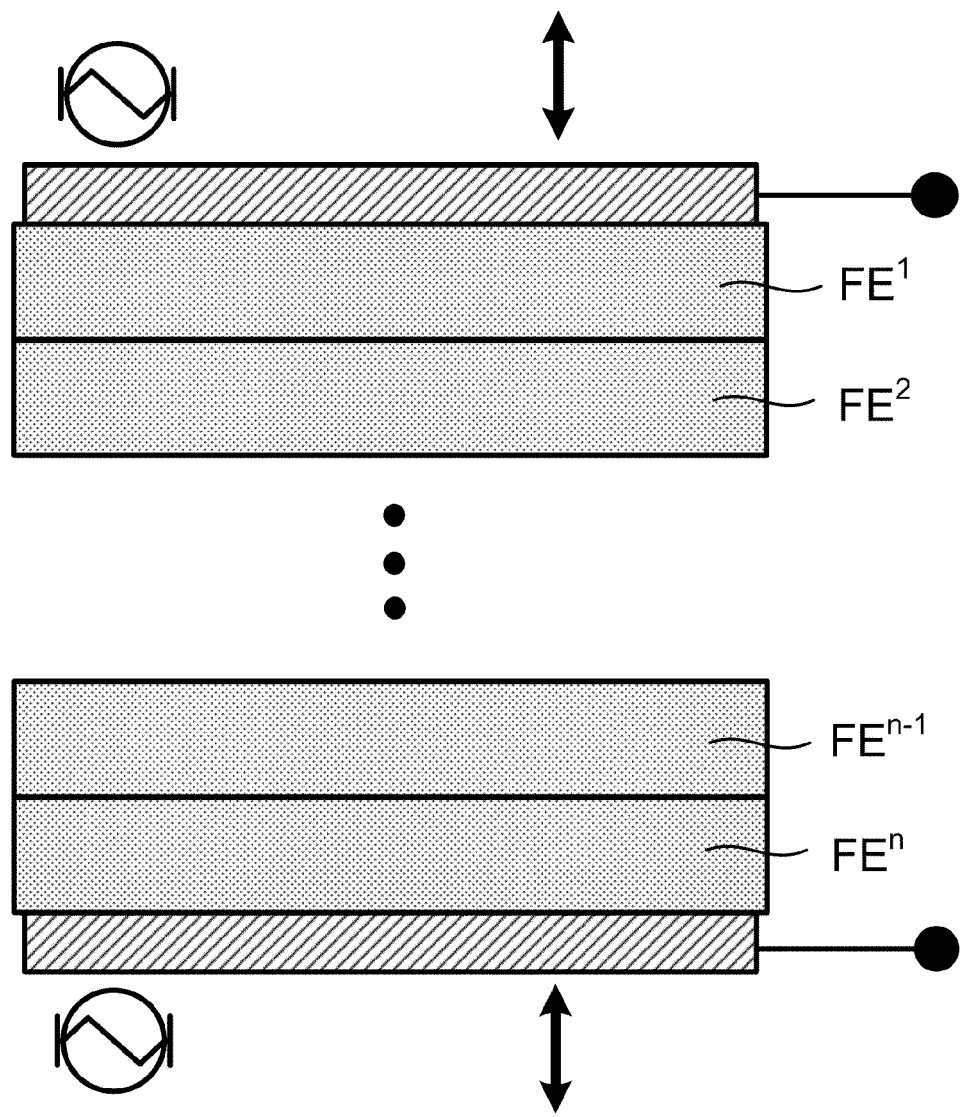
FIG. 9 shows schematically a ferroelectric device for converting heat to electric energy according to another embodiment of the present invention.
Figure 10:
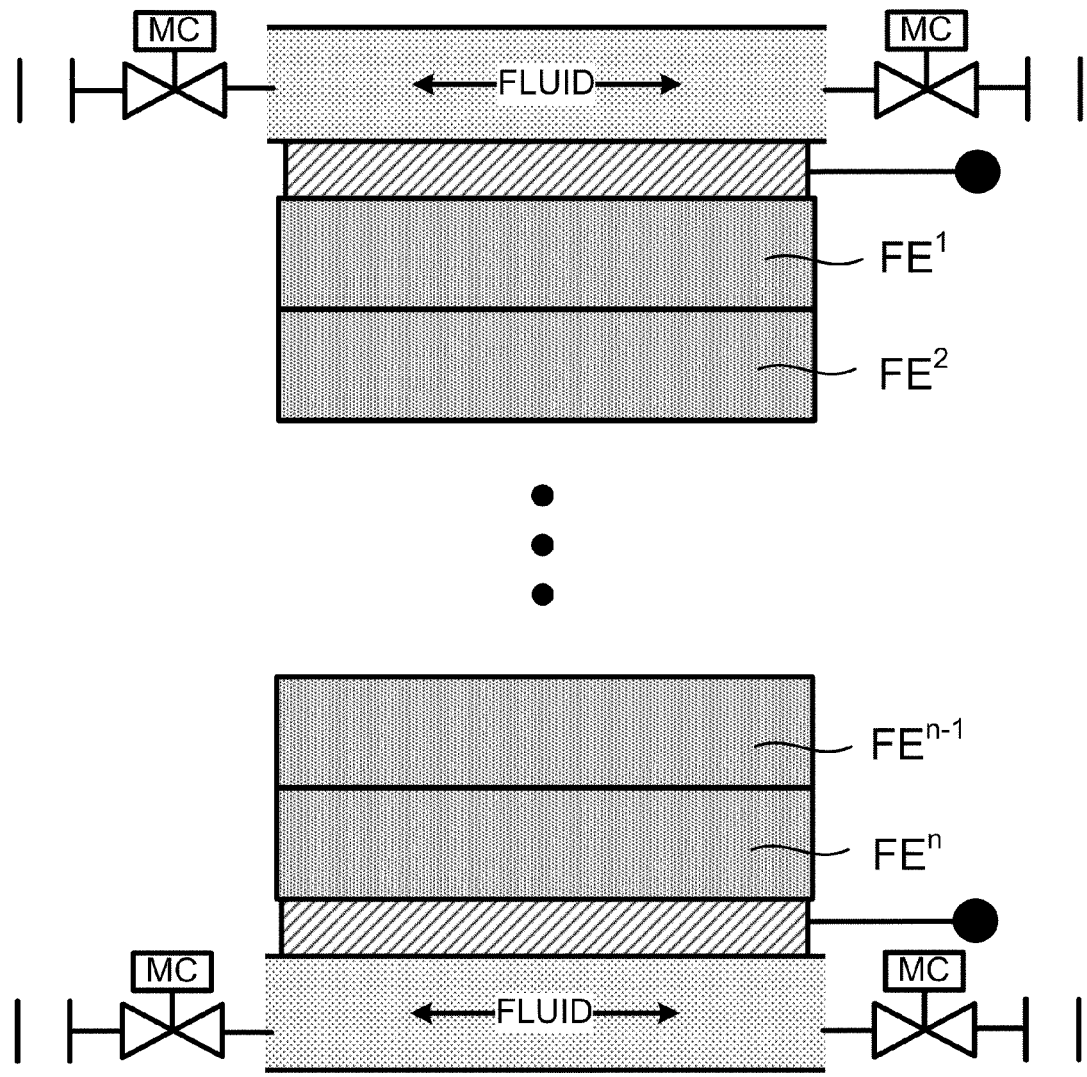
FIG. 10 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 9 and 10. The sequential layers, $FE^1$, $FE^2$ . . . $FE^{n-1}$ and $FE^n$, are formed of an identical ferroelectric material or substantially different ferroelectric materials. The Curie temperatures, $T_c^1$, $T_c^2$ . . . $T_c^{n-1}$ and $T_c^n$, correspond to the ferroelectric materials in the sequential layers $FE^1$, $FE^2$ . . . $FE^{n-1}$ and $FE^n$. In one embodiment, the multilayered ferroelectric materials are arrayed so that $T_c^{i+1} > T_c^i$. In one embodiment, the combined multilayer module is then cycled thermally and electrically so that each individual layer cycles around its phase transition temperature in a cycle that has two isothermal steps and two steps where total polarization in the layer is maintained constant. Each layer, during the course of a cycle, undergoes ferroelectric-paraelectric or ferroelectric-antiferroelectric cycling with poling and discharge as described herein for a single layer device. With this multilayer configuration, as shown in FIGS. 9 and 10, the electrical energy removed at high voltage during the discharge step of the cycle is related to the total spontaneous polarization, $P_s$, at the junctures of the electrodes and the ferroelectric materials designated as $FE^1$ and $FE^n$, which polarization results from the cumulative spontaneous polarization of each FE layer acting together.

Figure 11:
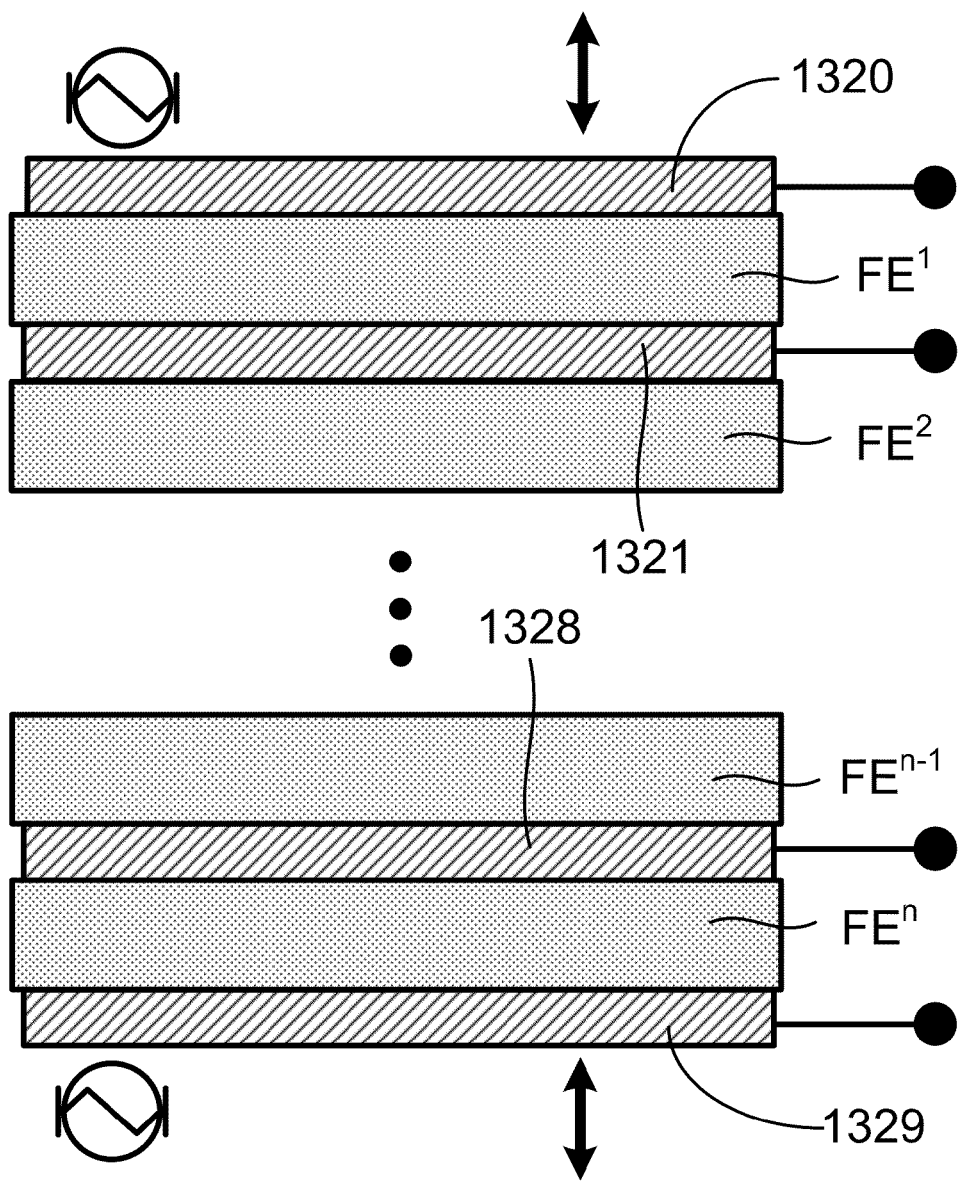
FIG. 11 shows schematically a ferroelectric device for converting heat to electric energy according to an alternative embodiment of the present invention.

Referring to FIG. 11, another embodiment of a multilayered ferroelectric device 1300 is shown according to the present invention. This configuration of the multilayered ferroelectric device 1300 is similar to the device as disclosed in FIG. 9, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 . . . 1328 and 1329 are formed of a thermally and electrically conductive material. The thermal and electrical cycling and operation of the device 1300 are similar to the device as disclosed in FIGS. 9 and 10. However, the extraction of the electrical energy from the device is different. In this configuration, the electrical energy is withdrawn during the discharge step of the cycle from all of the electrodes 1320, 1321 . . . 1328 and 1329, as shown in FIG. 11. The electrical energy withdrawn from the electrodes 1320, 1321 . . . 1328 and 1329 can then either be transported via the connective leads to a load resistance or to a bus for exportation to such external circuitry and use as may be desired.

Figure 12:
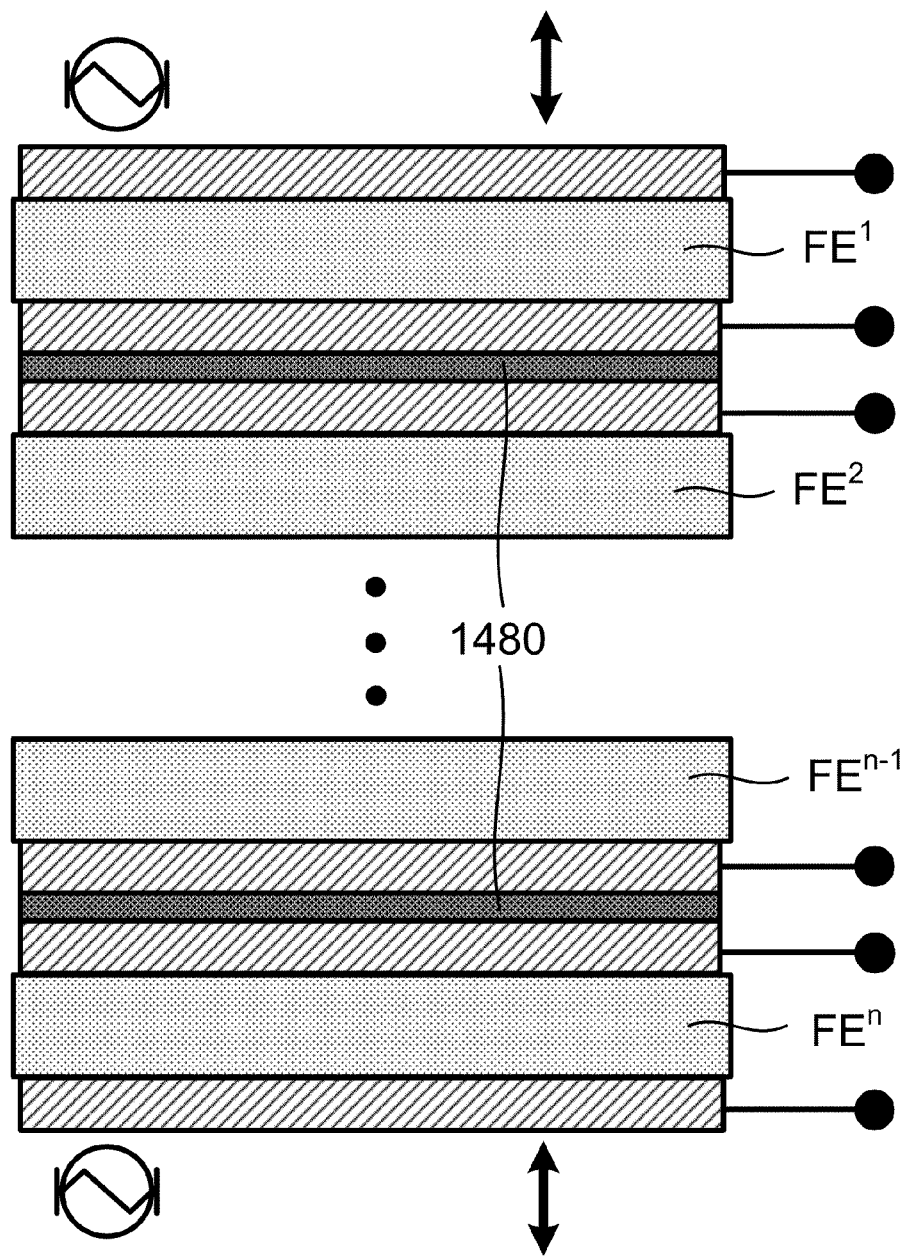
FIG. 12 shows schematically a ferroelectric device for converting heat to electric energy according to a further embodiment of the present invention.

FIG. 12 shows schematically an alternative embodiment of a multilayered ferroelectric device 1400. This configuration of the multilayered ferroelectric device 1400 is similar to the device as disclosed in FIG. 11, but each ferroelectric layer is separated from the adjacent layer of ferroelectric material by two electrodes which, in turn, are separated by an electrical insulator 1480, which is selected to minimally impede thermal transfer.

Figure 13:
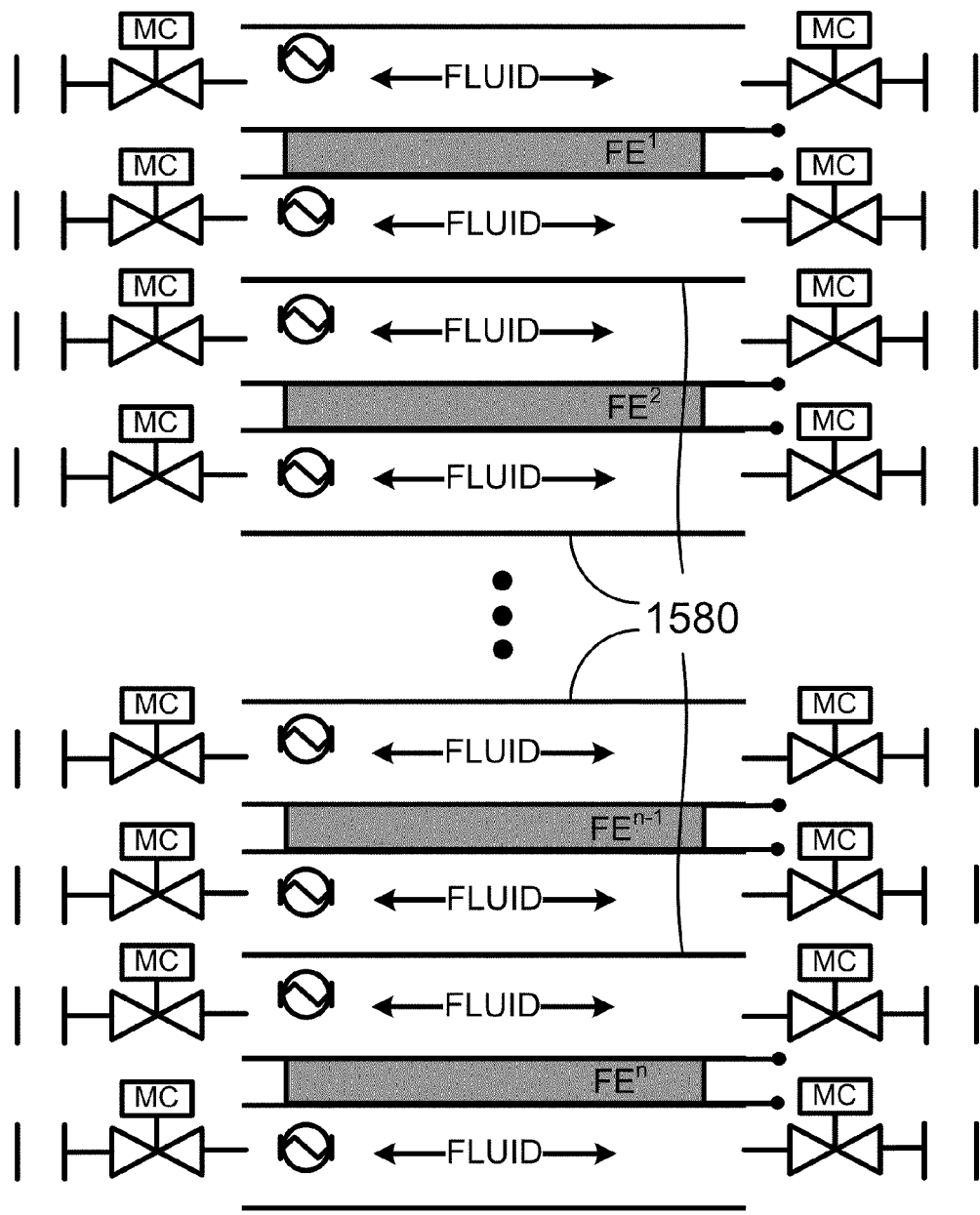
FIG. 13 shows schematically a ferroelectric device for converting heat to electric energy according to yet a further embodiment of the present invention.

FIG. 13 illustrates schematically a system of n individual ferroelectric modules with a series of different phase transition temperatures, $T_c^1$ to $T_c^n$, that lie in an increasing (or decreasing) sequence between the temperatures of the heat source, $T_H$, and the heat sink, $T_L$, and that are operated with a heat exchanger system so as to cycle each ferroelectric stage, $FE^i$, around its respective phase transition temperature, $T_c^i$. In this configuration, the phase transition temperatures vary among different ferroelectric layers $FE^1$, $FE^2$ . . . $FE^{n-1}$ and $FE^n$. As shown in FIG. 13, a series of single-layer devices as shown in FIG. 4 are arranged in a stack. Each single-layer device operates with heat exchangers that selectively heat and cool the individual ferroelectric modules so that the i-th layer is thermally cycled around its respective phase transition temperature, $T_c^i$. In this configuration, the ferroelectric modules are integrated with a networked heat exchanger that cycles each ferroelectric module, $FM^i$, around its transition temperature, $T_c^i$. The heat exchangers may be interconnected to facilitate regenerative heating and cooling or to facilitate operating the ferroelectric modules in cascade with decreasing temperature. Adjacent heat exchangers may be thermally insulated from one another by thermal insulators 1580, as shown in FIG. 13. In this system, thermocouples are located such that the temperature of the heating and cooling fluids is monitored throughout the system, as are the temperatures or capacitance of the ferroelectrics in the individual modules. A system of microcontrollers acting in a control circuit then directs the heating and cooling fluids at appropriate temperatures to cause each ferroelectric stage, $FE^i$, to cycle around its respective phase transition temperature, $T_c^i$, in the format and method of poling and thermal and electrical cycling described herein for a single-stage device. In one embodiment, each cycle of the various ferroelectric stages, $FE^i$, undergoes coordinated thermal and electrical cycling as described herein for a single stage with two isothermal steps and two steps where total polarization in the layer is maintained constant. The electrical energy withdrawn from the electrodes can either be transported via the connective leads to a load resistance or to a bus for exportation to such external circuitry and use as may be desired.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for converting heat to electric energy, comprising:

thermally cycling one or more layers of an electrically polarizable material between a first temperature $T_1$ and a second temperature $T_2$ by alternately adding thermal energy to and withdrawing thermal energy from the electrically polarizable material, the one or more layers of electrically polarizable material having a first surface and an opposite second surface, wherein a first electrode formed of a thermally and electrically conductive material is positioned on the first surface and a second electrode formed of a thermally and electrically conductive material is positioned on the second surface, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$;

wherein a DC poling voltage is applied to the electrically polarizable material such that, when the electrically polarizable material is in a first portion of the cycle which includes the temperature $T_1$, the electrically polarizable material develops an overall net spontaneous polarization and screening charges are generated on the first and second electrodes;

wherein the first and second electrodes are connected to a load such that electrical energy is output from the first and second electrodes to the load when the electrically polarizable material is in a second portion of the cycle which includes the temperature $T_2$;

wherein, when $T_2 > T_1$, the first and second electrodes are connected to the load while thermal energy is being added to the electrically polarizable material and when $T_2 < T_1$, the first and second electrodes are connected to the load while thermal energy is being withdrawn from the electrically polarizable material; and wherein adding thermal energy to the electrically polarizable material comprises:

extracting thermal energy from a combustion reaction and transferring the thermal energy to the electrically polarizable material;

generating thermal energy from solar energy and transferring the thermal energy to the electrically polarizable material;

extracting thermal energy from a nuclear reaction and transferring the thermal energy to the electrically polarizable material;

extracting thermal energy from ocean water and transferring the thermal energy to the electrically polarizable material;

extracting thermal energy from the earth and transferring the thermal energy to the electrically polarizable material; or recovering thermally energy from an industrial process and transferring the thermal energy to the electrically polarizable material.

2. The method of claim 1, wherein adding thermal energy to the electrically polarizable material comprises extracting thermal energy from a combustion reaction and transferring the thermal energy to the electrically polarizable material.

3. The method of claim 2, wherein the combustion reaction is a catalytic combustion reaction.

4. The method of claim 2, wherein the combustion reaction comprises the reaction of a fuel with an oxidant.

5. The method of claim 4, wherein the fuel is selected from the group consisting of: an organic compound, a hydrocarbon, hydrogen, aluminum, lithium, biomass and combinations thereof.

6. The method of claim 4, wherein the fuel is aluminum and wherein the oxidant is water.

7. The method of claim 6, wherein the aluminum reacts with water to produce hydrogen and $Al_2O_3$ and wherein the method further comprises:

combusting the hydrogen and/or reducing the $Al_2O_3$;

extracting thermal energy resulting from the combustion and/or reduction reactions; and transferring the thermal energy to the electrically polarizable material.

8. The method of claim 4, wherein the fuel is lithium and wherein the oxidant is water.

9. The method of claim 2, wherein thermal energy from the combustion reaction is used to generate steam and wherein thermal energy from the steam is transferred to the electrically polarizable material.

10. The method of claim 1, wherein adding thermal energy to the electrically polarizable material comprises generating thermal energy from solar energy and transferring the thermal energy to the electrically polarizable material.

11. The method of claim 10, wherein generating thermal energy from solar energy comprises:

passing a heat transfer fluid through a solar collector to transfer thermal energy from the solar collector to the heat transfer fluid to form a heated fluid; and subsequently transferring thermal energy from the heated fluid to the electrically polarizable material.

12. The method of claim 11, further comprising storing the heated fluid before transferring thermal energy from the heated fluid to the electrically polarizable material.

13. The method of claim 11, further comprising:

passing the heated fluid through a heat exchanger to transfer thermal energy from the heated fluid to a thermal energy storage medium to heat the thermal energy storage medium; and wherein transferring thermal energy from the heated fluid to the electrically polarizable material comprises transferring thermal energy from the heated thermal energy storage medium to the electrically polarizable material.

14. The method of claim 11, further comprising storing the heated thermal energy storage medium before transferring thermal energy from the heated thermal energy storage medium to the electrically polarizable material.

15. The method of claim 1, wherein adding thermal energy to the electrically polarizable material comprises recovering thermally energy from an industrial process and transferring the thermal energy to the electrically polarizable material.

16. The method of claim 15, wherein the industrial process is selected from the group consisting of: a chemical process;

a papermaking process; a food production process; an oil refining process; a metals process; a machinery production process; an iron making process; a steel making process; an aluminum making process; and a cement manufacturing process.

17. The method of claim 15, wherein thermal energy from the industrial process is converted to thermal and electrical energy via a cogeneration process and wherein thermal energy from the cogeneration process is transferred to the electrically polarizable material.

18. The method of claim 1, wherein adding thermal energy to the electrically polarizable material comprises extracting thermal energy from a nuclear reaction and transferring the thermal energy to the electrically polarizable material.

19. The method of claim 18, wherein the nuclear reaction is a nuclear fission reaction, a nuclear fusion reaction or radioactive decay.

20. The method of claim 19, wherein the nuclear reaction is radioactive decay.

21. The method of claim 20, wherein the nuclear reaction is the radioactive decay of an isotope selected from the group consisting of: Plutonium-238; Cerium-244; Strontium-90; Polonium-210; Promethium-147; Cesium-137; Cerium-144; Ruthenium-106; Cobalt-60 and Curium-242.

22. The method of claim 18, wherein the thermal energy is extracted from a coolant used to cool a nuclear reactor.

23. The method of claim 22, wherein the coolant is passed through a heat exchanger to generate steam and wherein thermal energy is extracted from the steam.

24. The method of claim 22, wherein the coolant is selected from the group consisting of pressurized water, an organic liquid, terphenyl, a liquid metal, and liquid sodium.

25. The method of claim 1, wherein adding thermal energy to the electrically polarizable material comprises extracting thermal energy from the earth and transferring the thermal energy to the electrically polarizable material.

26. The method of claim 1, wherein extracting thermal energy from the earth comprises passing a heat transfer fluid through a conduit buried in the ground such that heat is transferred between the heat transfer fluid and the ground.

27. The method of claim 1, wherein adding thermal energy to the electrically polarizable material comprises extracting thermal energy from ocean water at a higher temperature than the electrically polarizable material and transferring the thermal energy to the electrically polarizable material.

28. The method of claim 27, wherein withdrawing thermal energy from the electrically polarizable material comprises transferring thermal energy from the electrically polarizable material to ocean water at a lower temperature than the electrically polarizable material.

29. The method of claim 27, wherein:
extracting thermal energy from ocean water to heat the electrically polarizable material comprises drawing ocean water from a first depth, extracting thermal energy from the ocean water and transferring the thermal energy to the electrically polarizable material; and
transferring thermal energy from the electrically polarizable material to ocean water comprises drawing ocean water from a second depth greater than the first depth and transferring thermal energy from the electrically polarizable material to the ocean water.

30. The method of claim 1, wherein residual charges are left on the first and second electrodes after electrical energy is output to the load and wherein the residual charges provide the DC poling voltage for the next cycle.

31. The method of claim 30, wherein the residual charges left on the first and second electrodes after electrical energy is output to the load are such that the resulting polarization exceeds the polarization at the local free energy maximum that occurs when thermally cycling the electrically polarizable material from $T_1$ to $T_2$.

32. The method of claim 1, further comprising rectifying the electrical energy output from the first and second electrodes to the load.

33. The method of claim 1, wherein adding thermal energy to and withdrawing thermal energy from the electrically polarizable material comprises delivering a flow of fluid to the electrically polarizable material or to a material in direct or indirect contact with the electrically polarizable material such that thermal energy is exchanged between the fluid and the electrically polarizable material.

34. The method of claim 33, wherein one or more fluid passages are formed in, on or adjacent to each of the first and second electrodes and wherein the fluid is delivered into the fluid passages such that thermal energy is exchanged between the one or more fluids and the one or more layers of electrically polarizable material.

35. The method of claim 34, further comprising monitoring the temperature and/or pressure of the fluid.

36. The method of claim 1, further comprising monitoring one or more of:
the temperature of the electrically polarizable material;
the capacitance of the electrically polarizable material;
the polarization of the electrically polarizable material; and/or
the current flowing to and/or from the first and second electrodes.

37. An apparatus for converting heat to electric energy, comprising:
(a) a first electrode formed of a thermally and electrically conductive material;
(b) a second electrode formed of a thermally and electrically conductive material, wherein the second electrode is spaced from the first electrode;
(c) one or more layers of electrically polarizable material between the first and second electrodes, the one or more layers of electrically polarizable material having a first surface and an opposite second surface, wherein the first electrode is positioned on the first surface and the second electrode is positioned on the second surface;
(d) a first heat exchanger for adding thermal energy to the one or more layers of electrically polarizable material, wherein the heat exchanger is in thermal communication with a heat source;
(e) a second heat exchanger for removing thermal energy from the one or more layers of electrically polarizable material, wherein the heat exchanger is in thermal communication with a heat sink; and
(f) a control circuit, the control circuit:
thermally cycling the one or more layers of electrically polarizable material between a first temperature $T_1$ and a second temperature $T_2$ by alternately adding thermal energy to and withdrawing thermal energy from the one or more layers of electrically polarizable material using the first and second heat exchangers, respectively, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$;
wherein a DC poling voltage is applied to the one or more layers of electrically polarizable material such that, when the material is in a first portion of the cycle which includes the temperature $T_1$, the electrically polarizable material develops an overall net spontaneous polarization and screening charges are generated on the first and second electrodes; and wherein the first and second electrodes are connected to a load such that electrical energy is output from the first and second electrodes to the load when the electrically polarizable material is in a second portion of the cycle which includes the temperature $T_2$; and wherein, when $T_2 > T_1$, the first and second electrodes are connected to the load while thermal energy is being added to the electrically polarizable material and when $T_2 < T_1$, the first and second electrodes are connected to the load while thermal energy is being withdrawn from the electrically polarizable material;

wherein the heat source is: a combustion apparatus; a solar thermal collector; or a component of a furnace exhaust device; or wherein the first heat exchanger comprises: a device for extracting thermal energy from the earth; a device for extracting thermal energy from the sun; a device for extracting thermal energy from ocean water; a device for extracting thermal energy from an industrial process; a device for extracting thermal energy from a combustion reaction; or a device for extracting thermal energy from a nuclear reaction.

38. A vehicle comprising:
an apparatus for converting heat to electrical energy as set forth in claim 37; and
an electric motor;
wherein the apparatus for converting heat to electrical energy is in electrical communication with the electric motor.

39. The vehicle of claim 38, wherein the electric motor provides power to propel the vehicle.

40. The vehicle of claim 38, wherein the vehicle is an electric vehicle or a hybrid electric vehicle.

41. The vehicle of claim 38, wherein the heat sink is a radiator.

42. The vehicle of claim 38, further comprising a device for storing electrical energy.

43. The vehicle of claim 42, wherein the device for storing electrical energy comprises one or more capacitors and/or one or more rechargeable batteries.

44. The vehicle of claim 38, wherein the heat source is a combustion apparatus.

45. The vehicle of claim 44, wherein the combustion apparatus is an internal combustion engine or a catalytic combustor.

46. The vehicle of claim 44, wherein the combustion apparatus is a catalytic combustion apparatus comprising a catalytic element and a heat receiving member adapted to receive heat from the catalytic element, wherein the heat source is the heat receiving member.

47. The vehicle of claim 44, further comprising a fuel storage device adapted to supply fuel to the combustion apparatus.

48. The vehicle of claim 47, further comprising a fuel contained in the fuel storage device, wherein the fuel comprises aluminum or lithium metal.

49. The apparatus of claim 37, wherein residual charges are left on the first and second electrodes after electrical energy is output to the load and wherein the residual charges provide the DC poling voltage for the next cycle.

50. The apparatus of claim 49, wherein the residual charges left on the first and second electrodes after electrical energy is output to the load are such that the resulting polarization exceeds the polarization at the local free energy maximum that occurs when thermally cycling the electrically polarizable material from the temperature $T_1$ to the temperature $T_2$.

51. The apparatus of claim 49, further comprising a device for measuring the amount of residual charge remaining on the first and second electrodes, the control circuit disconnecting the first and second electrodes from the load when the residual charge reaches a predetermined level.

52. The apparatus of claim 37, wherein the control circuit further comprises a full-wave rectifier connected in a circuit with the first and second electrodes and the load.

53. The apparatus of claim 52, wherein the first and second electrodes remain connected to the load when thermally cycling after the initial cycle.

54. The apparatus of claim 52, the control circuit switching the first and second electrodes between the DC poling voltage and the load during each cycle such that the first and second electrodes are connected to either the DC poling voltage or the load during each cycle.

55. The apparatus of claim 37, the control circuit:
connecting the first and second electrodes to the load during the second portion of each cycle; and
applying the DC poling voltage to the one or more layers of electrically polarizable material during the first portion of each cycle.

56. The apparatus of claim 37, wherein $T_2$ is higher than $T_1$.

57. The apparatus of claim 37, wherein $T_1$ is higher than $T_2$.

58. The apparatus of claim 37, wherein each of the one or more layers of electrically polarizable material has a phase transition temperature at which the material transitions between a phase in which the material exhibits spontaneous polarization and a phase in which the material does not exhibit spontaneous polarization.

59. The apparatus of claim 58, wherein the electrically polarizable material is in the phase which exhibits spontaneous polarization at the temperature $T_1$ and $T_2$.

60. The apparatus of claim 58, wherein the electrically polarizable material is in the phase which exhibits spontaneous polarization at the temperature $T_1$ and wherein the electrically polarizable material is in the phase which does not exhibit spontaneous polarization at the temperature $T_2$.

61. The apparatus of claim 37, wherein the electrically polarizable material is an electrically polarizable amorphous polymer material.

62. The apparatus of claim 37, wherein each of the one or more layers of electrically polarizable material comprises a ferroelectric material having a Curie temperature, $T_c$, such that when the temperature of the ferroelectric material is lower than the Curie temperature, $T_c$, the ferroelectric material is in a ferroelectric phase and when the temperature of the ferroelectric material is greater than the Curie temperature, $T_c$, the ferroelectric material is in a paraelectric or anti-ferroelectric phase.

63. The apparatus of claim 37, further comprising a DC voltage source, the control circuit applying a DC poling voltage from the DC voltage source to the one or more layers of electrically polarizable material during the initial cycle.

64. The apparatus of claim 37, wherein each of the first and second heat exchangers comprises a device for delivering a flow of fluid to the one or more layers of electrically polarizable material or to a material in direct or indirect contact with the one or more layers of electrically polarizable material such that thermal energy is exchanged between the fluid and the one or more layers of electrically polarizable material.

65. The apparatus of claim 64, wherein each of the first and second heat exchangers further comprises a temperature measuring device for monitoring the temperature of the fluid and/or a pressure measuring device for monitoring the pressure of the fluid.

66. The apparatus of claim 64, wherein each of the first and second heat exchangers comprises one or more control valves for controlling the flow of the fluid.

67. The apparatus of claim 66, further comprising one or more microcontrollers, wherein each of the one or more control valves are controlled by one or more microcontrollers.

68. The apparatus of claim 37, wherein one or more fluid passages are formed in, on or adjacent to each of the first and second electrodes and wherein each of the first and second heat exchangers delivers a fluid into the fluid passages such that thermal energy is exchanged between the fluid and the one or more layers of electrically polarizable material.

69. The apparatus of claim 37, further comprising:
a temperature measuring device for monitoring the temperature of the one or more layers of electrically polarizable material;
a capacitance measuring device for monitoring the capacitance of the one or more layers of electrically polarizable material;
a polarization measuring device for monitoring the polarization of the one or more layers of electrically polarizable material; and/or
a current measuring device for monitoring the current to and/or from the electrodes.

70. The apparatus of claim 37, comprising a plurality of layers of electrically polarizable material arranged in a stack between the first and second electrodes.

71. The apparatus of claim 37, wherein the control circuit comprises a switch having an open position and first and second closed positions, wherein the switch is connected between the first and second electrodes and wherein:
when the switch is in the open position, current does not flow between the first and second electrodes;
when the switch is in the first closed position, the DC voltage source is connected across the first and second electrodes; and
when the switch is in the second closed position, the load is connected across the first and second electrodes.

72. The apparatus of claim 71, wherein the control circuit further comprises a first resistor and a second resistor, wherein:
the first resistor is in series with the DC voltage source when the switch is in the first closed position; and
wherein the first resistor and the second resistor are in series with the load when the switch is in the second closed position.

73. The apparatus of claim 71, wherein the control circuit further comprises an electrical storage device and wherein the electrical storage device is connected across the first and second electrodes when the switch is in the second closed position.

74. A method for converting heat to electric energy, comprising:
thermally cycling an electrically polarizable material between a first temperature $T_1$ and a second temperature $T_2$ by alternately adding thermal energy to and withdrawing thermal energy from the electrically polarizable material, wherein the electrically polarizable material is positioned between first and second electrodes each formed of a thermally and electrically conductive material, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$;
wherein a DC poling voltage is applied to the electrically polarizable material such that, when the electrically polarizable material is in a first portion of the cycle which includes the temperature $T_1$, the electrically polarizable material develops an overall net spontaneous polarization and screening charges are generated on the first and second electrodes;
wherein the first and second electrodes are connected to a load such that electrical energy is output from the first and second electrodes to the load when the electrically polarizable material is in a second portion of the cycle which includes the temperature $T_2$;
wherein adding thermal energy to the electrically polarizable material comprises drawing ocean water from a first depth, extracting thermal energy from the ocean water and transferring the thermal energy to the electrically polarizable material; and
wherein withdrawing thermal energy from the electrically polarizable material comprises drawing ocean water from a second depth greater than the first depth and transferring thermal energy from the electrically polarizable material to the ocean water.

* * * * *